United States Patent
Shin et al.

(10) Patent No.: US 10,950,704 B2
(45) Date of Patent: Mar. 16, 2021

(54) VERTICAL MEMORY DEVICES

(71) Applicant: Samsung Electronics Co., Ltd., Suwon-si (KR)

(72) Inventors: Seung-Jun Shin, Yongin-si (KR); Si-Wan Kim, Hwaseong-si (KR); Bong-Hyun Choi, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/441,644

(22) Filed: Jun. 14, 2019

(65) Prior Publication Data
US 2020/0203495 A1 Jun. 25, 2020

(30) Foreign Application Priority Data
Dec. 20, 2018 (KR) ................. 10-2018-0165825

(51) Int. Cl.
*H01L 29/423* (2006.01)
*H01L 23/48* (2006.01)
*H01L 27/11582* (2017.01)

(52) U.S. Cl.
CPC ...... *H01L 29/42376* (2013.01); *H01L 23/481* (2013.01); *H01L 27/11582* (2013.01); *H01L 29/4234* (2013.01)

(58) Field of Classification Search
None
See application file for complete search history.

(56) References Cited

U.S. PATENT DOCUMENTS

| | | | |
|---|---|---|---|
| 9,324,728 B2 | 4/2016 | Hu et al. | |
| 9,524,980 B2 | 12/2016 | Lue | |
| 9,831,257 B2 | 11/2017 | Lue | |
| 9,997,530 B2 | 6/2018 | Yon et al. | |
| 10,014,318 B2 | 7/2018 | Or-Bach et al. | |
| 10,043,819 B1 | 8/2018 | Lai et al. | |
| 2015/0318302 A1* | 11/2015 | Park ................ | H01L 27/11582 438/268 |
| 2015/0372005 A1* | 12/2015 | Yon ................... | H01L 27/2436 257/5 |
| 2017/0200676 A1* | 7/2017 | Jeong ............... | H01L 21/76816 |

FOREIGN PATENT DOCUMENTS

| | | |
|---|---|---|
| KR | 20090081876 A | 7/2009 |
| KR | 20150069423 A | 6/2015 |

* cited by examiner

*Primary Examiner* — Jay C Chang
(74) *Attorney, Agent, or Firm* — Harness, Dickey & Pierce, P.L.C.

(57) ABSTRACT

A vertical memory device includes a substrate including a cell array region and a staircase region surrounding the cell array region, gate electrodes on the cell array region and the staircase region, and a channel on the cell array region. The gate electrodes are isolated from each other in first and third directions and each extend in a second direction. The channel extends in the first direction through one or more gate electrodes. End portions in the second direction of first gate electrodes of the plurality of gate electrodes define first steps in the second direction and second steps in the third direction on the staircase region of the substrate, the second steps being connected to the first steps, respectively, at same levels.

20 Claims, 65 Drawing Sheets

FIG. 1
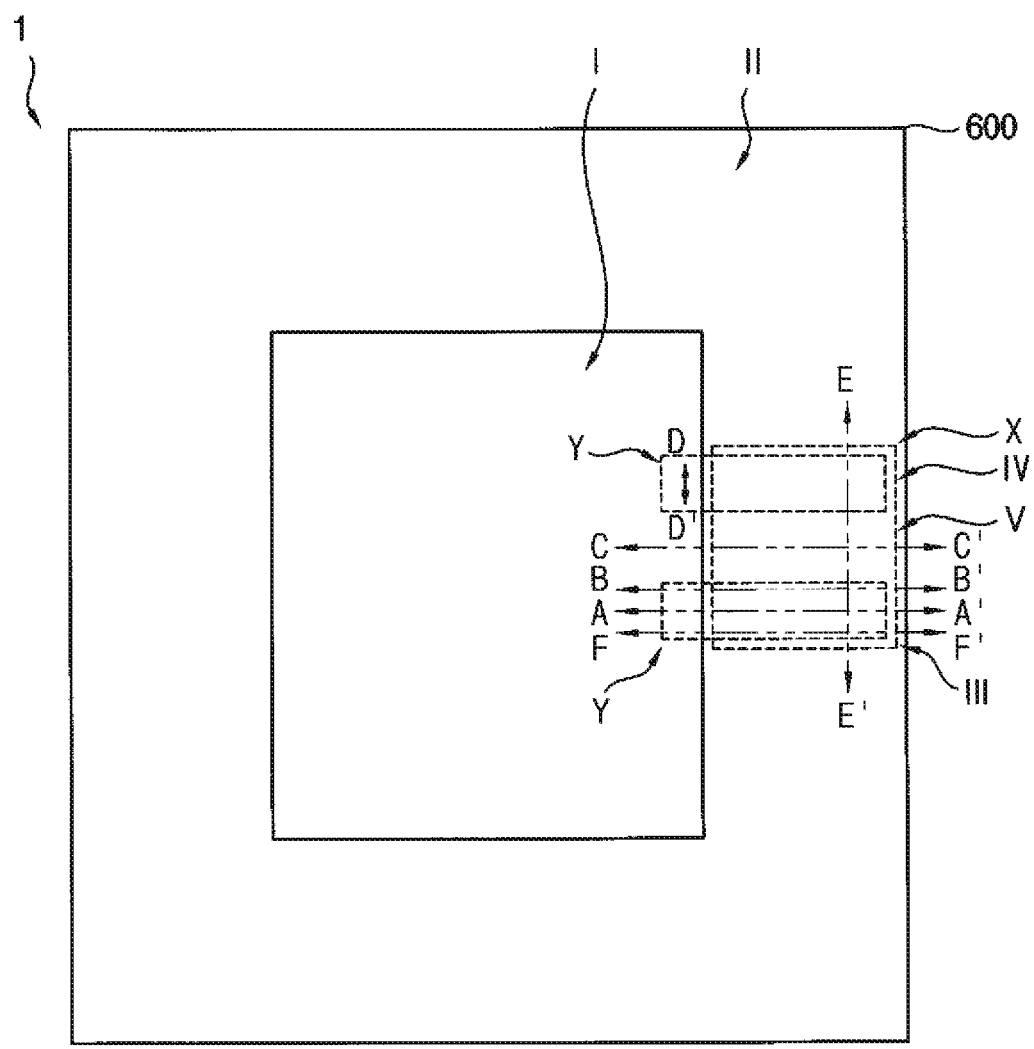
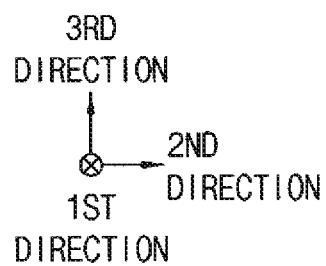

FIG. 5
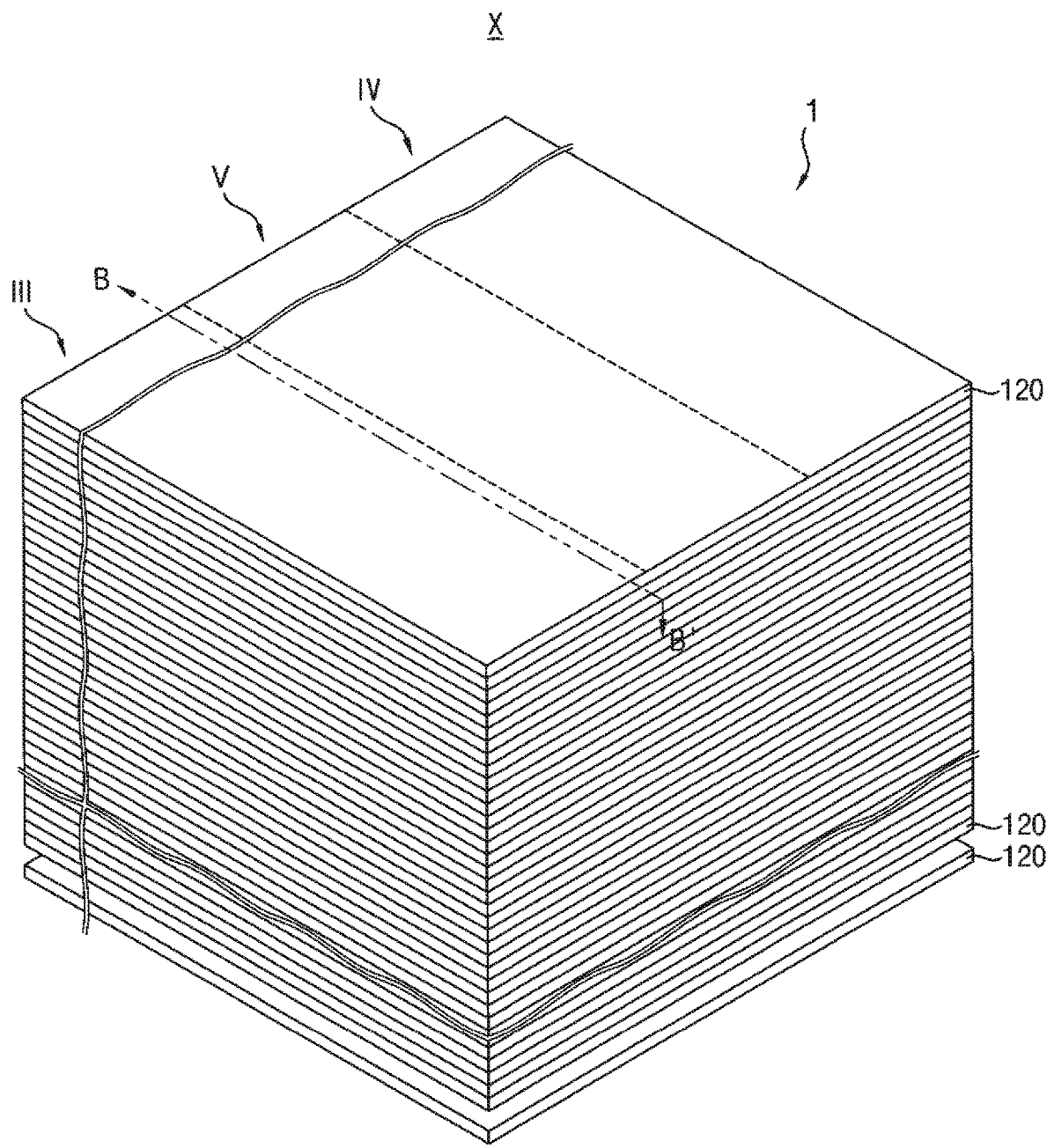

1ST DIRECTION
2ND DIRECTION
3RD DIRECTION

1ST DIRECTION
2ND DIRECTION
3RD DIRECTION

VERTICAL MEMORY DEVICES

CROSS-REFERENCE TO RELATED APPLICATIONS

This application claims priority under 35 USC § 119 to Korean Patent Application No. 10-2018-0165825, filed on Dec. 20, 2018 in the Korean Intellectual Property Office (KIPO), the contents of which are herein incorporated by reference in their entirety.

BACKGROUND

1. Field

The inventive concepts relate to vertical memory devices. More particularly, the inventive concepts relate to vertical memory devices having gate electrodes stacked in a stair structure.

2. Description of the Related Art

When a VNAND flash memory device is manufactured, sacrificial layers and insulation layers are alternately and repeatedly stacked, ones of the sacrificial layers are patterned to form some steps in a staircase region in which contact plugs connected to upper wirings are formed, and an etching process may be performed using a photoresist pattern partially covering the steps to form a mold having a stair structure. As the quantity of steps included in the mold increases, the area of the mold may increase so that the integration degree of the VNAND flash memory device may decrease.

SUMMARY

Example embodiments provide a vertical memory device having good characteristics.

According to some example embodiments, a vertical memory device may include a substrate including a cell array region and a staircase region surrounding the cell array region. The vertical memory device may include a plurality of gate electrodes on the cell array region and the staircase region of the substrate. The plurality of gate electrodes may be isolated from direct contact with each other in a first direction. Each gate electrode of the plurality of gate electrodes may extend in a second direction. The plurality of gate electrodes may be further isolated from direct contact with each other in a third direction. The first direction may be substantially perpendicular to an upper surface of the substrate. The third direction may be substantially parallel to the upper surface of the substrate. The second direction may be substantially parallel to the upper surface of the substrate and substantially perpendicular to the third direction. The vertical memory device may include a channel on the cell array region of the substrate. The channel may extend in the first direction through one or more gate electrodes of the plurality of gate electrodes. End portions in the second direction of first gate electrodes of the plurality of gate electrodes define first steps in the second direction and second steps in the third direction on the staircase region of the substrate, the second steps being connected to the first steps, respectively, at same levels.

According to some example embodiments, a vertical memory device may include a substrate including a cell array region and a staircase region surrounding the cell array region. The vertical memory device may include a plurality of gate electrodes on the cell array region and the staircase region of the substrate. The plurality of gate electrodes may be isolated from direct contact with each other in a first direction. Each gate electrode of the plurality of gate electrodes may extend in a second direction. The plurality of gate electrodes may be further isolated from direct contact with each other in a third direction. The first direction may be substantially perpendicular to an upper surface of the substrate. The third direction may be substantially parallel to the upper surface of the substrate. The second direction may be substantially parallel to the upper surface of the substrate and substantially perpendicular to the third direction. The vertical memory device may include a channel on the cell array region of the substrate. The channel may extend in the first direction through one or more gate electrodes of the plurality of gate electrodes. End portions in the second direction of first gate electrodes of the gate electrodes may define first steps in the second direction on the staircase region of the substrate. End portions in the second direction of second gate electrodes higher than the first gate electrodes among the plurality of gate electrodes may define second steps in the second direction and/or the third direction on the staircase region of the substrate. The first steps may be overlapped with the second steps in the first direction.

According to some example embodiments, a vertical memory device may include a substrate including a cell array region and a staircase region surrounding the cell array region. The vertical memory device may include a plurality of gate electrodes on the cell array region and the staircase region of the substrate. The plurality of gate electrodes may be isolated from direct contact with each other in a first direction. Each gate electrode of the plurality of gate electrodes may extend in a second direction. The plurality of gate electrodes may be further isolated from direct contact with each other in a third direction. The first direction may be substantially perpendicular to an upper surface of the substrate. The third direction may be substantially parallel to the upper surface of the substrate. The second direction may be substantially parallel to the upper surface of the substrate and substantially perpendicular to the third direction. The vertical memory device may include a channel on the cell array region of the substrate. The channel may extend in the first direction through one or more gate electrodes of the plurality of gate electrodes. End portions in the second direction of first gate electrodes of the plurality of gate electrodes may define first steps each having an "L" shape in a plan view.

The vertical memory device may not have the increased horizontal area, but may have an enhanced integration degree effectively using the gate electrodes sequentially stacked.

BRIEF DESCRIPTION OF THE DRAWINGS

FIGS. 1 to 64 are plan views, cross-sectional views, and perspective views illustrating a method of manufacturing a vertical memory device in accordance with some example embodiments.

FIGS. 1, 13A-13B, 20, 25, 28, 39, 42, 51, 53, 56-57 and 60 are plan views illustrating a method of manufacturing a vertical memory device in accordance with some example embodiments. FIGS. 13, 20, 25, 39, 42 and 56 are plan views of a region X of FIG. 1 in accordance with some example embodiments. FIGS. 28, 51, 53, 57 and 60 are plan views of a region Y of FIG. 1 in accordance with some example embodiments.

FIGS. 2, 4, 6, 21-24, 26-27, 29-31, 44-50, 52, 54-55, 58 and 61-64 are cross-sectional views illustrating a method of manufacturing a vertical memory device in accordance with some example embodiments. FIGS. 4, 21 and 44 are cross-sectional views taken along a line A-A' of FIG. 1, FIGS. 6, 22, 24, 27, 29-31, 45, 47, 49-50 and 61 are cross-sectional views taken along a line B-B' of FIG. 1, FIGS. 26, 48 and 62 are cross-sectional views taken along a line C-C' of FIG. 1 in accordance with some example embodiments. FIGS. 52, 54-55 and 58 are cross-sectional views taken along a line D-D' of FIG. 1 in accordance with some example embodiments. FIGS. 2 and 64 are cross-sectional views taken along a line E-E' of FIG. 1 in accordance with some example embodiments. FIGS. 23, 46 and 63 are cross-sectional views taken along a line F-F' of FIG. 1 in accordance with some example embodiments.

FIGS. 3, 5, 7-12, 14-19, 32-38, 40-41, 43 and 59 are perspective views illustrating a method of manufacturing a vertical memory device in accordance with some example embodiments.

DETAILED DESCRIPTION

The above and other aspects and features of the vertical memory devices and the methods of manufacturing the same in accordance with some example embodiments will become readily understood from detail descriptions that follow, with reference to the accompanying drawings.

Figure 63:
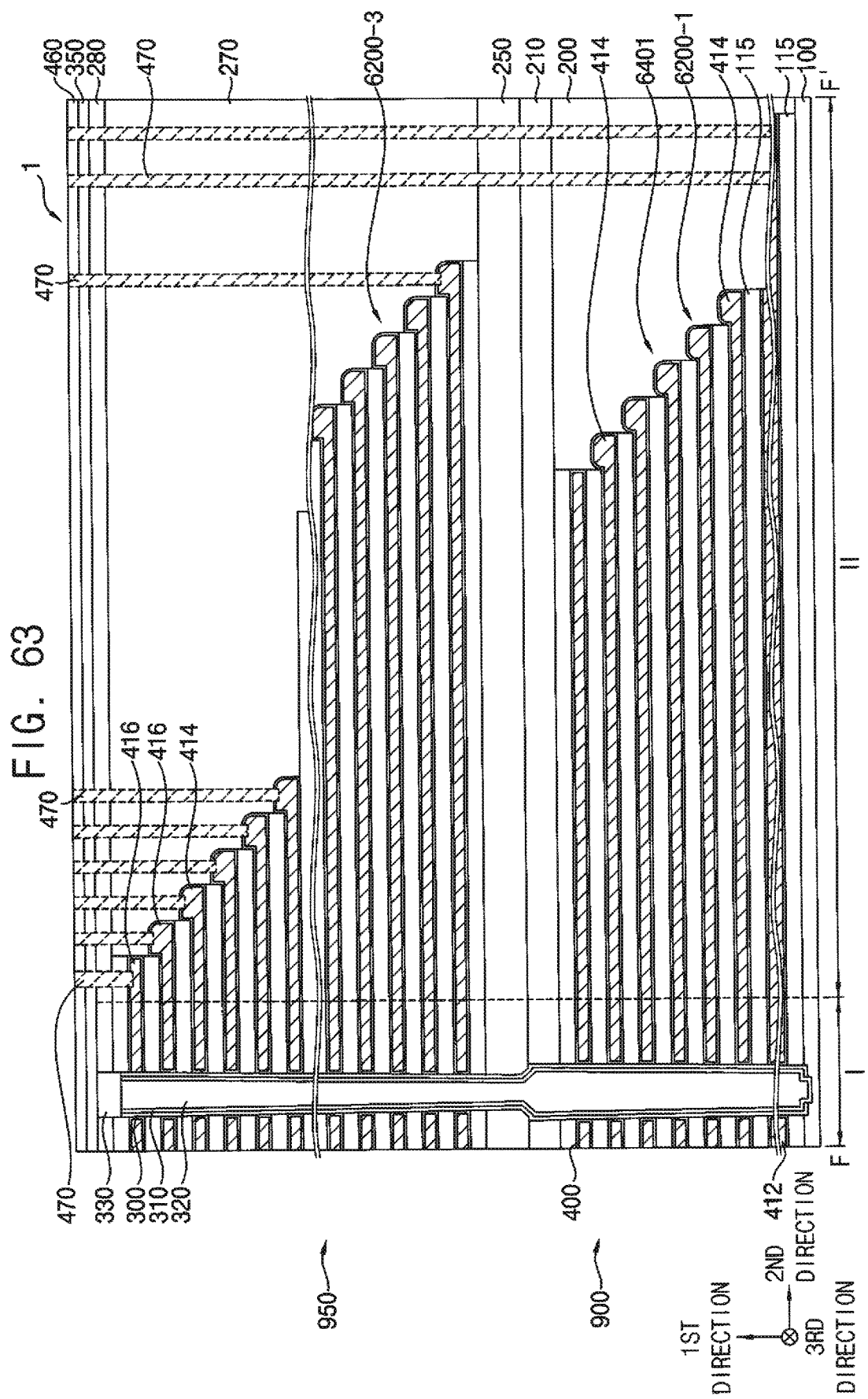
Figure 64:
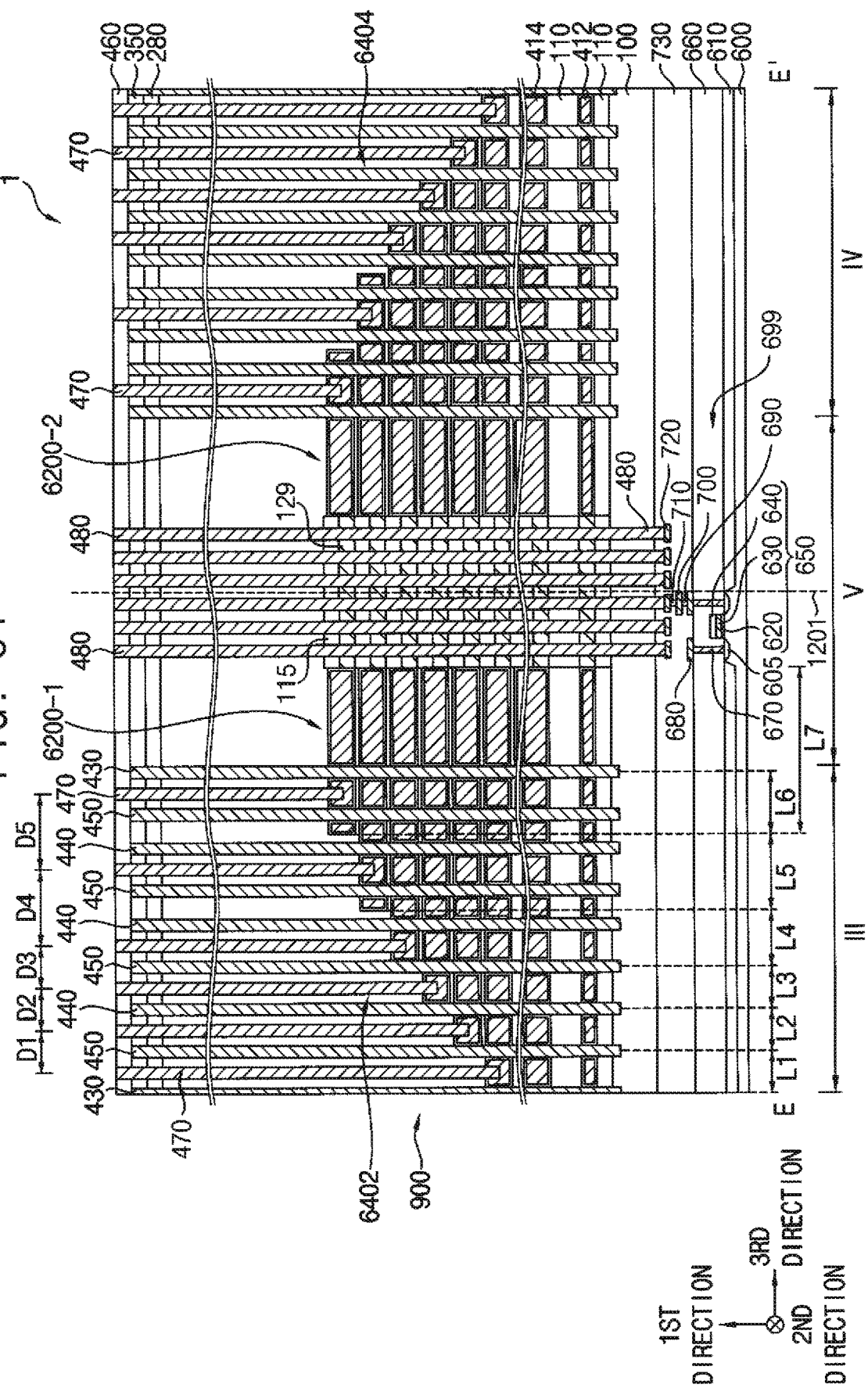

FIGS. 1 to 64 are plan views, cross-sectional views, and perspective views illustrating a method of manufacturing a vertical memory device 1 in accordance with some example embodiments. Particularly, FIGS. 1, 13, 20, 25, 28, 39, 42, 51, 53, 56-57 and 60 are the plan views, FIGS. 2, 4, 6, 21-24, 26-27, 29-31, 44-50, 52, 54-55, 58 and 61-64 are the cross-sectional views, and FIGS. 3, 5, 7-12, 14-19, 32-38, 40-41, 43 and 59 are the perspective views.

FIGS. 13, 20, 25, 39, 42 and 56 are plan views of a region X of FIG. 1, FIGS. 28, 51, 53, 57 and 60 are plan views of a region Y of FIG. 1, and FIGS. 3, 5, 7-12, 14-19, 32-38, 40-41, 43 and 59 are perspective views of the region X of FIG. 1.

Figure 2:
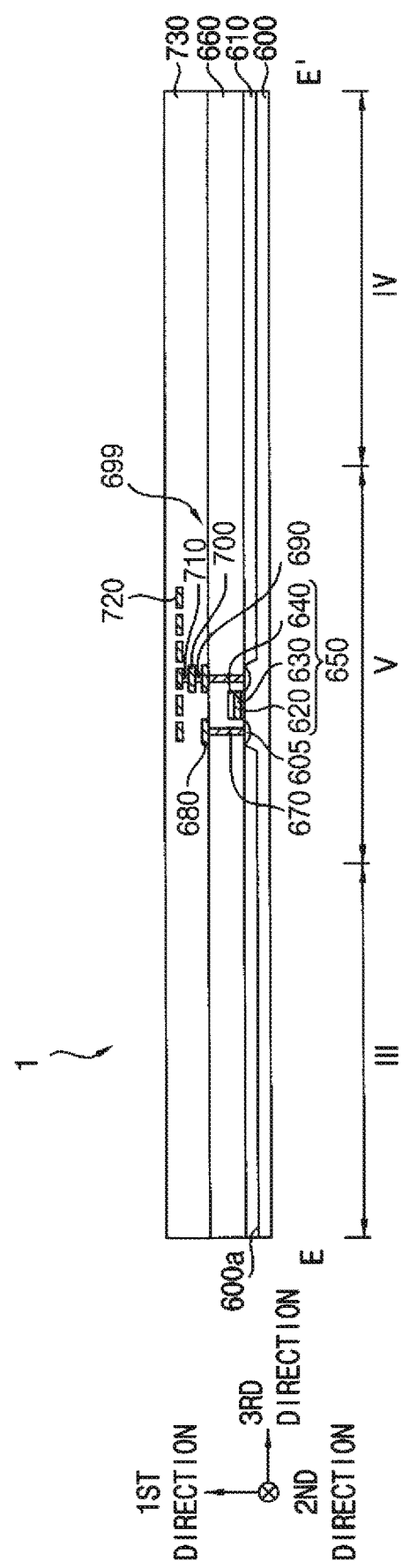
Figure 4:
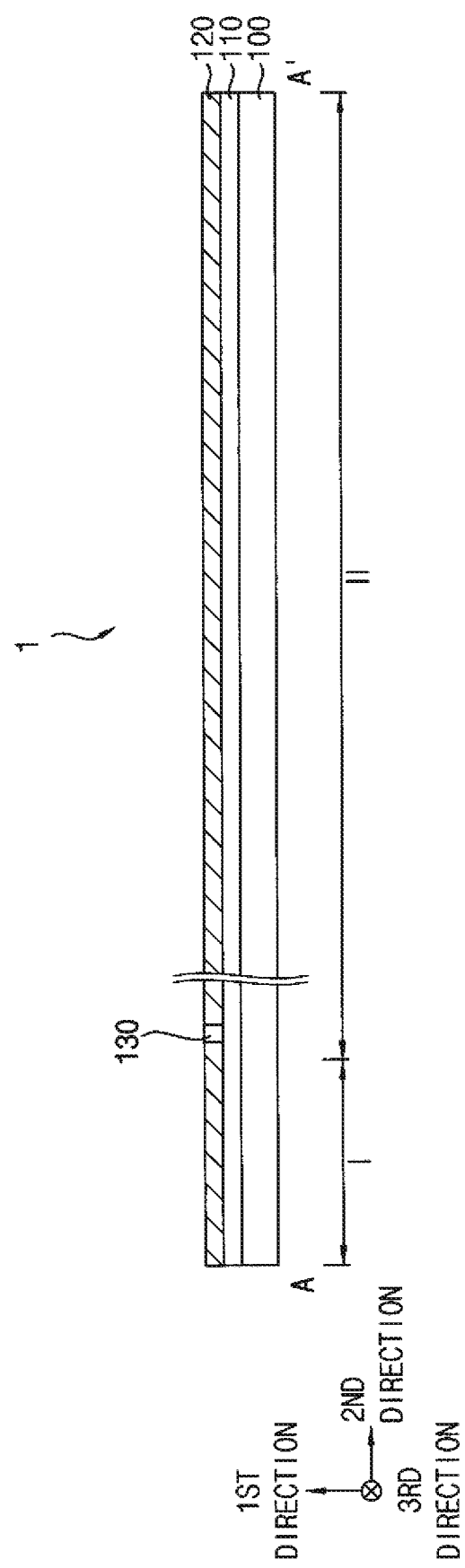
Figure 21:
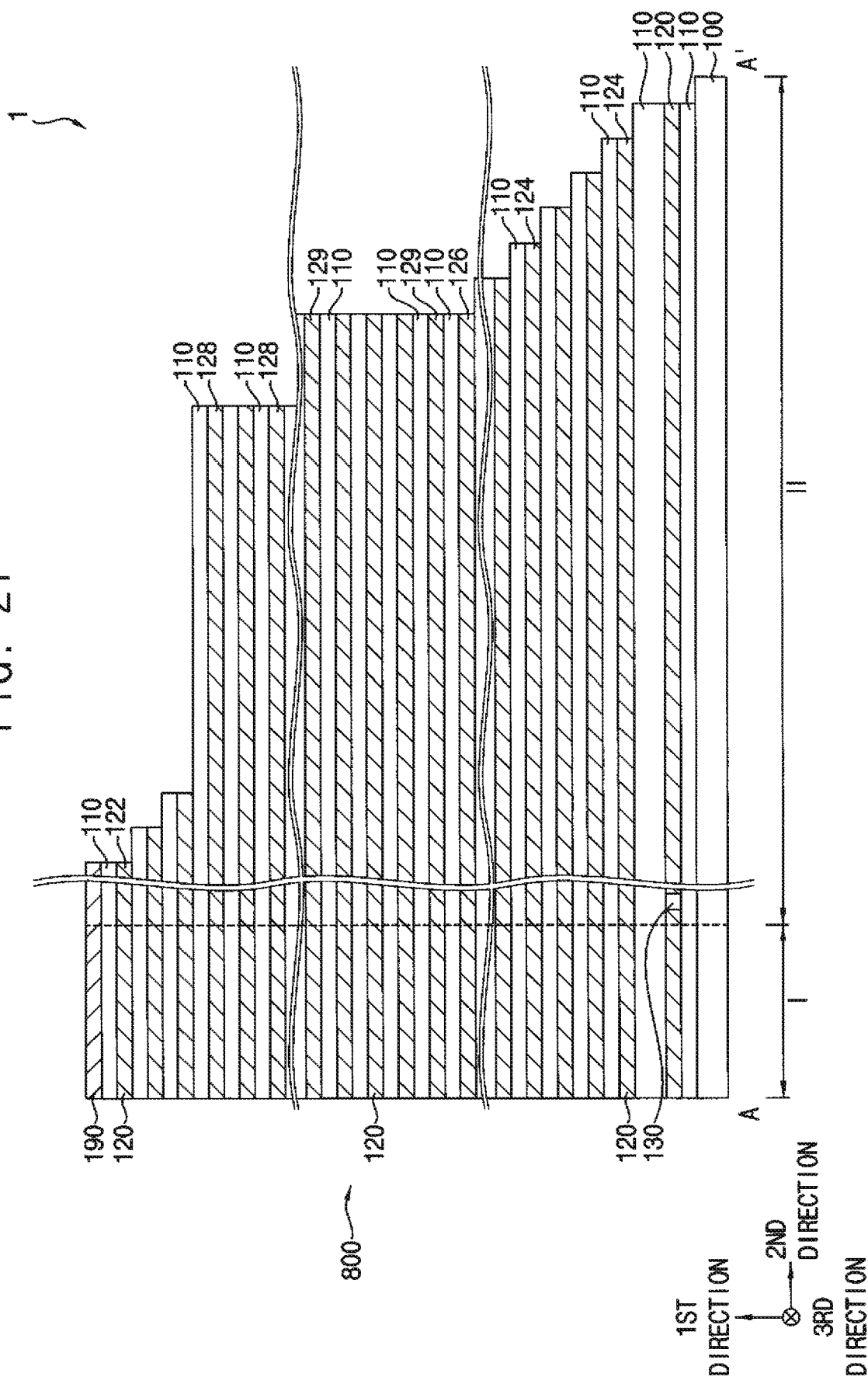
Figure 22:
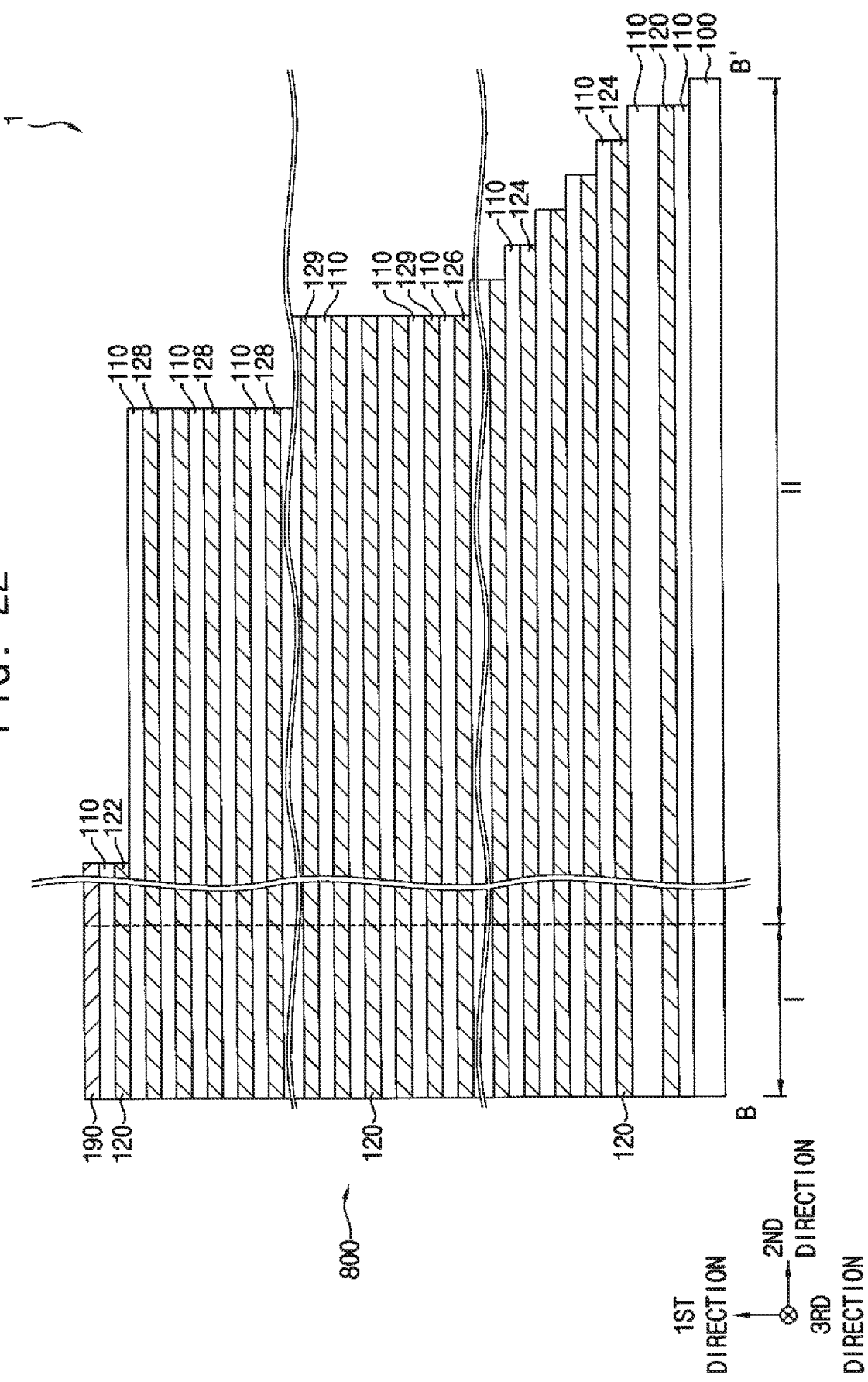
Figure 23:
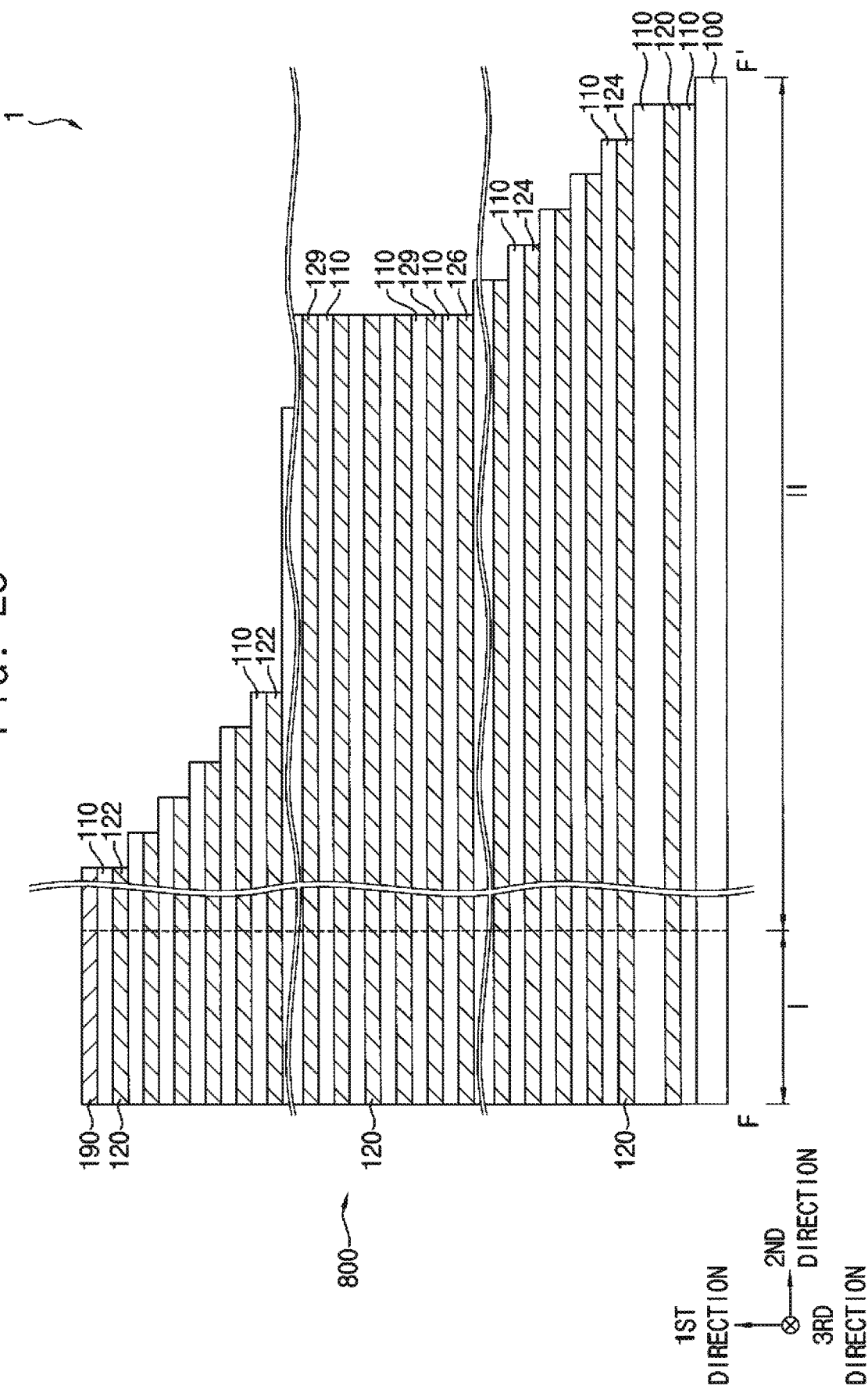
Figure 44:
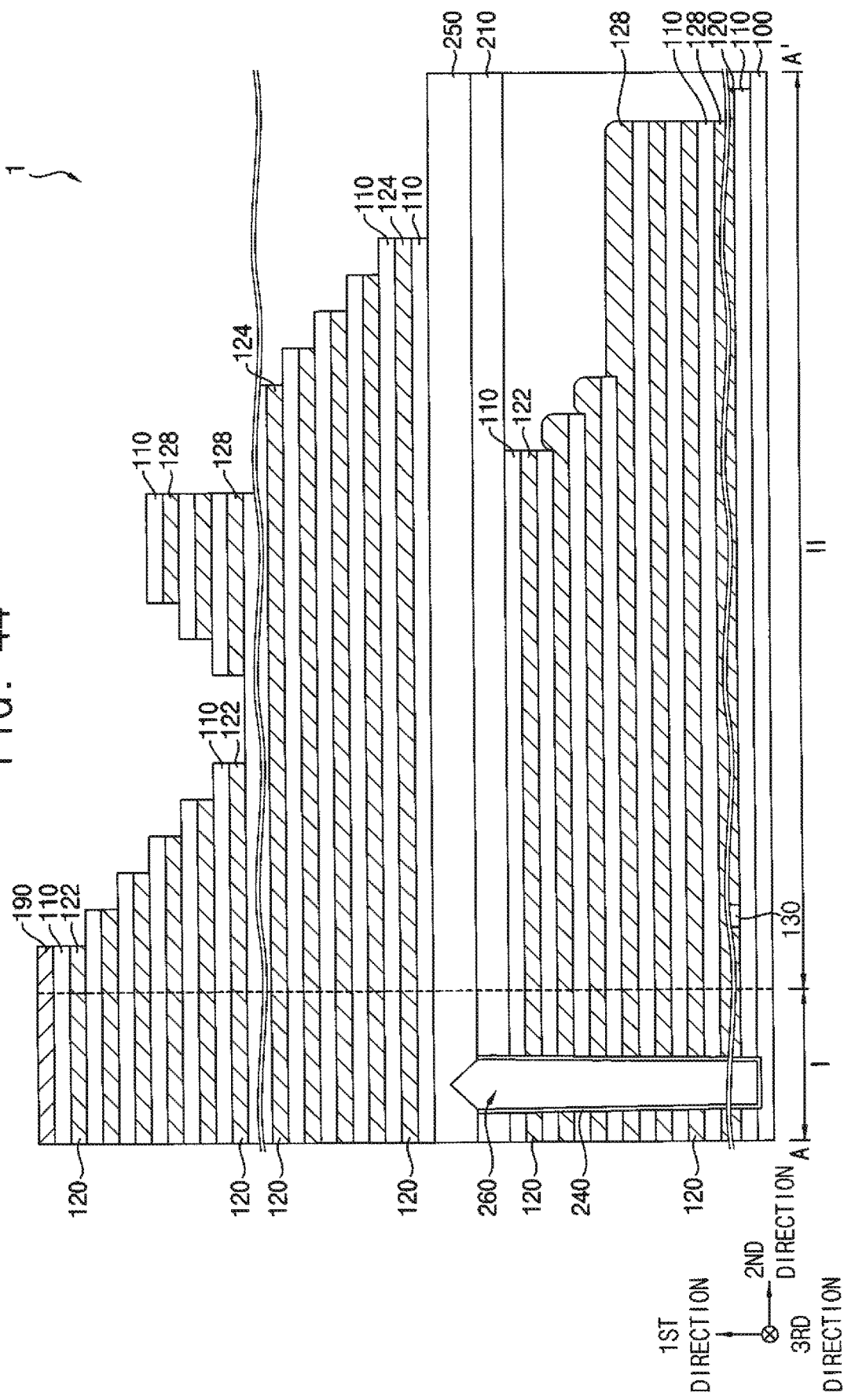
Figure 45:
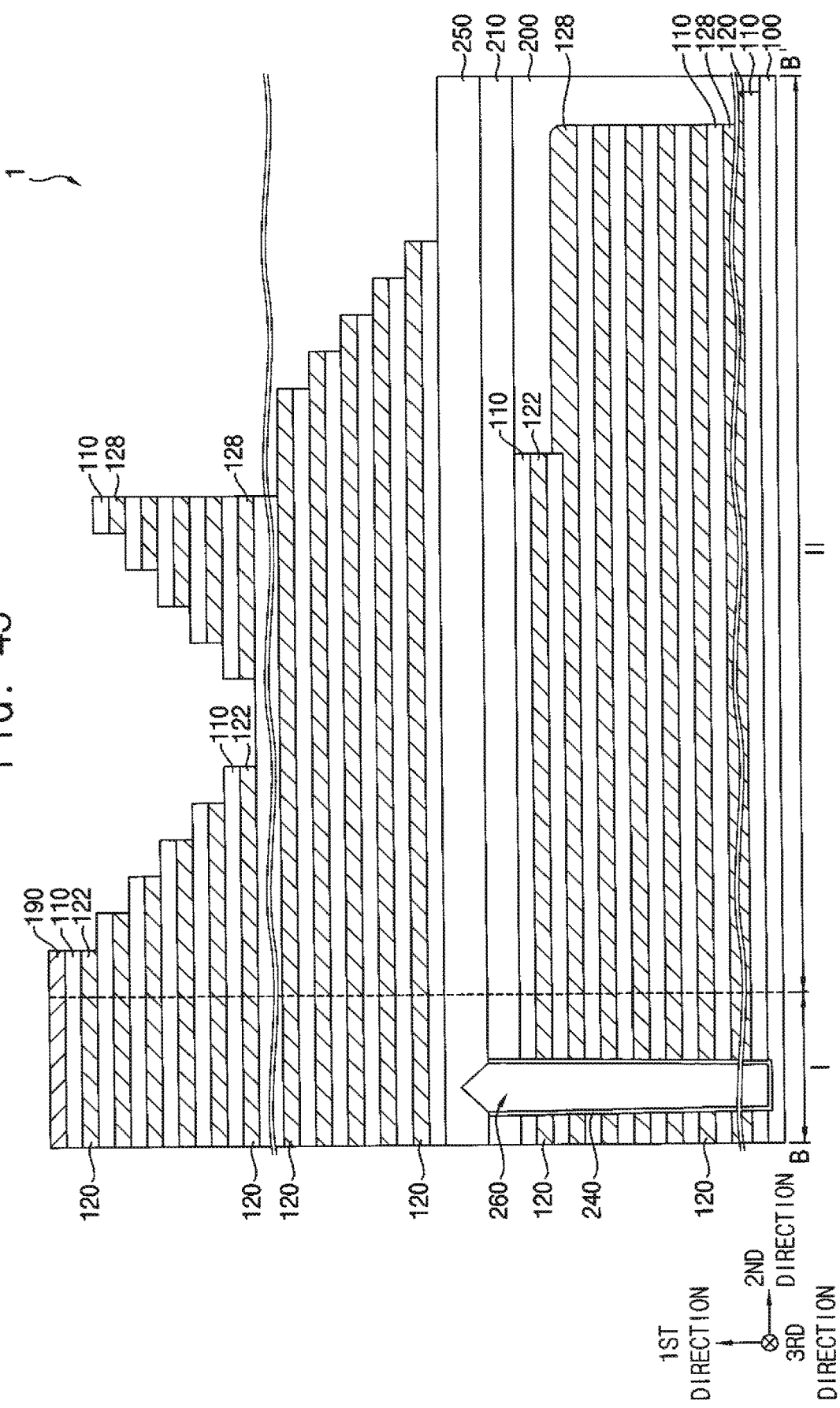
Figure 46:
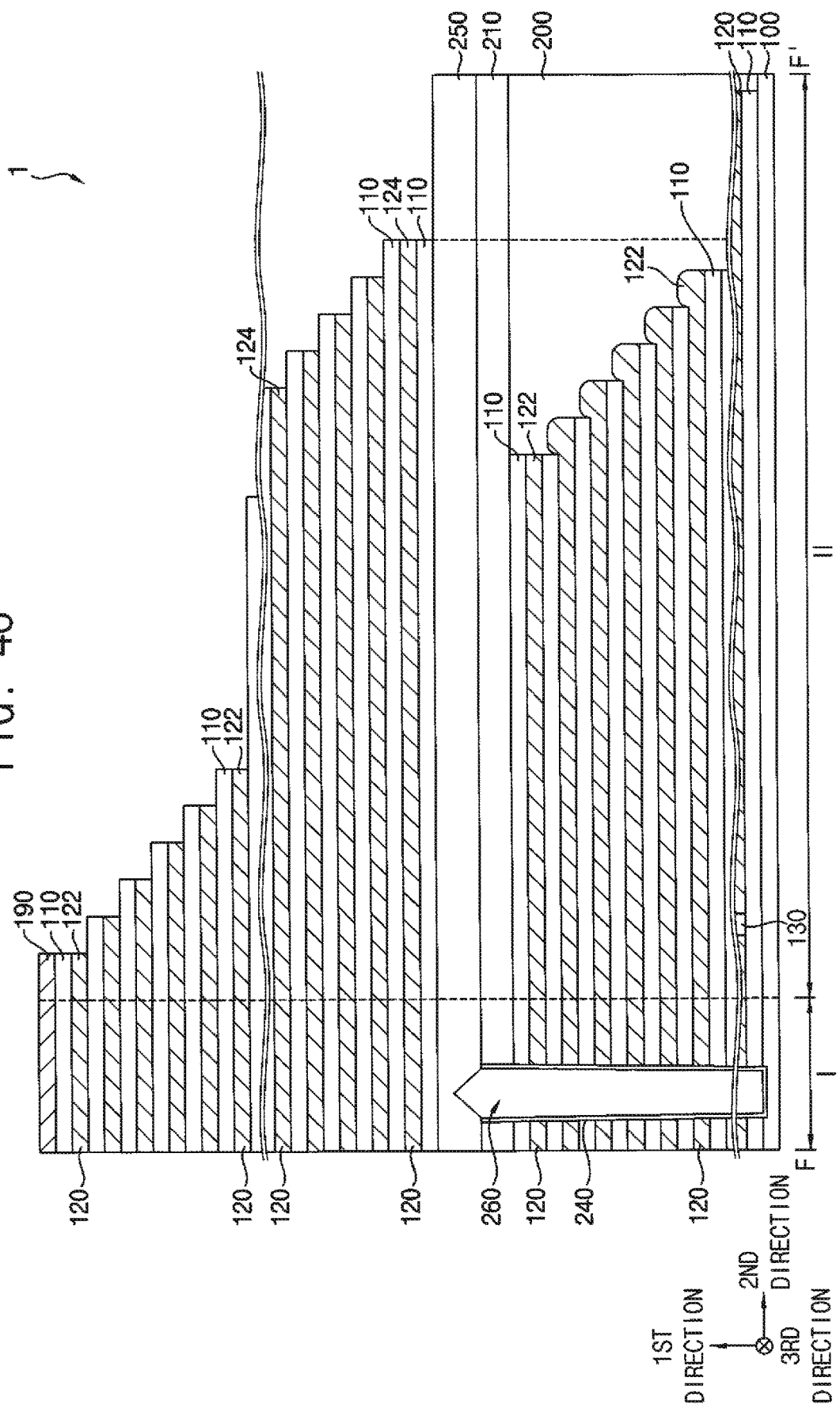

FIGS. 4, 21 and 44 are cross-sectional views taken along a line A-A' of FIG. 1, FIGS. 6, 22, 24, 27, 29-31, 45, 47, 49-50 and 61 are cross-sectional views taken along a line B-B' of FIG. 1, FIGS. 26, 48 and 62 are cross-sectional views taken along a line C-C' of FIG. 1, FIGS. 52, 54-55 and 58 are cross-sectional views taken along a line D-D' of FIG. 1, FIGS. 2 and 64 are cross-sectional views taken along a line E-E' of FIG. 1, and FIGS. 23, 46 and 63 are cross-sectional views taken along a line F-F' of FIG. 1.

Hereinafter, a direction substantially perpendicular (e.g., perpendicular within manufacturing tolerances and/or material tolerances) to an upper surface 600a of a substrate 600 may be defined as a first direction, and two directions substantially parallel (e.g., parallel within manufacturing tolerances and/or material tolerances) to the upper surface 600a of the substrate 600 and crossing each other may be defined as second and third directions, respectively. In some example embodiments, the second and third directions may be substantially perpendicular (e.g., perpendicular within manufacturing tolerances and/or material tolerances) to each other.

Referring to FIG. 1, a substrate 600 may include a first region I and a second region II surrounding the first region I.

The substrate 600 may include silicon, germanium, silicon-germanium or a III-V compound such as GaP, GaAs, GaSb, etc. In some embodiments, the substrate 600 may be a silicon-on-insulator (SOI) substrate or a germanium-on-insulator (GOI) substrate. In some example embodiments, including the example embodiments illustrated in FIGS. 1-64, the first region I of the substrate 600 may be a cell array region in which memory cells may be formed, and the second region II of the substrate 600 may be a staircase region in which contact plugs connected to the memory cells are formed.

In some example embodiments, the vertical memory device 1 may have a cell over peri (COP) structure. That is, circuit patterns 699 for driving memory cells may not be formed on the periphery of the memory cells, but may be formed under the memory cells. Thus, a circuit pattern region and a cell array region may be vertically stacked on the substrate 600, and the circuit patterns 699 may be also referred to as lower circuit patterns. However, the inventive concepts may not be limited thereto, and even if the vertical memory device 1 has a COP structure, the substrate 600 may further include a peripheral circuit region surrounding the second region II in which some of the circuit patterns may be formed.

It will be understood that, as described herein, an element that is "on" another element may be "above" or "below" the other element. Additionally, it will be understood that, as described herein, an element that is "on" another element may be directly on the other element, such that the elements are in direct contact with each other, or may be indirectly on the other elements, such that the elements are isolated from direct contact with each other by one or more interposing structures and/or spaces.

The region X shown in FIG. 1 is a portion of the second region II of the substrate 600, and the region Y includes a portion of the region X and a portion of the first region I of the substrate 600 adjacent thereto in the second direction. In some example embodiments, a plurality of region X's may be disposed in the third direction, and the region Y may be disposed at each of opposite sides of the region X in the third direction. Portions of the substrate 600 at which the regions X and Y overlap each other may be referred to as third and fourth regions III and IV, respectively, and a portion of the region X between the third and fourth regions III and IV may be referred to as a fifth region V.

Referring to FIG. 2, circuit patterns 699 may be formed on the substrate 600, and first and second lower insulating interlayers 660 and 730 may be formed on the substrate 600 to cover the circuit patterns 699.

The substrate 600 may include a field region on which an isolation pattern 610 is formed, and an active region on which no isolation pattern is formed. The isolation pattern 610 may be formed by, e.g., a shallow trench isolation (STI) process, and may include, e.g., silicon oxide.

The circuit patterns 699 may include transistors, lower contact plugs, lower wirings, lower vias, etc. For example, a transistor including a lower gate structure 650 on the substrate 600 and a first impurity region 605 at an upper portion of the active region of the substrate 600 adjacent thereto may be formed. The lower gate structure 650 may include a lower gate insulation pattern 620, a lower gate electrode 630, and a lower gate mask 640 sequentially stacked.

The first lower insulating interlayer 660 may be formed on the substrate 600 to cover the transistor, and a lower contact plug 670 may extend through the first lower insulating interlayer 660 to contact the first impurity region 605. A first lower wiring 680 may be formed on the first lower insulating interlayer 660 to contact an upper surface of the lower contact plug 670. A first lower via 690, a second lower wiring 700, a second lower via 710 and a third lower wiring 720 may be sequentially stacked on the first lower wiring 680. In some example embodiments, a plurality of third lower wirings 720 may be formed in the third direction. Each of the first to third lower wirings 680, 700 and 720 and each of the first and second lower vias 690 and 710 may be formed by a damascene process or a patterning process.

The second lower insulating interlayer 730 may be formed on the first lower insulating interlayer 570 to cover the first to third lower wirings 680, 700 and 720 and the first and second lower vias 690 and 710.

Hereinafter, the circuit patterns 699 on the substrate 600 will not be shown in the figures in order to avoid the complexity of drawings.

Figure 3:
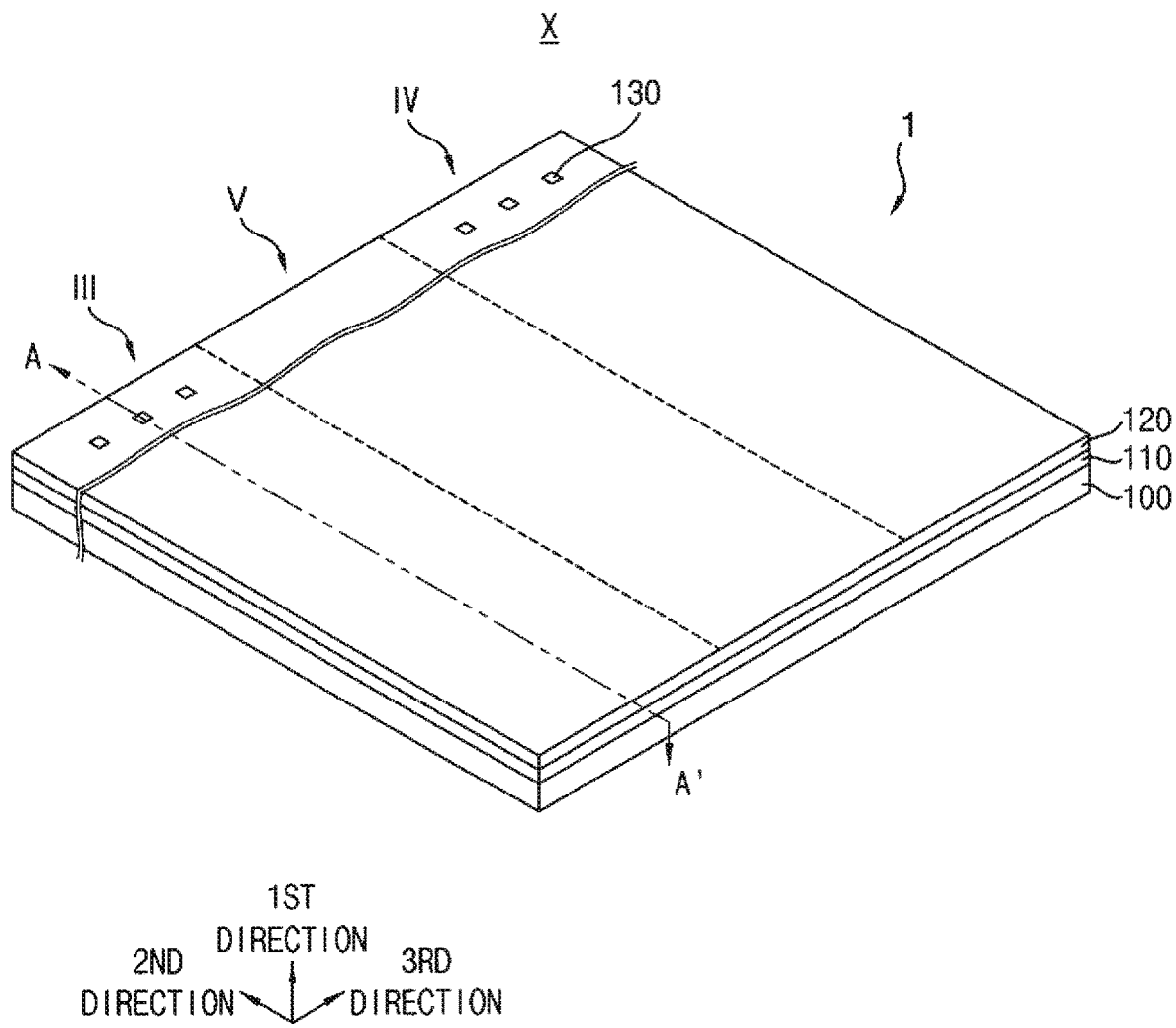

Referring to FIGS. 3 and 4, a base pattern 100 may be formed on the second lower insulating interlayer 730, and an insulation layer 110 and a sacrificial layer 120 may be sequentially formed on the base pattern 100. Accordingly, it will be understood that the base pattern 100 may be on the substrate 600.

The base pattern 100 may include a semiconductor material, e.g., silicon, the insulation layer 110 may include an oxide, e.g., silicon oxide, and the sacrificial layer 120 may include a material having an etching selectivity with respect to the insulation layer 110, e.g., a nitride such as silicon nitride.

A portion of the sacrificial layer 120 on the second region II of the substrate 600 may be removed to form a first opening exposing the insulation layer 110, and a first division pattern 130 may be formed to fill the first opening.

In some example embodiments, a plurality of first division patterns 130 may be formed in the third direction on each of the third and fourth regions III and IV of the substrate 600. The first division pattern 130 may include an oxide, e.g., silicon oxide.

Figure 6:
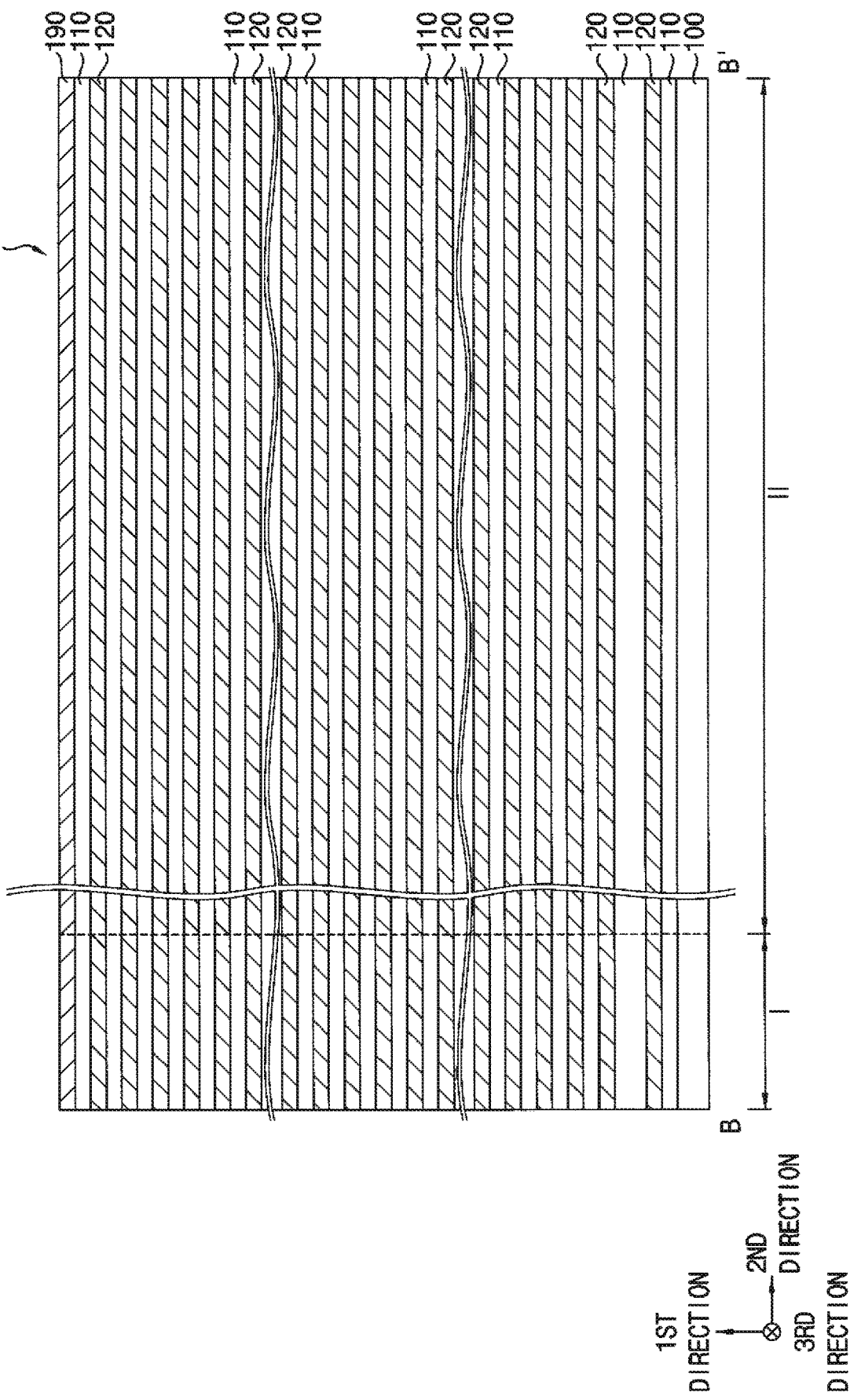

Referring to FIGS. 5 and 6, the insulation layer 110 and the sacrificial layer 120 may be further formed on the sacrificial layer 120 and the first division pattern 130 alternately and repeatedly, so that a lower mold layer including the insulation layers 110 and the sacrificial layers 120 alternately stacked in the first direction may be formed. Additionally, an etch stop layer 190 may be formed on an uppermost one of the insulation layers 110 of the lower mold layer.

In order to avoid the complexity of the drawings, no insulation layers 110 will be shown but only the sacrificial layers 120 will be shown in all perspective views including FIG. 5, hereinafter. Etching processes on the sacrificial layers 120 may be performed not only the sacrificial layers 120 but also the insulation layers 110 each of which may form a pair with one of the sacrificial layers 120 directly therebeneath, and for the convenience of explanation, when the etching processes are described with reference to the perspective views, the insulation layers 110 will not be explained.

Figure 7:
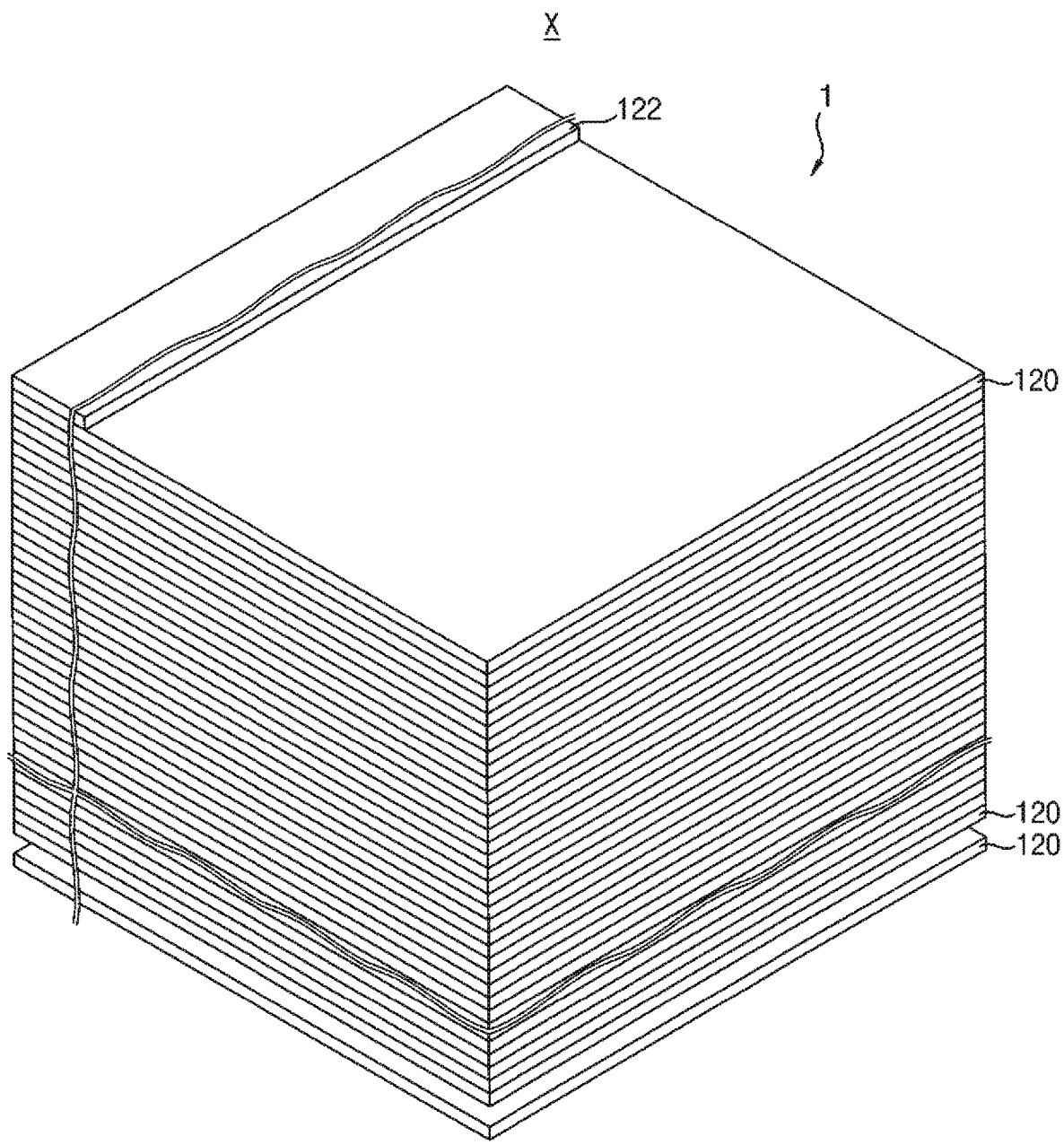

Referring to FIG. 7, a first photoresist (not shown) may be formed on the etch stop layer 190 to cover the first region I and an edge portion of the second region II adjacent thereto, and the etch stop layer 190 and an uppermost one of the sacrificial layers 120 of the lower mold layer may be etched using the first photoresist as an etching mask to form a first sacrificial pattern 122 having a rectangular ring shape surrounding the uppermost one of the sacrificial layers 120 on the first region I of the substrate 600, and the etch stop layer 190 may remain on the uppermost one of the sacrificial layers 120 and the first sacrificial pattern 122.

However, FIG. 7 shows only a portion of the second region II of the substrate 600, i.e., the region X, and thus only a portion of the first sacrificial pattern 122 having the rectangular ring shape, that is, a portion having a bar shape extending in the third direction is shown. Hereinafter, instead of entire shapes of various sacrificial patterns on the second region II of the substrate 600 that may be formed by etching the sacrificial layers 120, only shapes of the various sacrificial patterns in the region X will be described. During the formation of a lower mold and a lower mold illustrated with reference to the perspective views, the portion of the sacrificial layer 120 on the first region I of the substrate 600 may be always covered not to be etched, and thus will not be described.

After forming the first sacrificial pattern 122, the first photoresist pattern may be removed by, e.g., an ashing process and/or a stripping process.

Figure 8:
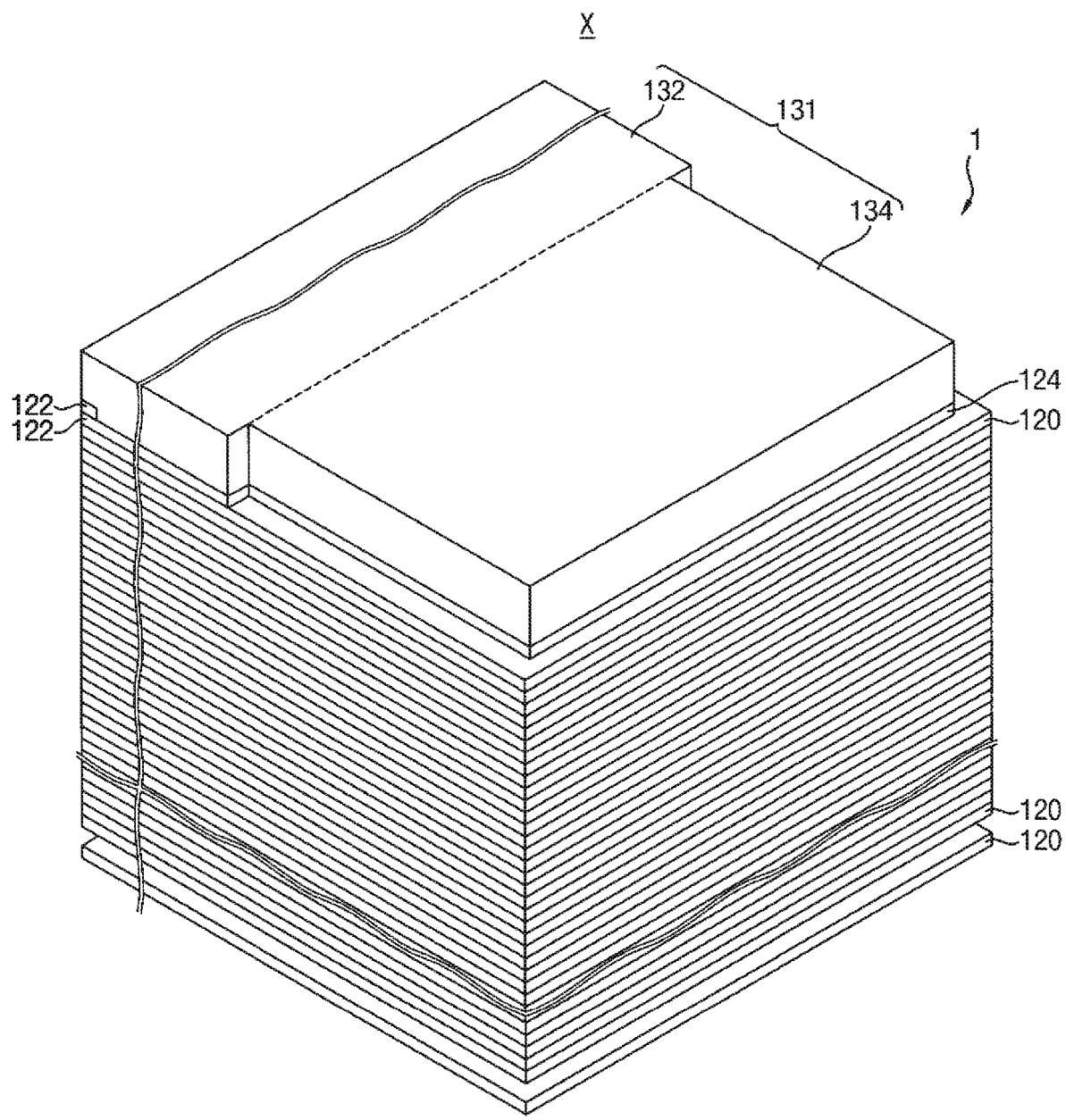

Referring to FIG. 8, a second photoresist pattern 131 covering the first sacrificial pattern 122 and a portion of the second region II of the substrate 600 may be formed on one of the sacrificial layers 120 of the lower mold layer at a second level from the uppermost level (hereinafter, an n-th level from the uppermost level will be simply referred to as an n-th level), and the one of the sacrificial layers 120 of the lower mold layer at the second level may be etched using the second photoresist pattern 131 as an etching mask.

In some example embodiments, the second photoresist pattern 131 may include a first portion 132 covering the first sacrificial pattern 122, having a length in the second direction greater than that of the first sacrificial pattern 122 and having a rectangular shape in a plan view, and a second portion 134 connected to the first portion 132 to cover a portion of the region X and having a rectangular shape in a plan view.

In some example embodiments, the second portion 134 of the second photoresist pattern 131 may have a width in the third direction less than that of the first portion 132 of the second photoresist pattern 131 in the region X. That is, in the region X, the second portion 134 of the second photoresist pattern 131 may not contact end portions in the third direction of the first portion 132 of the second photoresist pattern 131.

By the etching process, the first sacrificial pattern 122 having a rectangular shape in a plan view may be further formed at the second level to have a length in the second direction greater than that of the first sacrificial pattern 122 at the first level, and a second sacrificial pattern 124, which may be connected to the first sacrificial pattern 122 at the second level and have a rectangular shape in a plan view, may be formed at the second level.

Figure 9:
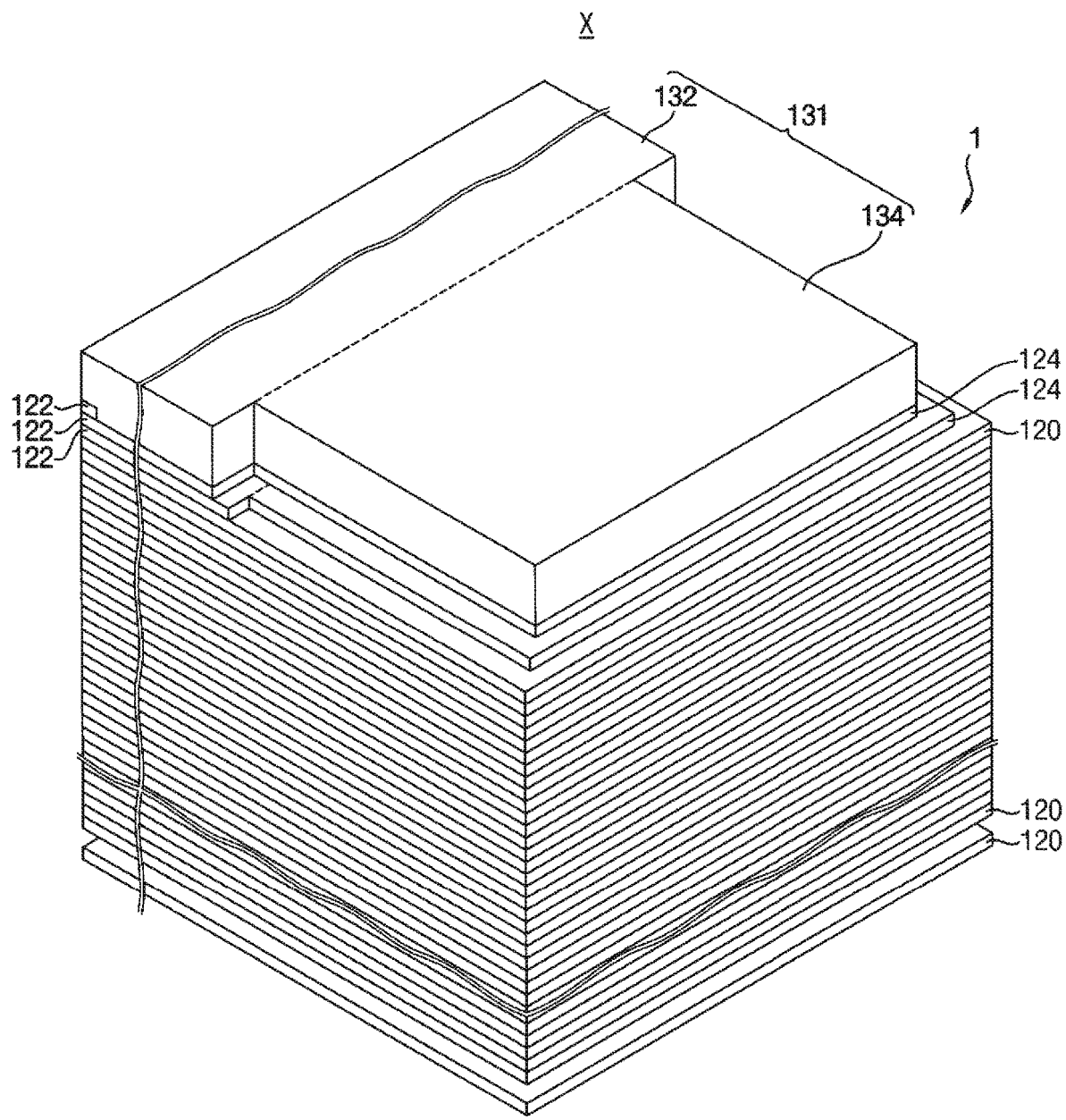

Referring to FIG. 9, a first trimming process in which an area of the second photoresist pattern 131 is reduced may be performed, and the first and second sacrificial patterns 122 and 124 and one of the sacrificial layers 120 of the lower mold layer at a third level may be etched using the reduced second photoresist pattern 131 as an etching mask.

Particularly, by the first trimming process, the first portion 132 of the second photoresist pattern 131 may have a reduced length in the second direction, and the second portion 134 of the second photoresist pattern 131 may have a reduced width in the third direction.

Thus, a length in the second direction of the first sacrificial pattern 122 at the second level may be reduced, and the first sacrificial pattern 122 may be further formed at the third level. Additionally, a width of the second sacrificial pattern 124 at the second level may be reduced, and the second sacrificial pattern 124 may be further formed at the third level.

In some example embodiments, the first trimming process may be performed by an exposure process on the second photoresist pattern 131 and a developing process on unexposed portions of the second photoresist pattern 131.

Figure 10:
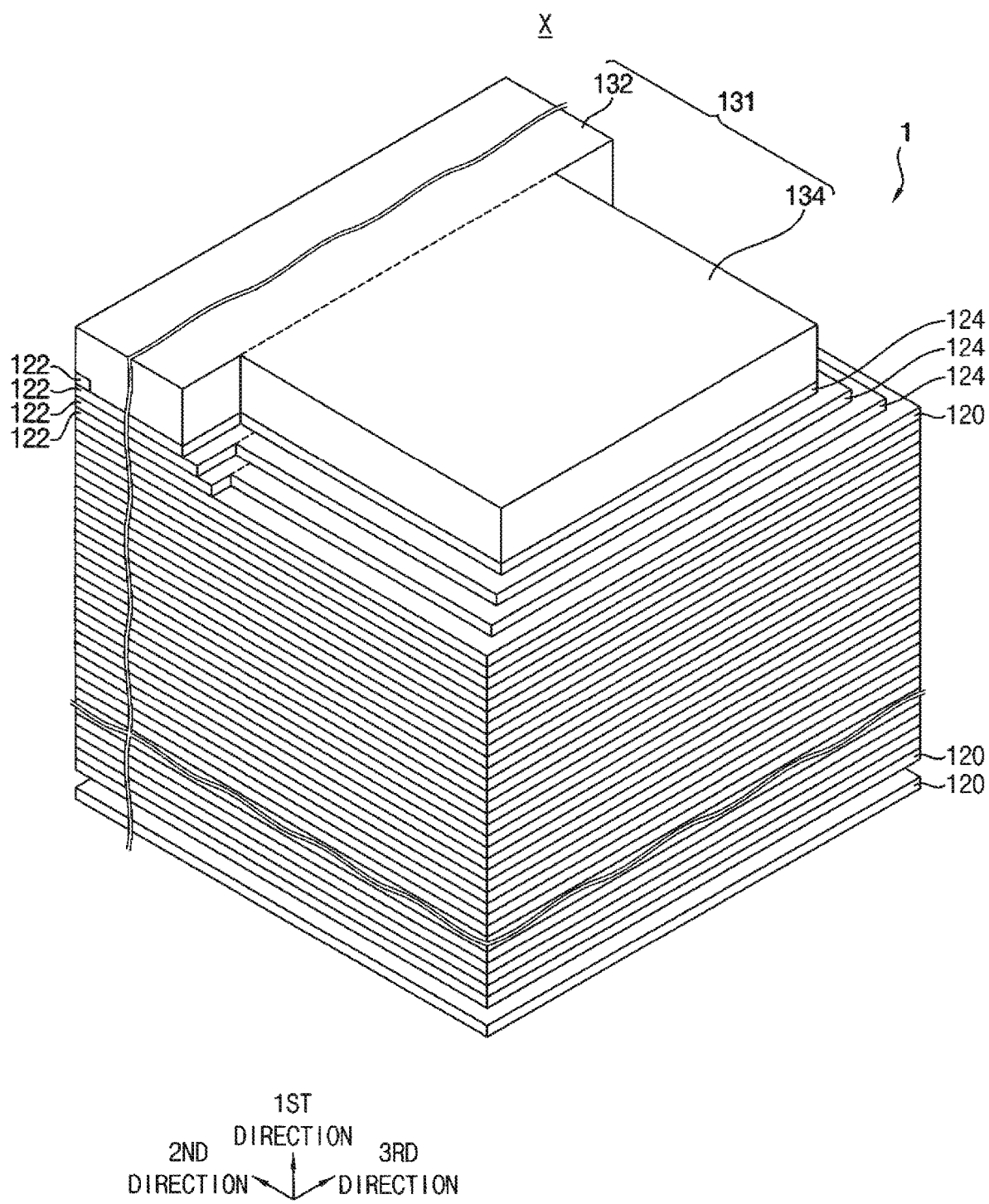

Referring to FIG. 10, a second trimming process may be performed. That is, after reducing the area of the second photoresist pattern 131 by reducing the length in the second direction of the first portion 132 of the second photoresist pattern 131 and the width in the third direction of the second portion 134 of the second photoresist pattern 131, the first and second sacrificial patterns 122 and 124 and one of the sacrificial layers 120 of the lower mold layer at a fourth level may be etched using the reduced second photoresist pattern 131 as an etching mask.

Thus, lengths in the second direction of the first sacrificial patterns 122 at the second and third levels may be reduced, and the first sacrificial pattern 122 may be further formed at the fourth level. Additionally, widths in the third direction of the second sacrificial patterns 124 at the second and third levels may be reduced, and the second sacrificial pattern 124 may be further formed at the fourth level.

Figure 11:
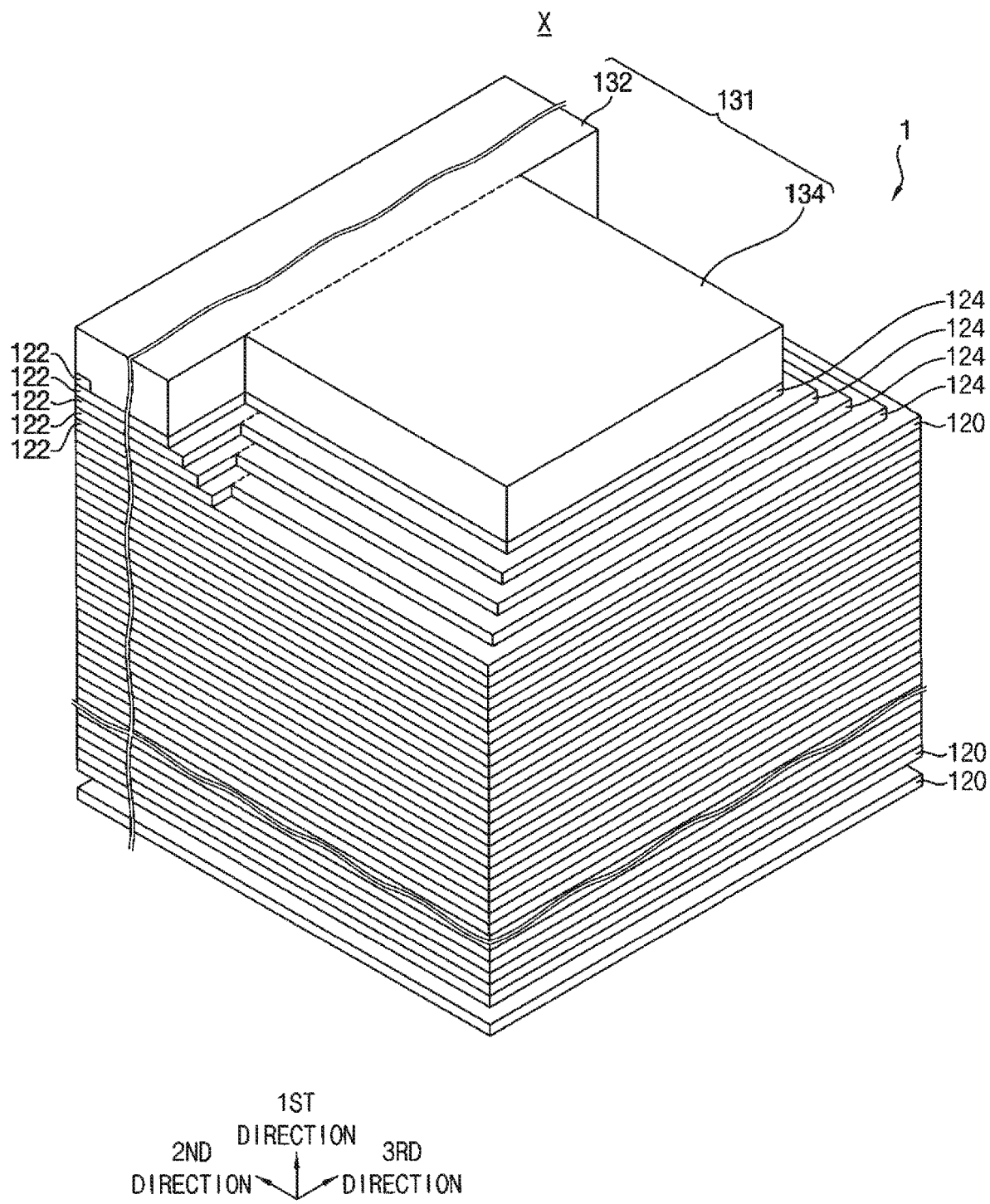

Referring to FIG. 11, a third trimming process may be performed. That is, after reducing the areas of the second photoresist pattern 131 by a method substantially the same as those of the first and second trimming processes, the first and second sacrificial patterns 122 and 124 and one of the sacrificial layers 120 of the lower mold layer at a fifth level may be etched using the reduced second photoresist pattern 131 as an etching mask.

Thus, lengths in the second direction of the first sacrificial patterns 122 at the second to fourth levels may be reduced, and the first sacrificial pattern 122 may be further formed at the fifth level. Additionally, widths in the third direction of the second sacrificial patterns 124 at the second to fourth levels may be reduced, and the second sacrificial pattern 124 may be further formed at the fifth level.

Figure 12:
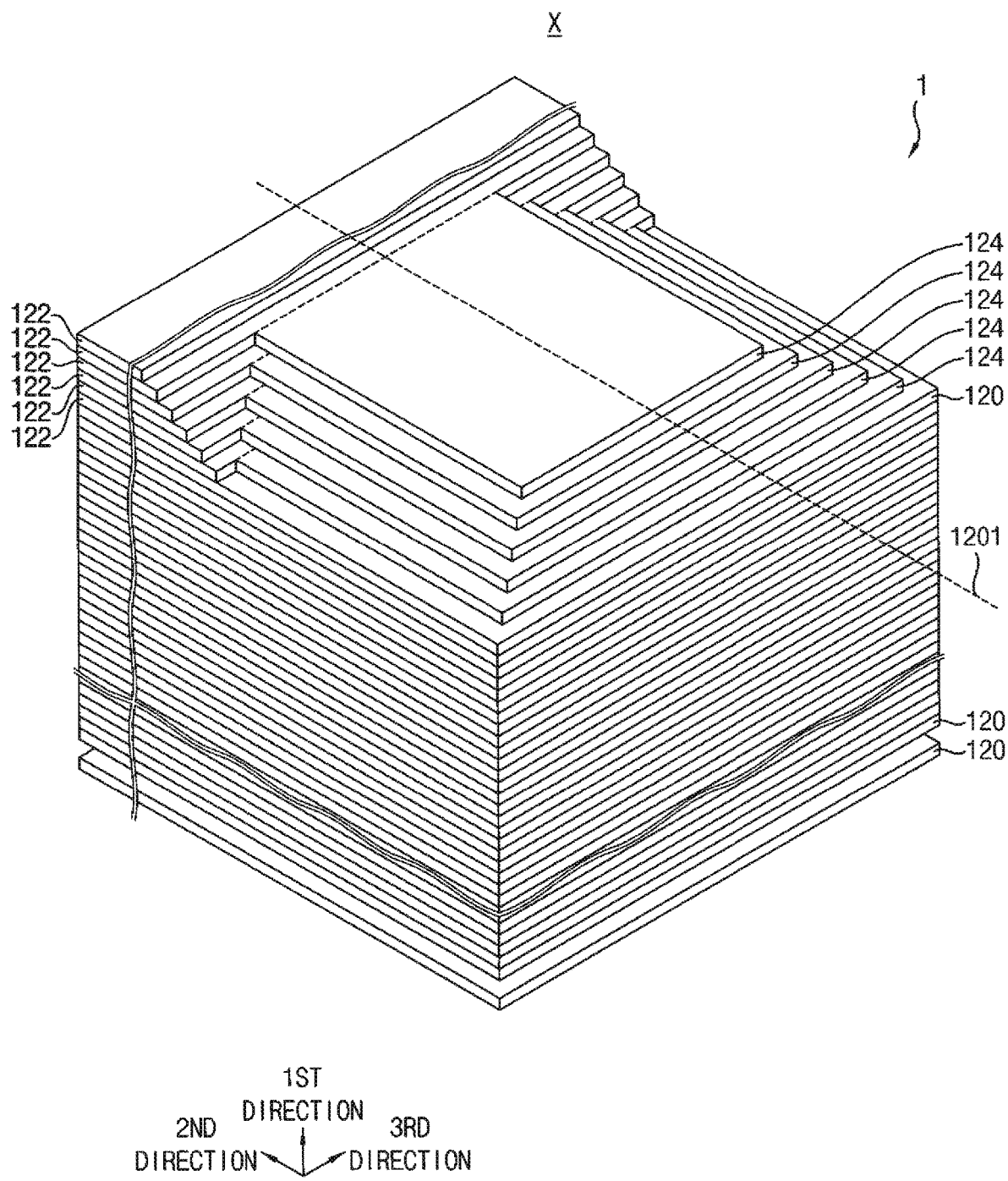
Figure 13A:
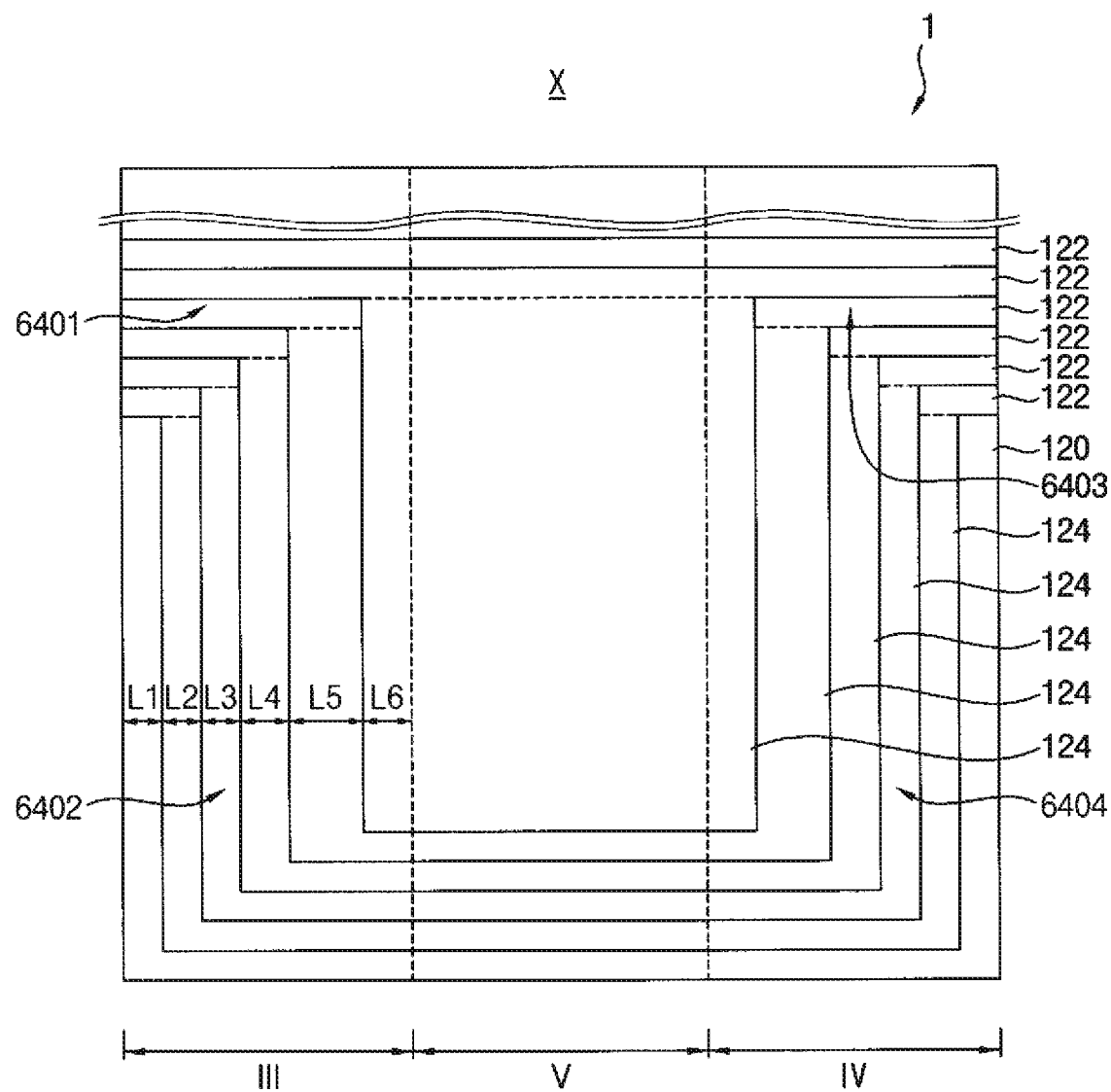

Referring to FIGS. 12 and 13A, a fourth trimming process may be performed. That is, after reducing the areas of the second photoresist pattern 131 by a method substantially the same as those of the first to third trimming processes, the first and second sacrificial patterns 122 and 124 and one of the sacrificial layers 120 of the lower mold layer at a sixth level may be etched using the first and second portions 132 and 134 of the second photoresist pattern 131 as an etching mask.

Thus, lengths in the second direction of the first sacrificial patterns 122 at the second to fifth levels may be reduced, and the first sacrificial pattern 122 may be further formed at the sixth level. Additionally, widths in the third direction of the second sacrificial patterns 124 at the second to fifth levels may be reduced, and the second sacrificial pattern 124 may be further formed at the sixth level.

The second photoresist pattern 131 may be removed.

Thus, the first sacrificial patterns 122 may be stacked at six levels, respectively, in a staircase shape on one of the sacrificial layers 120 of the lower mold layer at a seventh level, and the second sacrificial patterns 124 may be stacked at five levels, respectively, in a staircase shape to be connected to the first sacrificial patterns 122, respectively, on the one of the sacrificial layers 120 of the lower mold layer at the seventh level.

A structure such as the first sacrificial patterns 122 or the second sacrificial patterns 124 stacked in a staircase shape in the first direction may be referred to as "a stair structure."

Each of layers forming the stair structure may be referred to as "a step layer," and a portion of each step layer not covered by upper step layers but exposed may be referred to as "a step." The step may include the sacrificial layer or the sacrificial pattern and the insulation layer thereon that may form a pair.

In some example embodiments, a first stair structure consisting of one of the sacrificial layers 120 of the lower mold layer at the seventh level and the first sacrificial patterns 122 stacked at six levels, respectively, thereover may be formed on the third to fifth regions III, IV and V of the substrate 600, and may include first, second, third, fourth, fifth, sixth and seventh steps.

Additionally, a second stair structure consisting of the one of the sacrificial layers 120 of the lower mold layer at the seventh level and the second sacrificial patterns 124 stacked at five levels, respectively, thereover may be formed on the third region III of the substrate 600, and may include eighth, ninth, tenth, eleventh, twelfth and thirteenth steps, which may have first, second, third, fourth, fifth and sixth lengths L1, L2, L3, L4, L5 and L6, respectively, in the third direction. In some example embodiments, the fifth length L5 may be greater than the fourth and sixth lengths L4 and L6, which may be greater than the first to third lengths L1, L2 and L3. Additionally, the fourth and sixth lengths L4 and L6 may be substantially the same as each other, and the first to third lengths L1, L2 and L3 may be substantially the same as each other.

The first to sixth lengths L1 to L6 of the respective eighth to thirteenth steps in the third direction may be implemented by controlling the reduction ratio of the second photoresist pattern 131 during the trimming processes.

A third stair structure may be formed on the fourth region IV of the substrate 600, and the second and third stair structures may be symmetric with respect to a straight line 1201 extending in the second direction therebetween. That is, the third stair structure may consist of the one of the sacrificial layer 120 at the seventh level and the second sacrificial patterns 124 stacked at five levels, respectively, thereover on the fourth region IV of the substrate 600, and may include fourteenth, fifteenth, sixteenth, seventeenth, eighteenth and nineteenth steps, which may have the first, second, third, fourth, fifth and sixth L1, L2, L3, L4, L5 and L6, respectively, in the third direction.

In some example embodiments, each of the second and third stair structures may be connected to the first stair structure. For example, the eighth step included in the second stair structure may be substantially the same as the first step included in the first stair structure, and the ninth to thirteenth steps included in the second stair structure may be connected to the second to sixth steps, respectively, included in the first stair structure.

FIG. 13A shows that the lengths in the second direction of the second to sixth steps of the first stair structure are substantially equal to each other, however, the inventive concepts may not be limited thereto.

Figure 13B:
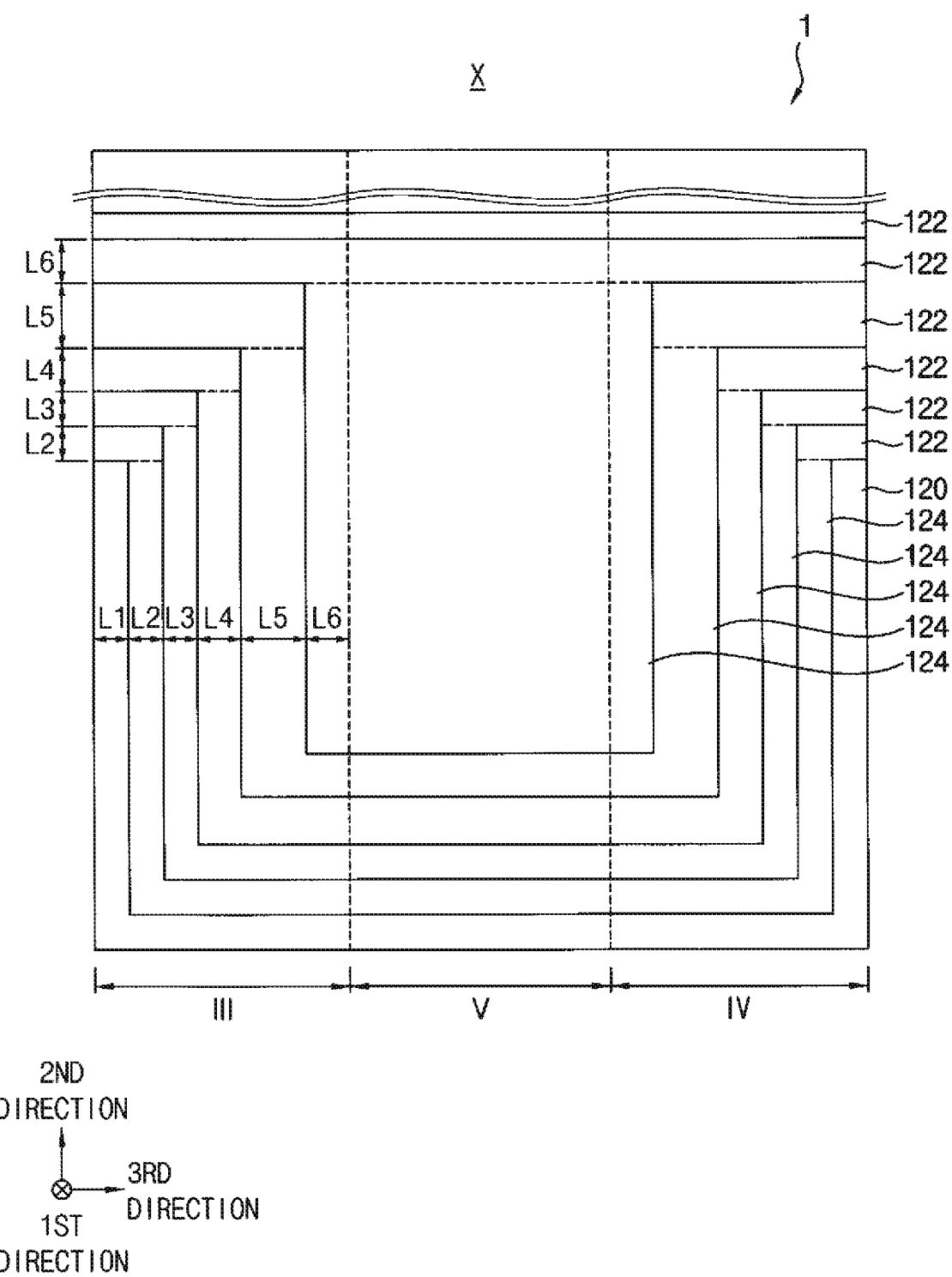

That is, referring to FIG. 13B, the lengths of the second to sixth steps of the first stair structure may be equal to the second to sixth lengths L2, L3, L4, L5 and L6 of the ninth to thirteenth steps, respectively, of the second stair structure, and thus may be different from each other. Hereinafter, for the convenience of explanation, only the first stair structure shown in FIG. 13A will be illustrated, however, the first stair structure shown in FIG. 13B may be also included in the scope of the inventive concepts.

Figure 14:
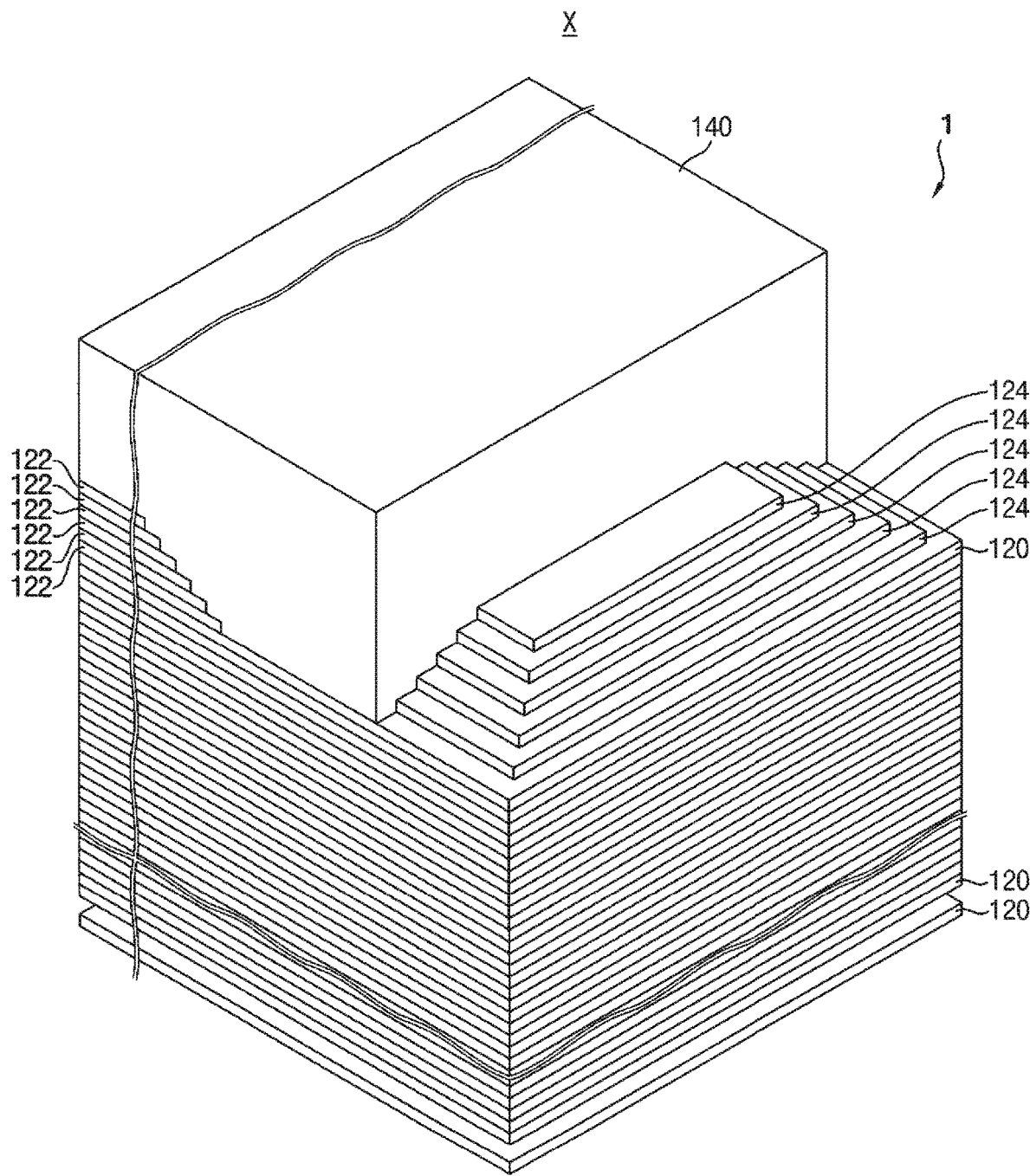

Referring to FIG. 14, a third photoresist pattern 140 may be formed on the one of the sacrificial layers 120 of the lower mold layer at the seventh level to cover the first sacrificial patterns 122 and portions of the second sacrificial patterns 124 adjacent thereto.

Figure 15:
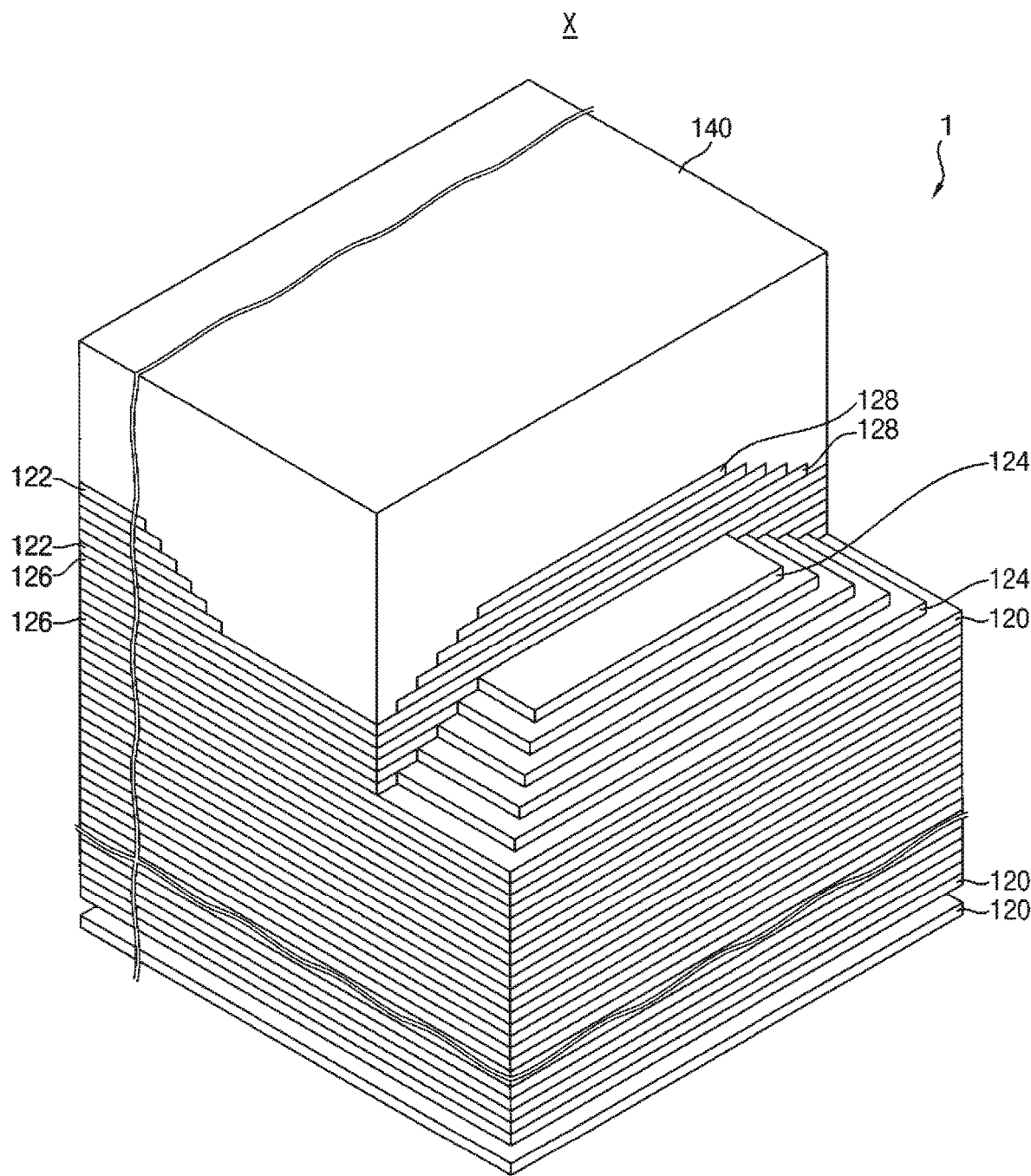

Referring to FIG. 15, the second sacrificial patterns 124 and ones of the sacrificial layers 120 of the lower mold layer at seventh to twelfth levels, respectively, may be etched using the third photoresist pattern 140 as an etching mask.

Thus, third sacrificial patterns 126 having a length in the second direction greater than those of the first sacrificial patterns 122 may be formed at seventh to twelfth levels, respectively, and portions of the second sacrificial patterns 124 not covered by the third photoresist pattern 140 may be moved from the second to sixth levels to the eighth to twelfth levels, respectively. Portions of the second sacrificial patterns 124 covered by the third photoresist pattern 140 to remain may be transformed into fourth sacrificial patterns 128, respectively, on one of the third sacrificial patterns 126 of the lower mold layer at the seventh level.

Figure 16:
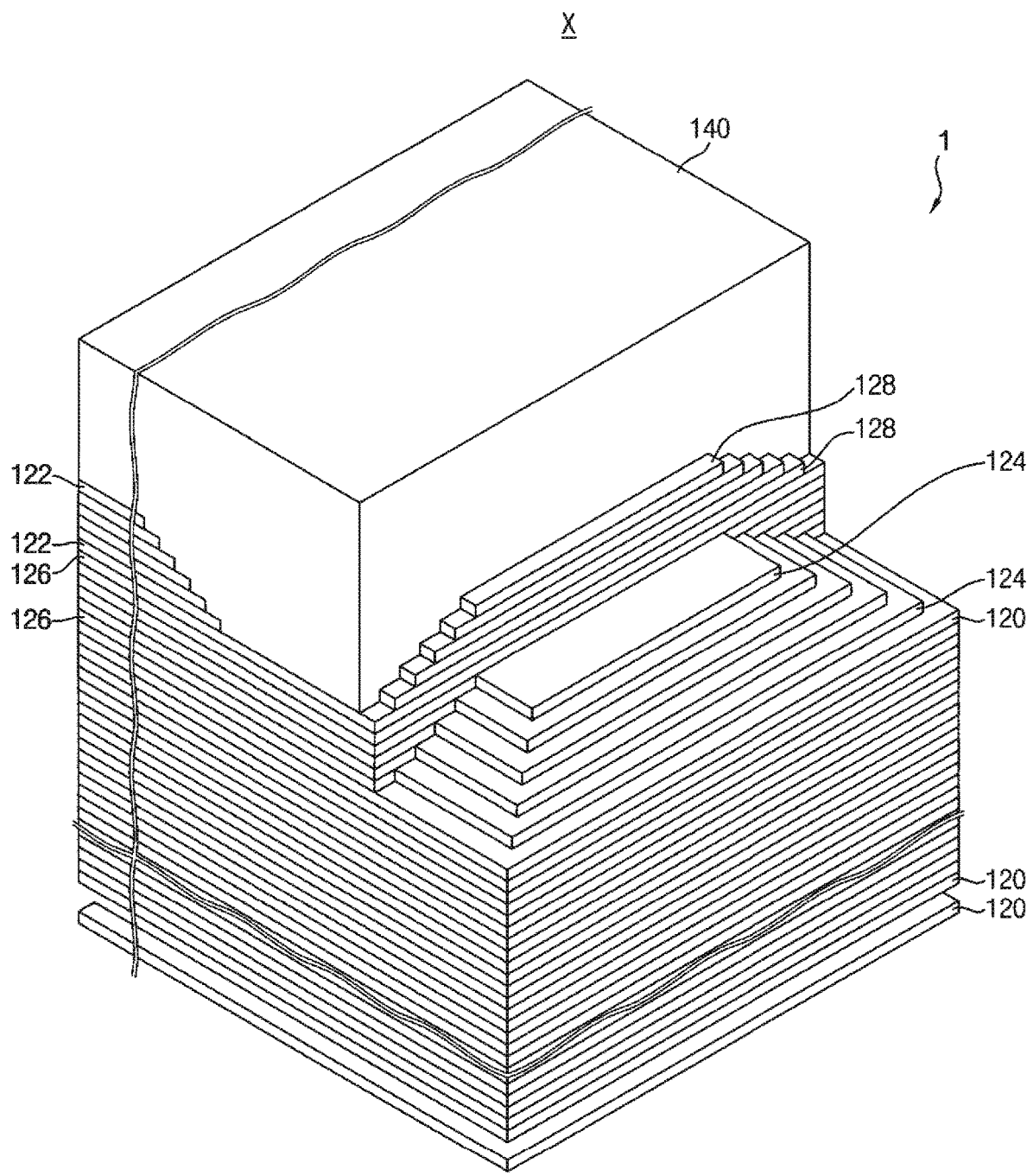

Referring to FIG. 16, a fifth trimming process in which a length in the second direction of the third photoresist pattern 140 is reduced may be performed so that portions of the fourth sacrificial patterns 128 may be exposed.

Figure 17:
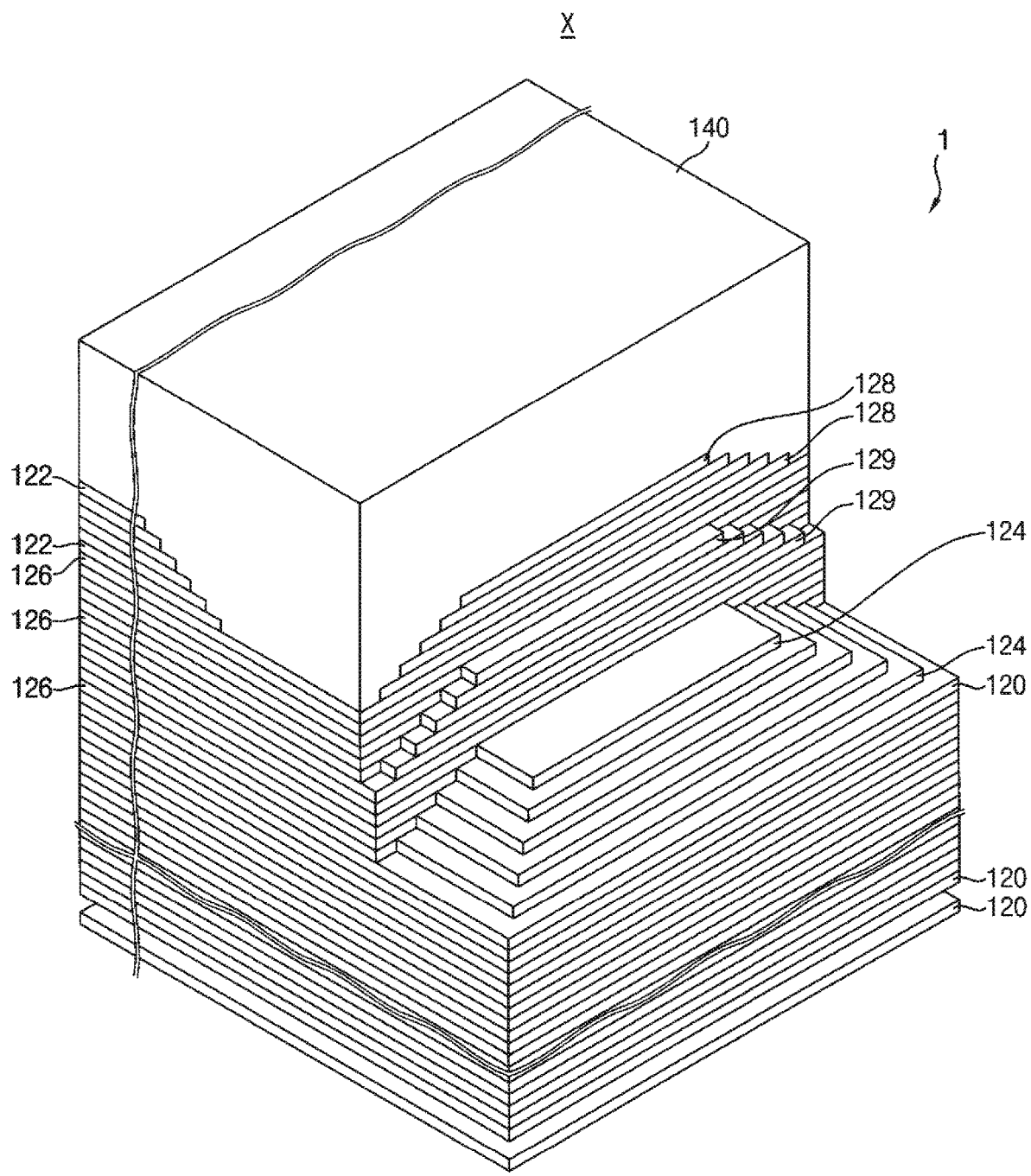

Referring to FIG. 17, the exposed fourth sacrificial patterns 128, the second and third sacrificial patterns 124 and 126, and ones of the sacrificial layers 120 of the lower mold layer at thirteenth to eighteenth levels, respectively, may be etched using the third photoresist pattern 140 as an etching mask.

Thus, the third sacrificial patterns 126 at the seventh to twelfth levels, respectively, may be reduced to have a same length smaller than the previous one, and the third sacrificial patterns 126 may be further formed at the thirteenth to eighteenth levels, respectively, to have a same length greater than that of the third sacrificial patterns 126 at the seventh to twelfth levels. The exposed portions of the fourth sacrificial patterns 128 may be moved from the second to sixth levels to the eighth to twelfth levels, respectively, which may be referred to as fifth sacrificial patterns 129, respectively, hereinafter. Portions of the second sacrificial patterns 124 not covered by the third photoresist pattern 140 may be moved from the eighth to twelfth levels to the fourteenth to eighteenth levels, respectively.

Processes substantially the same as or similar to those illustrated with reference to FIGS. 16 and 17 may be repeatedly performed, and drawings thereon are omitted herein.

Figure 18:
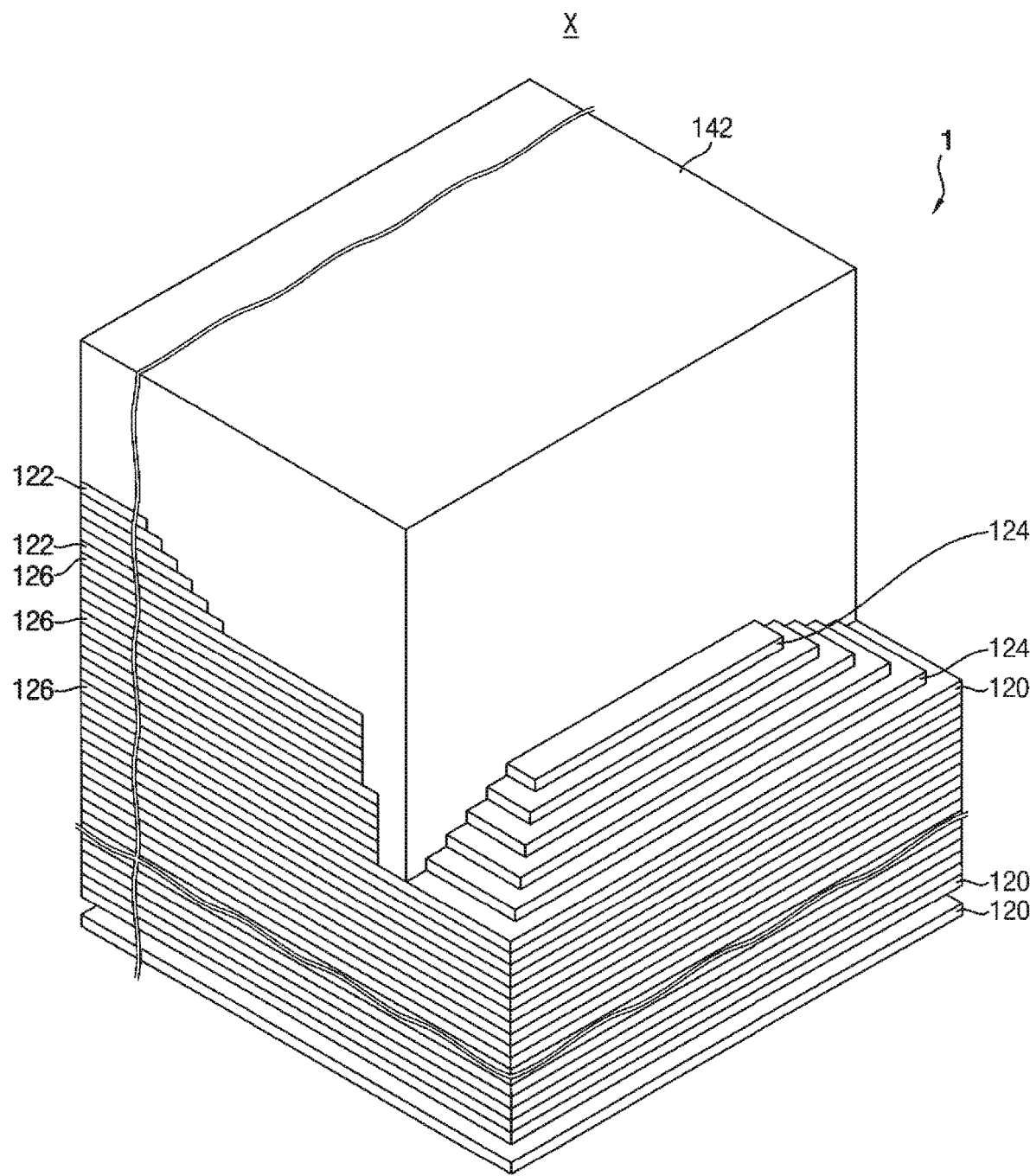
Figure 19:
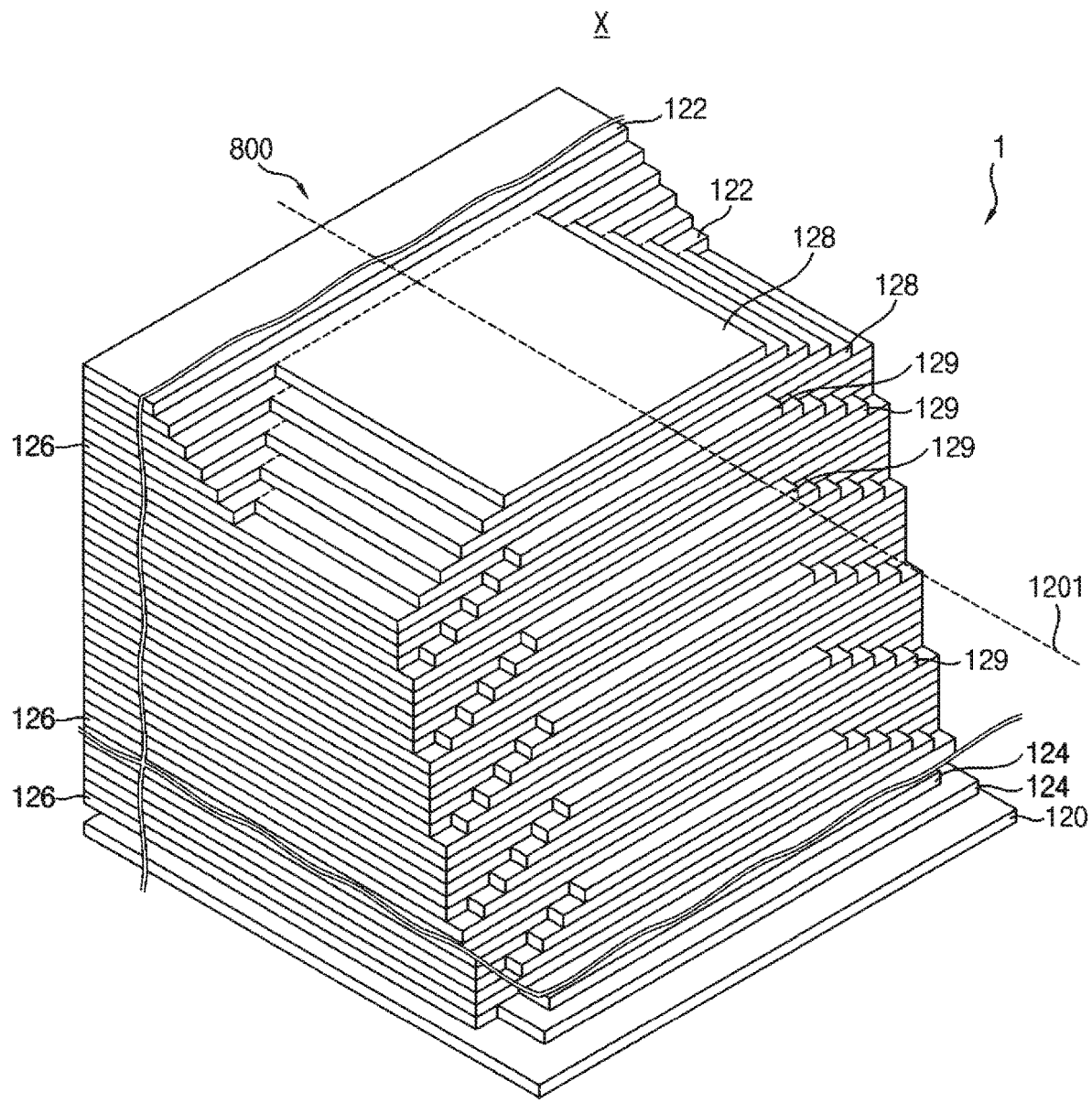
Figure 20:
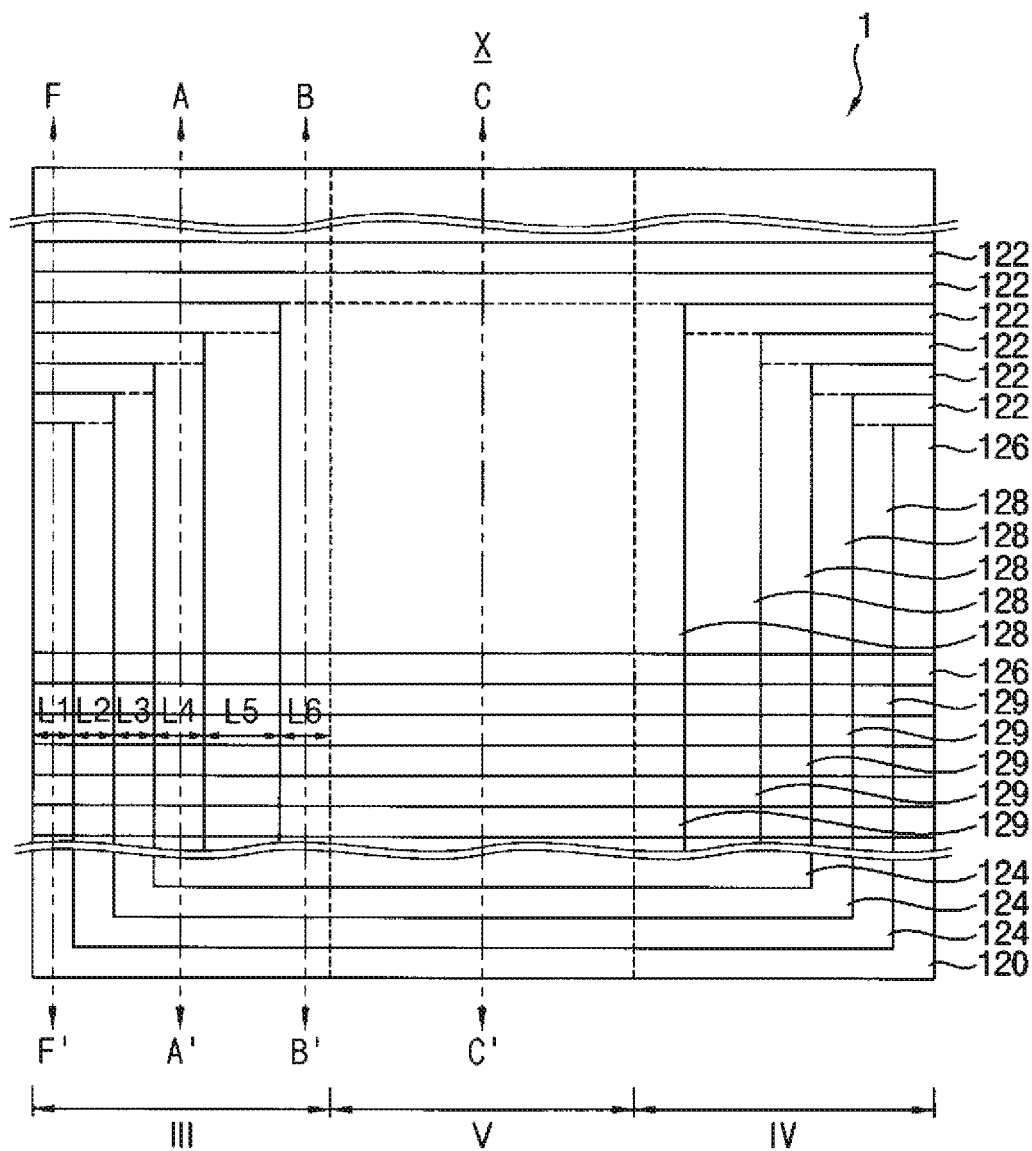

Referring to FIG. 18, after removing the third photoresist pattern 140, processes substantially the same as or similar to those illustrated with reference to FIG. 14 may be performed.

That is, a fourth photoresist pattern 142 may be formed on one of the sacrificial layers 120 of the lower mold layer at a given level to cover the first sacrificial patterns 122, the third to fifth sacrificial patterns 126, 128 and 129, and portions of the second sacrificial patterns 124 adjacent thereto.

Referring to FIGS. 19 to 23, processes substantially the same as or similar to those illustrated with reference to FIGS. 15 to 17 may be repeatedly performed so that the fifth sacrificial patterns 129 may be further formed at desired levels and that stair structures each of which may include the first to fifth sacrificial patterns 122, 124, 126, 128 and 129 may be formed on the second region II of the substrate 600. The stair structures together with the insulation layers 110 and the sacrificial layers 120 remaining on the first region I of the substrate 600 may form a lower mold 800.

In some example embodiments, the first sacrificial patterns 122 may form the first stair structure in which step layers have lengths in the second direction gradually decreasing from a lowermost level toward an uppermost level on the third to fifth regions III, IV and V of the substrate 600, and the fourth sacrificial patterns 128 may form the second and third stair structures in which steps layers have lengths in the second direction decreasing from a lowermost level toward an uppermost level on the third and fourth regions III and IV, respectively, of the substrate 600.

Additionally, the third sacrificial patterns 126 may form a fourth stair structure in which step layers have lengths in the second direction gradually decreasing from a lowermost level toward an uppermost level by a unit of several levels, e.g., six levels, the second sacrificial patterns 124 may form a fifth stair structure in which step layers have lengths in each of the second and third directions gradually decreasing from a lowermost level toward an uppermost level, and the fifth sacrificial patterns 129 may form sixth and seventh stair structures in which step layers have lengths in the third direction gradually decreasing from a lowermost level toward an uppermost level on the third and fourth regions III and IV, respectively, of the substrate 600.

The sixth stair structure may include twentieth to twenty-fifth steps sequentially stacked in the first direction from a lowermost level toward an uppermost level, which may be sequentially arranged in the third direction. The twentieth to twenty-fifth steps may have the first to sixth lengths L1, L2, L3, L4, L5 and L6, respectively, in the third direction.

The sixth and seventh stair structures may be spaced apart from each other ("isolated from direct contact with each other") in the third direction, and may be symmetric with respect to a straight line 1201 extending in the second direction therebetween. Thus, the seventh stair structure may include twenty-sixth to thirty-first steps sequentially stacked in the first direction from a lowermost level toward an uppermost level, and which may have the first to sixth lengths L1, L2, L3, L4, L5 and L6, respectively, in the third direction.

Figure 24:
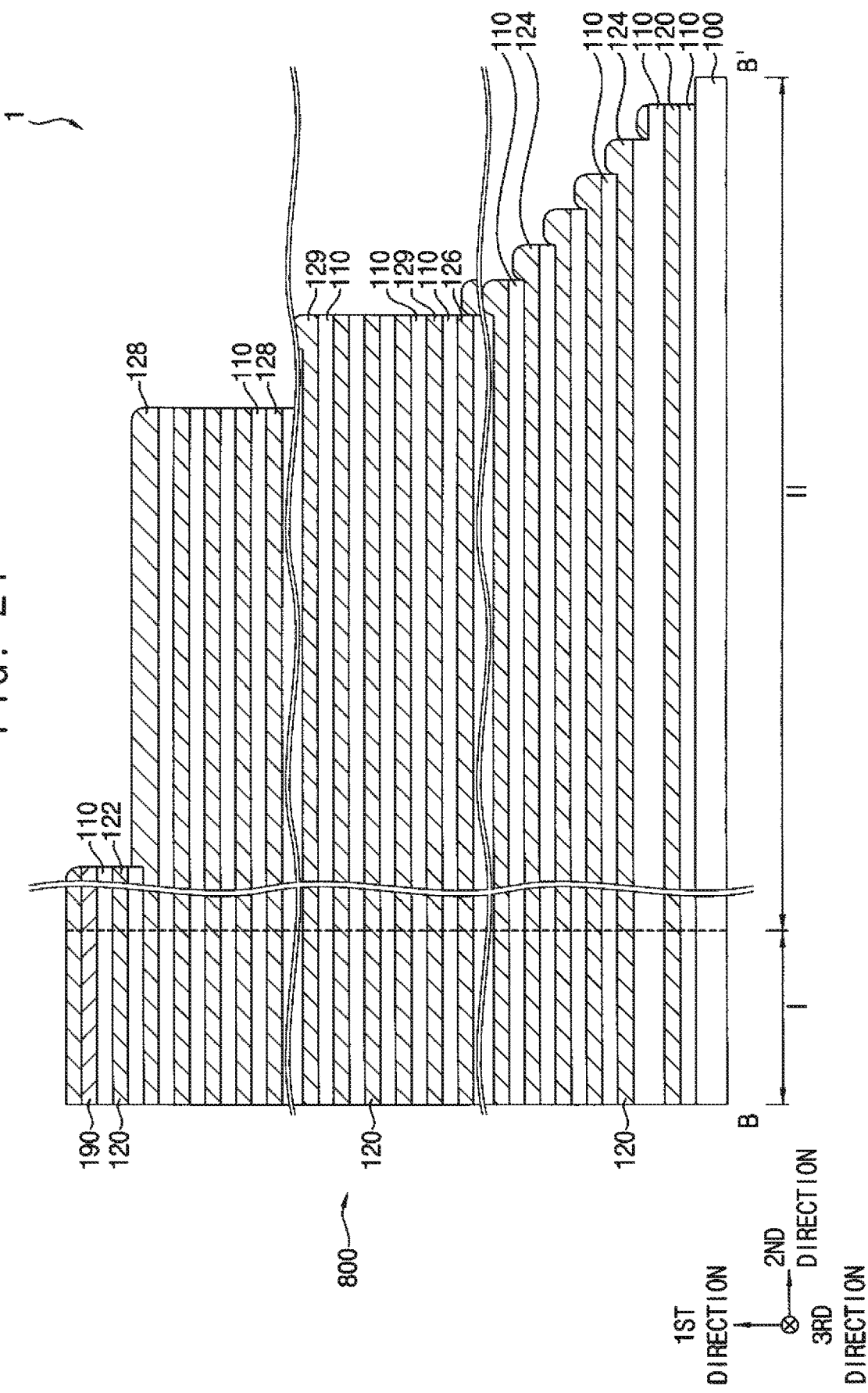

Referring to FIG. 24, thicknesses of end portions in the second direction or the third direction of ones of the first to fifth sacrificial patterns 122, 124, 126, 128 and 129 of the lower mold 800 on the second region II of the substrate 600 may be increased.

In some example embodiments, portions of the insulation layers 110 on steps of the stair structures may be removed to expose end portions of the first to fifth sacrificial patterns 122, 124, 126, 128 and 129 of the steps, and a material substantially the same as that of the sacrificial layer 120 may be deposited on the exposed end portions of the first to fifth sacrificial patterns 122, 124, 126, 128 and 129 so that the thicknesses of end portions of the ones of the first to fifth sacrificial patterns 122, 124, 126, 128 and 129 may be increased. Accordingly, the end portions of the ones of the first to fifth sacrificial patterns 122, 124, 126, 128 and 129 may have top surfaces higher than those of other portions thereof and may have thicknesses greater than those of other portions thereof.

Figure 25:
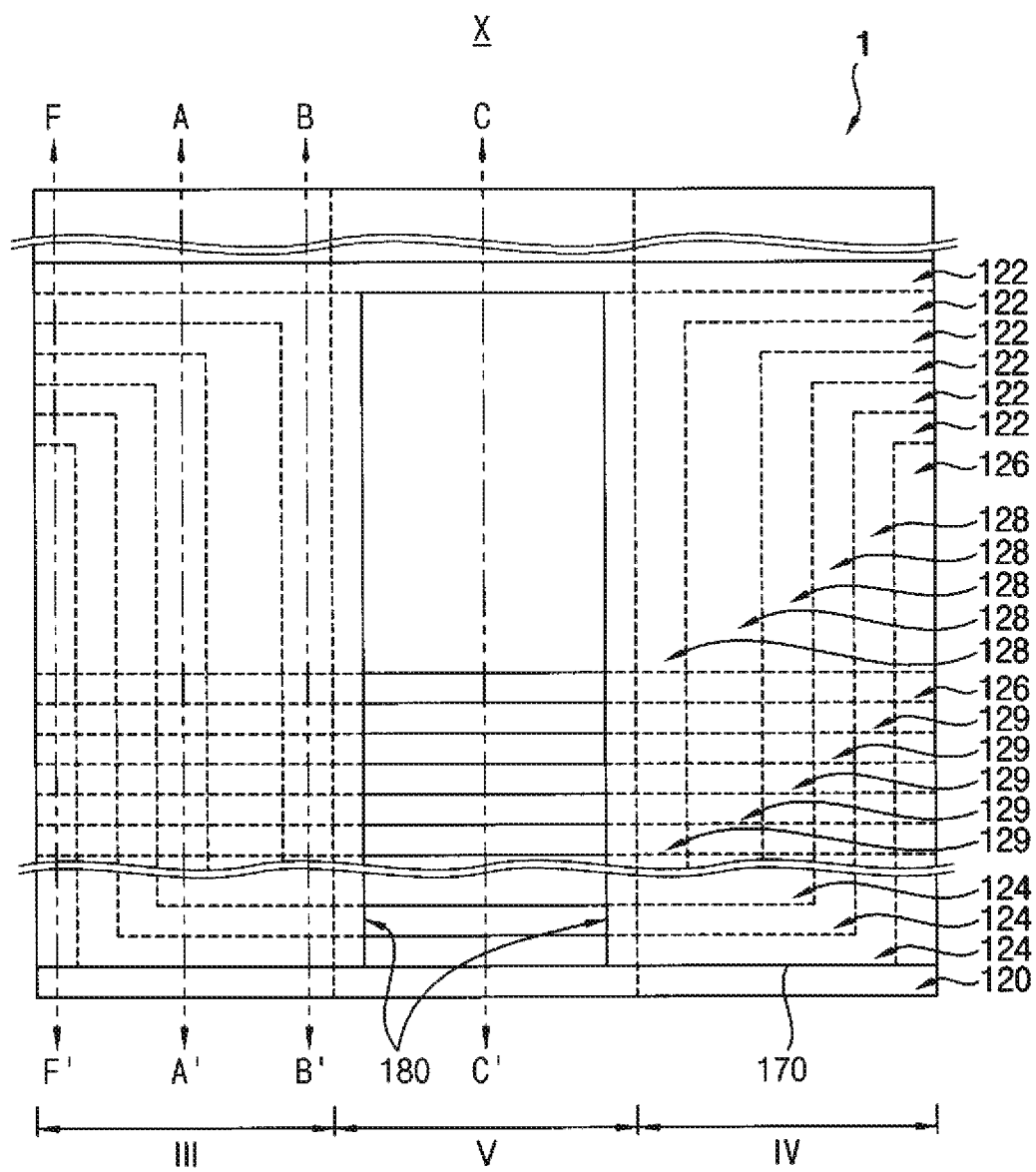
Figure 26:
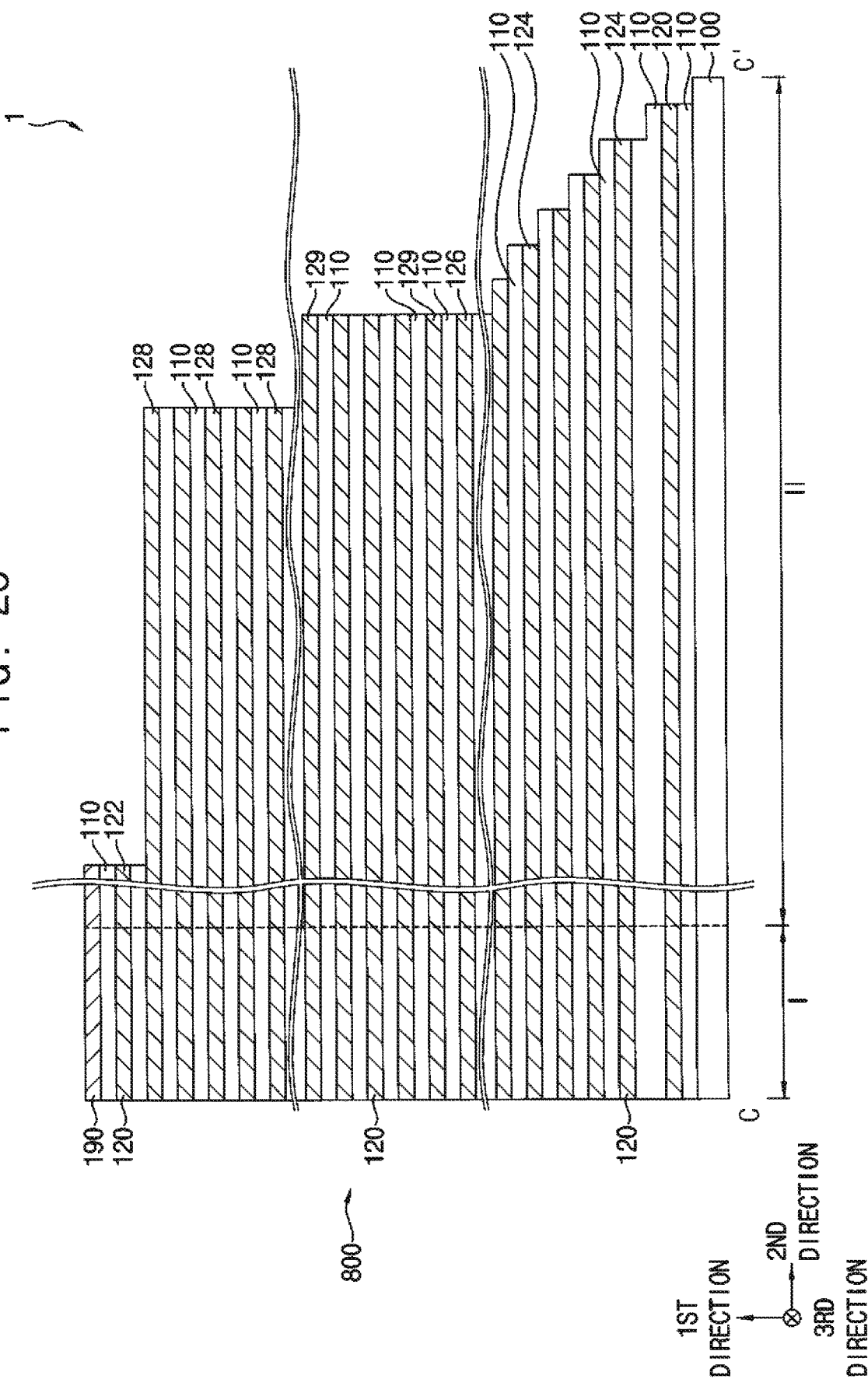

Referring to FIGS. 25 and 26, a first etching mask 170 having a second opening 180 exposing the fifth region V of the substrate 600 and a lowermost one of the sacrificial layers 120 may be formed on the first and second regions I and II of the substrate 600, and the thicknesses of the end portions of ones of the first to fifth sacrificial patterns 122, 124, 126, 128 and 129 of the lower mold 800 on the fifth region V of the substrate 600 and the lowermost one of the sacrificial layers 120 of the lower mold 800 may be decreased.

In some example embodiments, the increased thicknesses of the end portions of the ones of the first to fifth sacrificial patterns 122, 124, 126, 128 and 129 illustrated with reference to FIG. 24 may be reduced to the original ones on the fifth region V of the substrate 600 and the lowermost one of the sacrificial layers 120.

Figure 27:
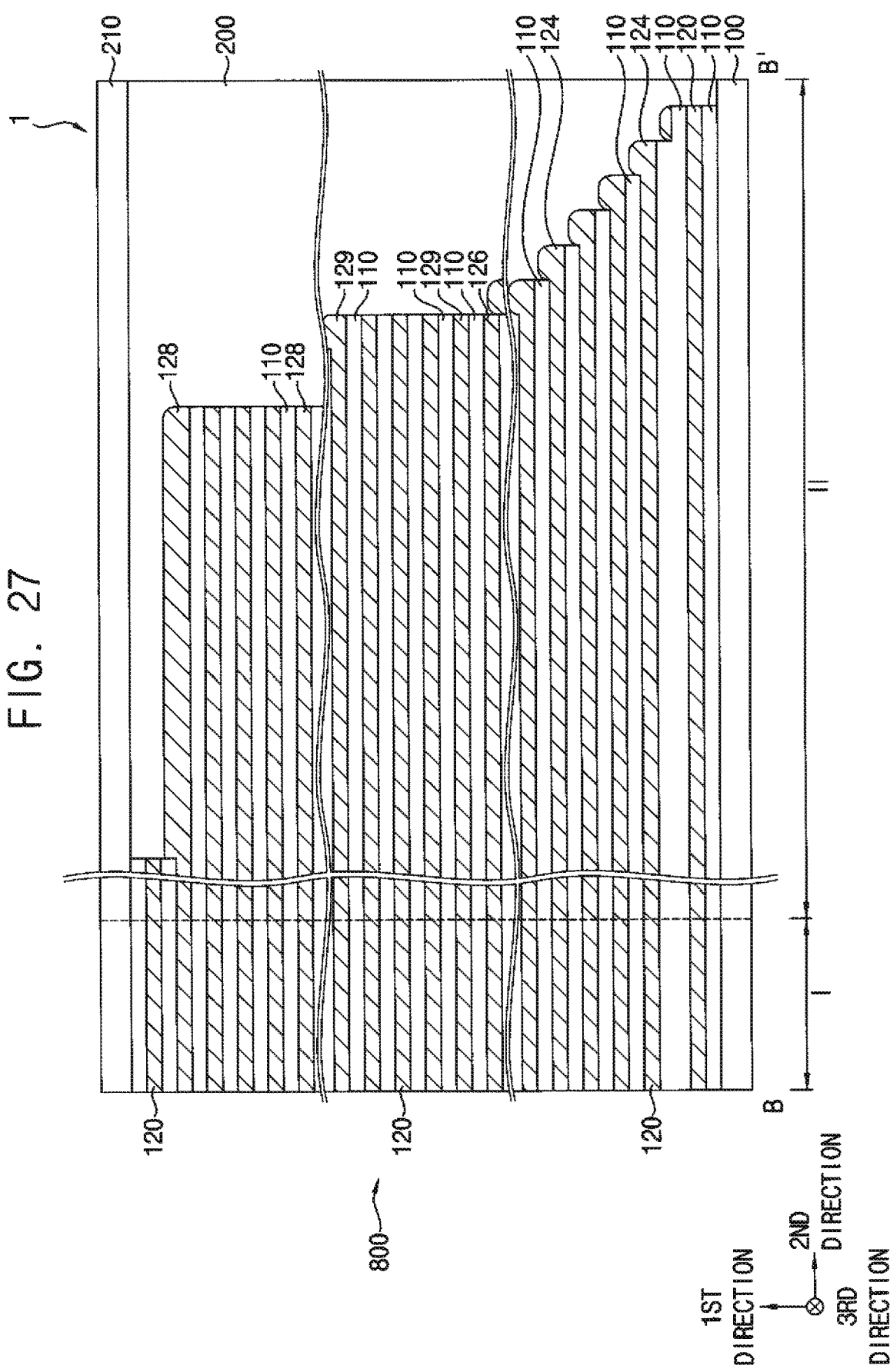

Referring to FIG. 27, a first insulating interlayer 200 may be formed on the substrate 600 to cover the lower mold 800, and may be planarized until an upper surface of an uppermost one of the insulation layers 110 of the lower mold 800 may be exposed. The planarization process may include a chemical mechanical polishing (CMP) process and/or an etch back process.

A second insulating interlayer 210 may be formed on the lower mold 800 and the first insulating interlayer 200. The first and second insulating interlayers 200 and 210 may include an oxide, e.g., silicon oxide. In some example embodiments, the first and second insulating interlayers 200 and 210 may be merged to the insulation layer 110.

Figure 28:
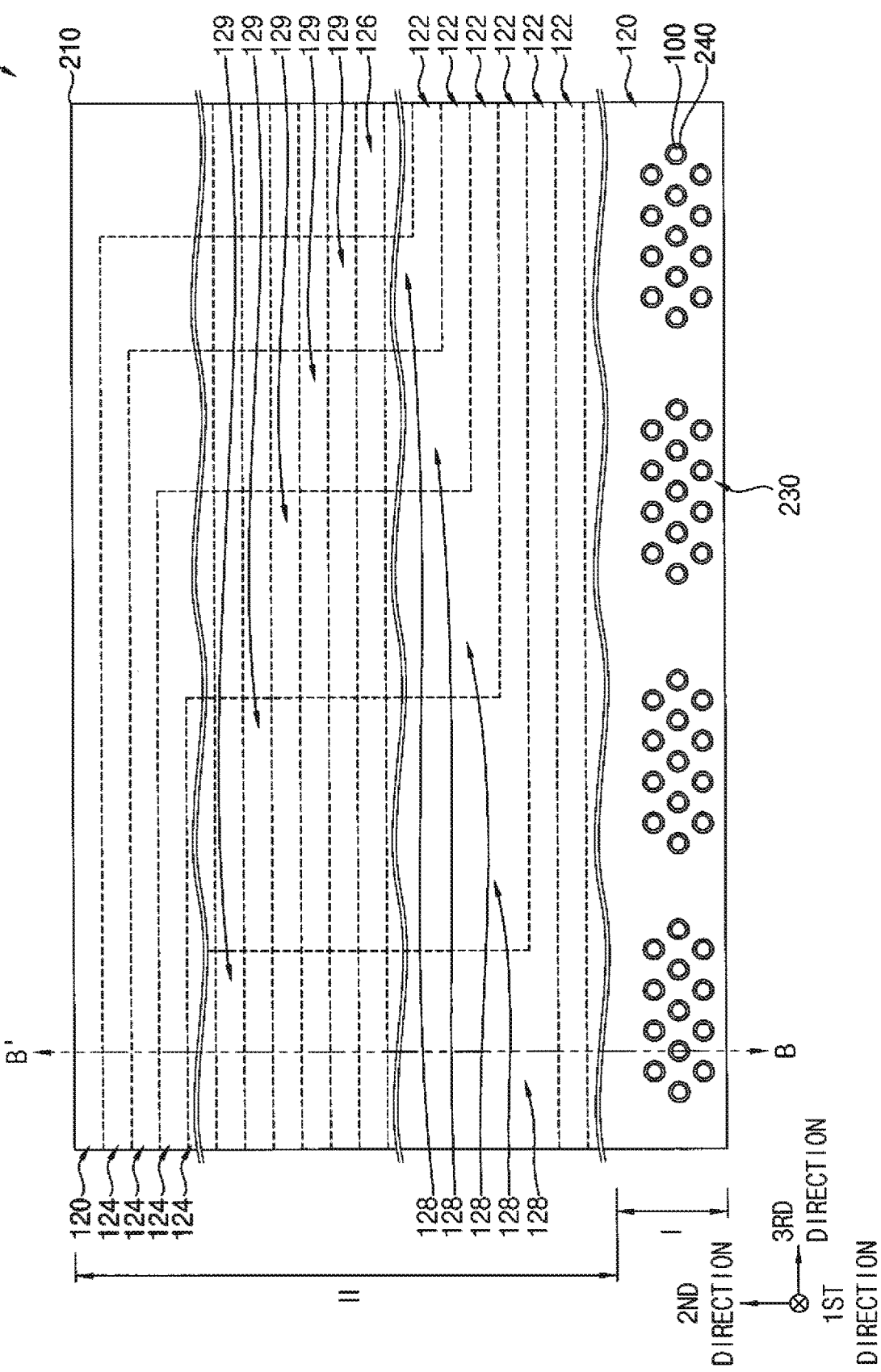
Figure 29:
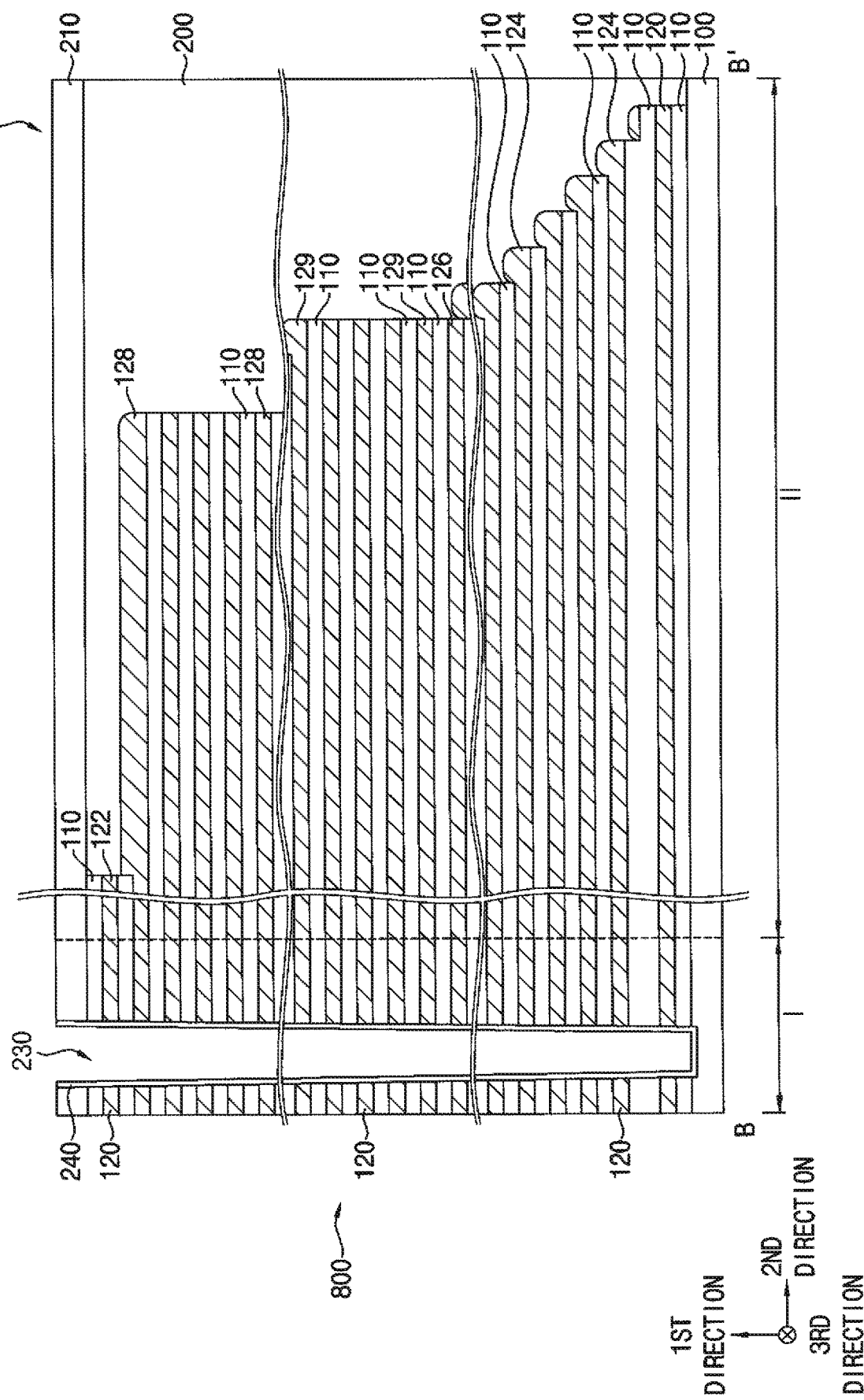

Referring to FIGS. 28 and 29, a second etching mask (not shown) may be formed on the second insulating interlayer 210, and the second insulating interlayer 210 and the insulation layers 110 and the sacrificial layers 120 of the lower mold 800 may be etched using the second etching mask to form a first channel hole 230 therethrough exposing an upper surface of the base pattern 100 on the first region I of the substrate 600. A barrier pattern 240 may be formed on a sidewall and a bottom of the first channel hole 230. In some example embodiments, a plurality of first channel holes 230 may be formed in each of the second and third directions.

The barrier pattern 240 may be formed by forming a barrier layer on the sidewall and the bottom of the first channel hole 230, the uppermost one of the insulation layers 110 of the lower mold 800 and the second insulating interlayer 210, and removing a portion of the barrier layer on the second insulating interlayer 210 through an anisotropic etching process. The barrier pattern 240 may include a nitride, e.g., a metal nitride or silicon nitride, or polysilicon.

Figure 30:
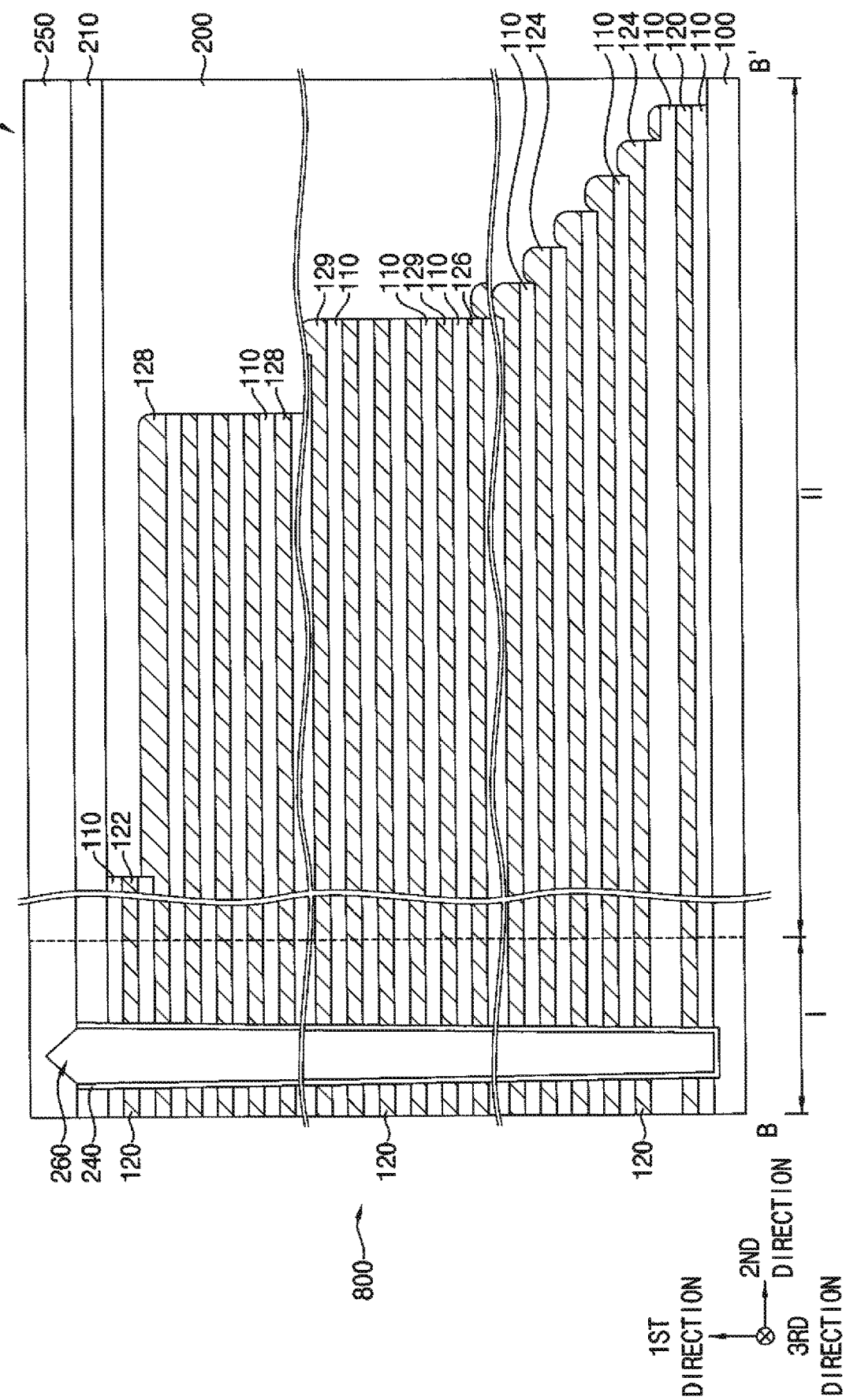

Referring to FIG. 30, a connecting layer 250 may be formed on the second insulating interlayer 210, and an upper portion of the connecting layer 250 may be planarized.

In some example embodiments, the connecting layer 250 may include a material having a low gap-filling characteristic or a low step coverage, e.g., TEOS, HDP oxide, etc. Thus, the first channel hole 230 may not be completely filled with the connecting layer 250, and a space may be further formed on the first channel hole 230 to be connected thereto. Hereinafter, the first channel hole 230 and the space may be referred to as a first gap 260.

Figure 31:
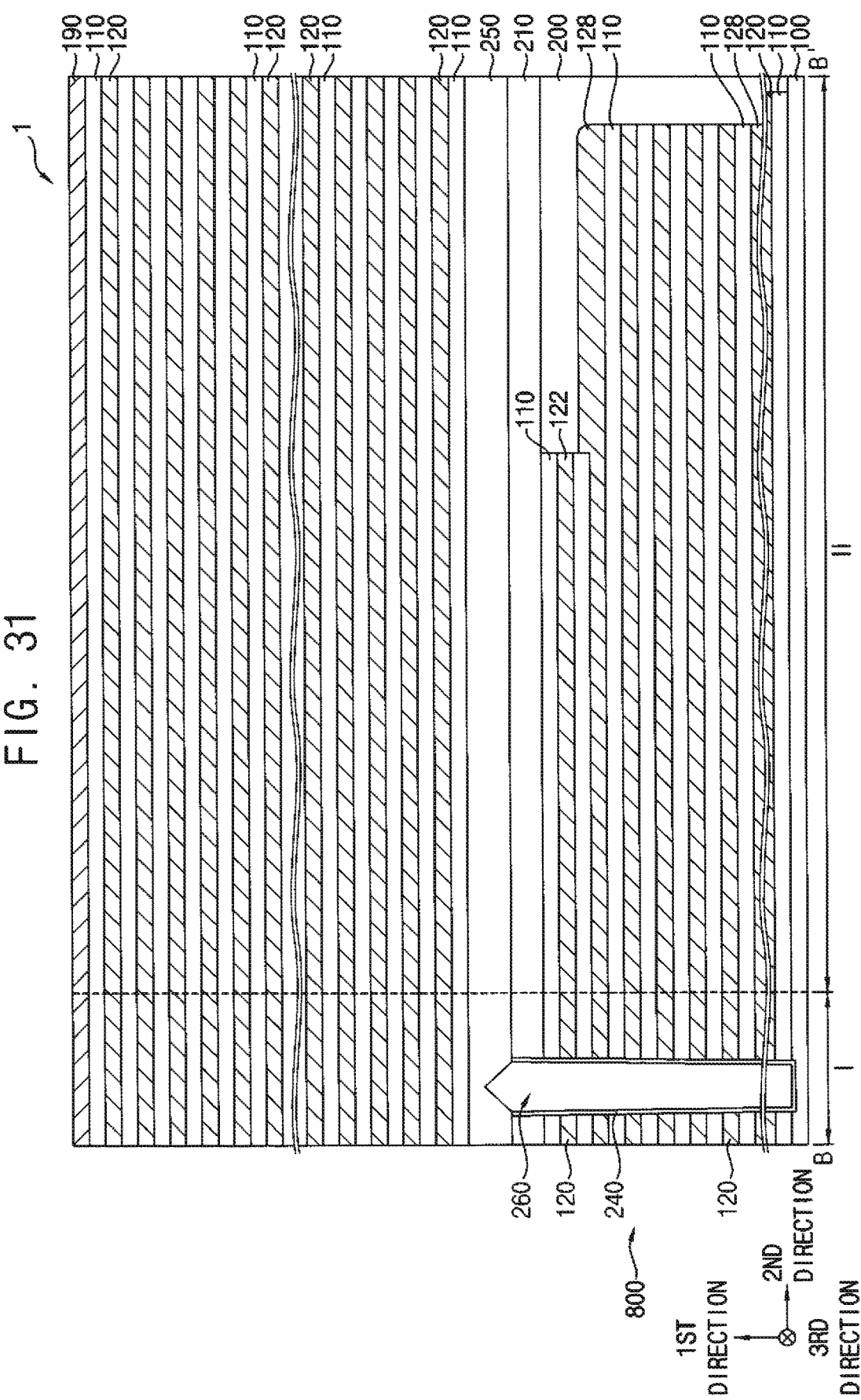
Figure 32:
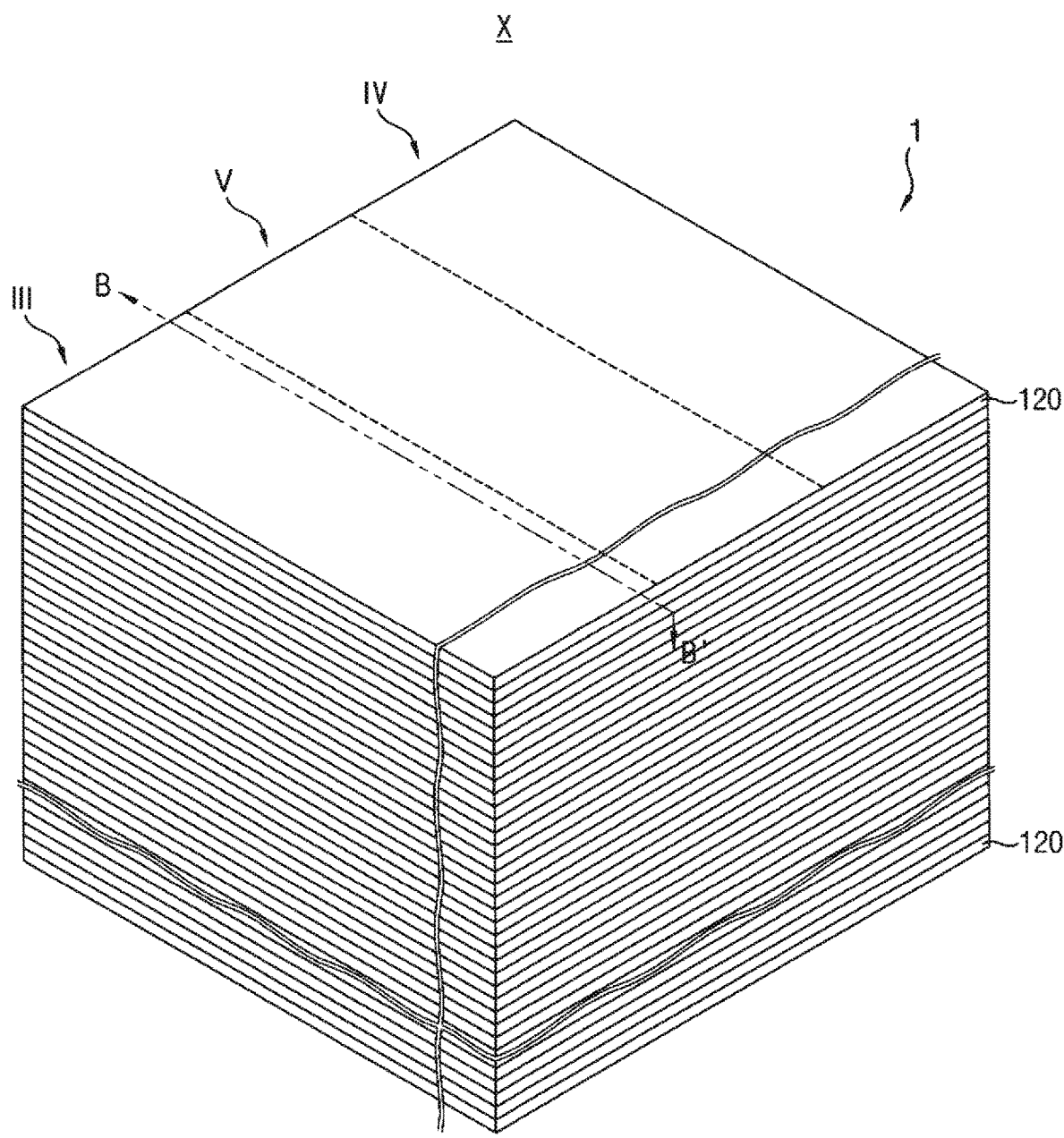

Referring to FIGS. 31 and 32, the insulation layer 110 and the sacrificial layer 120 may be further formed on the connecting layer 250 alternately and repeatedly, so that an upper mold layer including the insulation layers 110 and the sacrificial layers 120 alternately stacked in the first direction may be formed. Additionally, the etch stop layer 190 may be also formed on an uppermost one of the insulation layers 110 of the upper mold layer.

Figure 43:
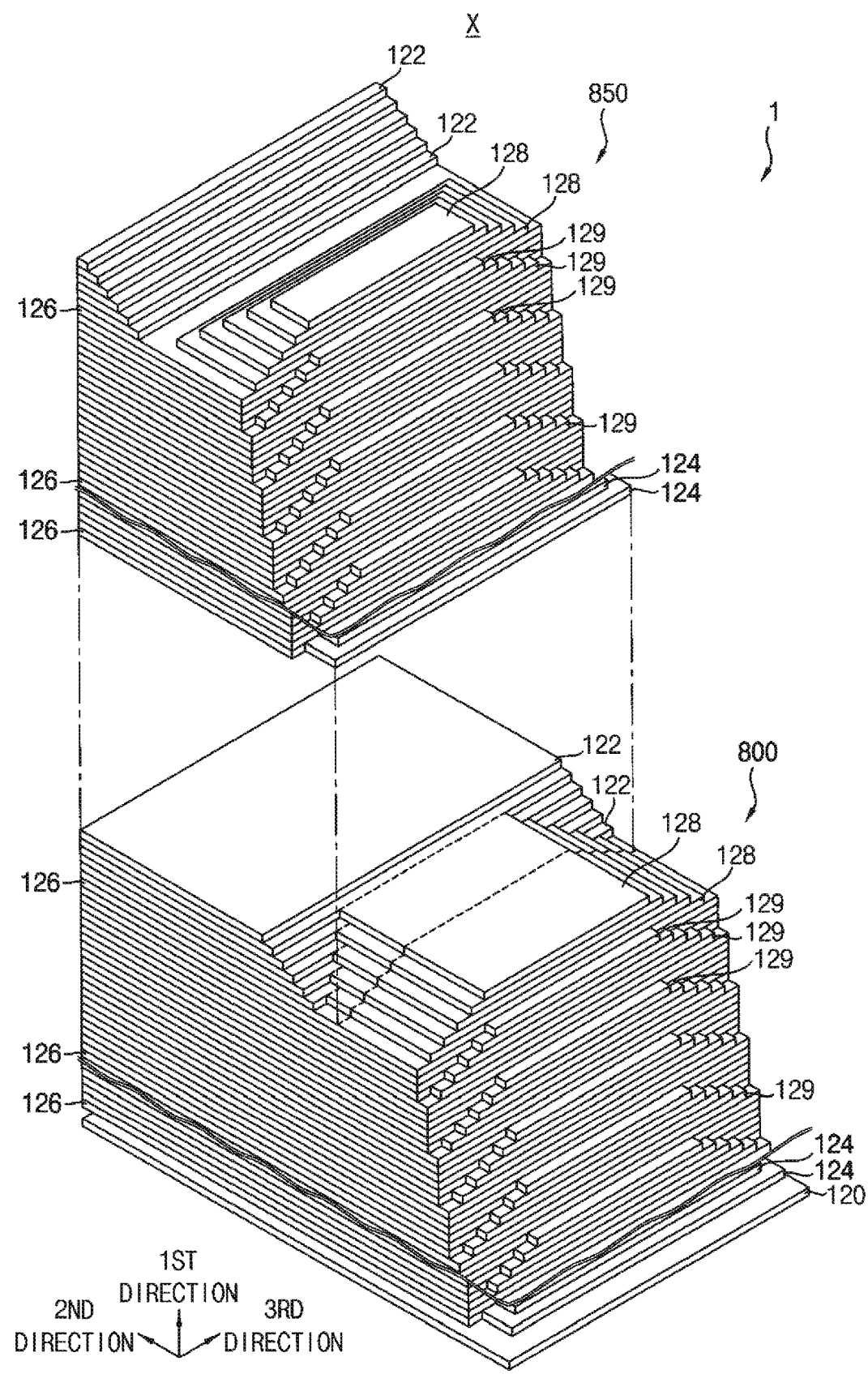

Hereinafter, in all perspective views except for FIG. 43, processes for forming the upper mold will be illustrated, and the lower mold 800 will not be shown.

Figure 33:
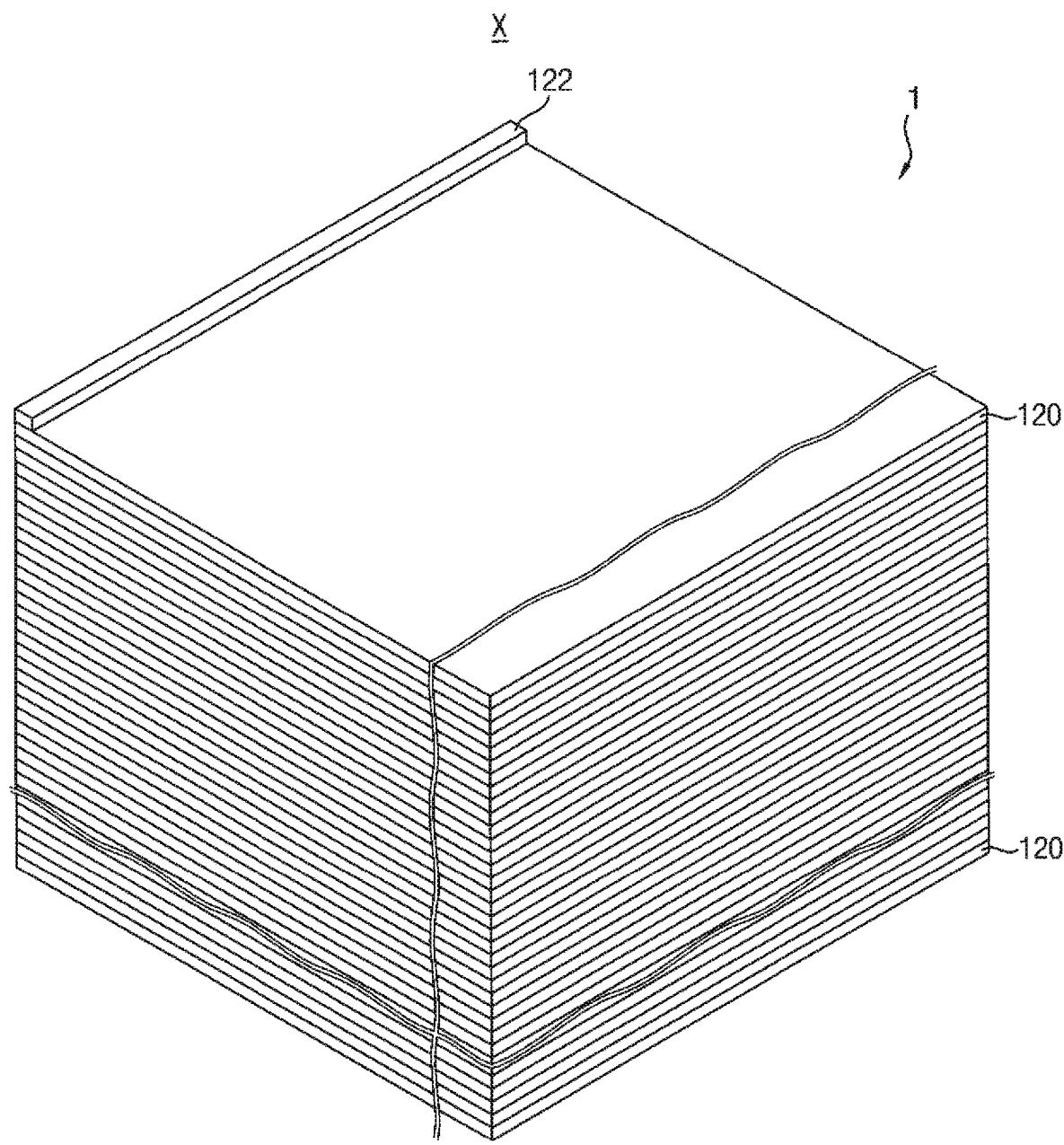

Referring to FIG. 33, processes substantially the same as or similar to illustrated with reference to FIG. 7 may be performed.

Thus, an etching process may be performed using a fifth photoresist (not shown) to form the first sacrificial pattern 122 having a rectangular ring shape surrounding an uppermost one of the sacrificial layers 120 of the upper mold layer on the first region I of the substrate 600, and the etch stop layer 190 may be formed on the uppermost one of the sacrificial layers 120 and the first sacrificial pattern 122 the upper mold layer. However, the first sacrificial pattern 122 of FIG. 33 may have a length in the second direction from an edge of the first region I of the substrate 600 less than that of the first sacrificial pattern 122 of FIG. 7.

Figure 34:
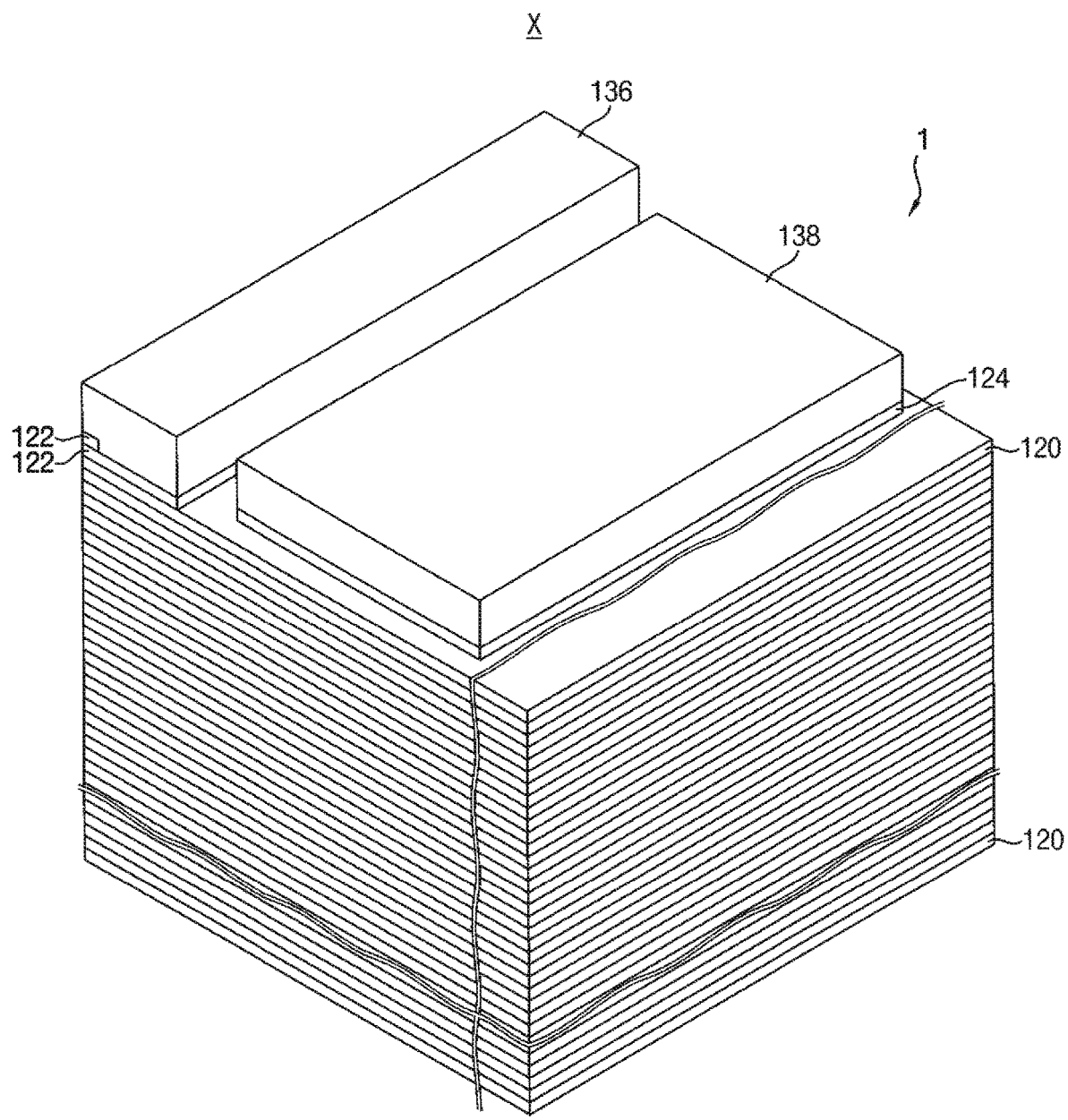

Referring to FIG. 34, processes substantially the same as or similar to those illustrated with reference to FIG. 8 may be performed. However, unlike the second photoresist pattern 131 including the first and second portions 132 and 134 connected to each other, sixth and seventh photoresist patterns 136 and 138 spaced apart from each other ("isolated from direct contact with each other") in the second direction may be used in the etching process.

The sixth photoresist pattern 136 may cover the first sacrificial pattern 122, and may have a length in the second direction greater than that of the first sacrificial pattern 122. The seventh photoresist pattern 138 may cover a portion of the sacrificial layer 120 on the region X, and may have a rectangular shape in a plan view.

As the etching process is performed, the first sacrificial pattern 122 may be further formed at a second level to have a length in the second direction greater than that of the first sacrificial pattern 122 at the first level, and the second sacrificial pattern 124 having a rectangular shape in a plan view may be formed to be spaced apart from the first sacrificial pattern 122 at the second level.

Figure 35:
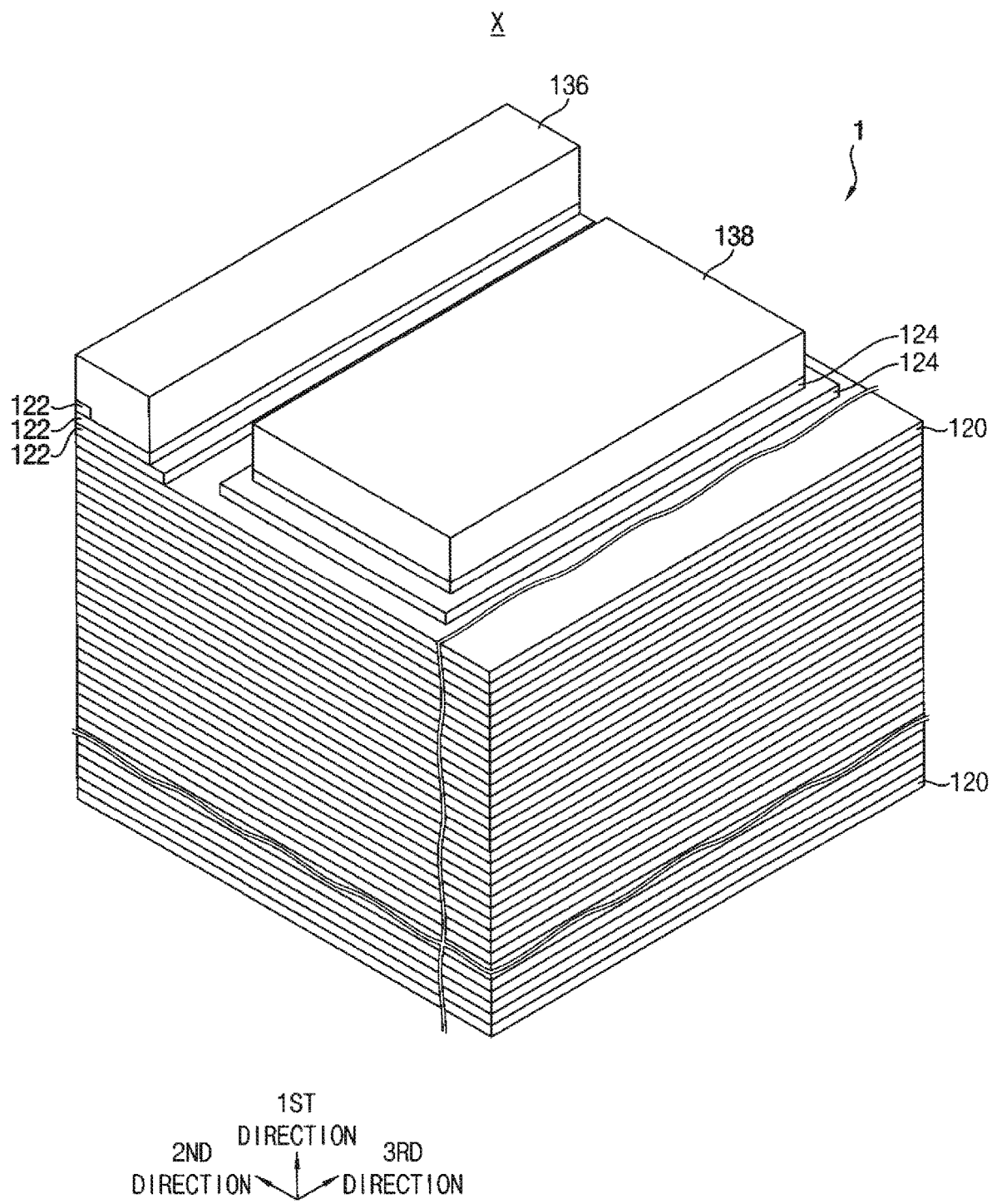

Referring to FIG. 35, processes substantially the same as or similar to those illustrated with reference to FIG. 9 may be performed.

Thus, the first sacrificial pattern 122 at the second level may have a reduced length in the second direction, and the first sacrificial pattern 122 may be further formed at a third level. Additionally, the second sacrificial pattern 124 at the second level may have a reduced area, and the second sacrificial pattern 124 may be further formed at the third level.

Figure 36:
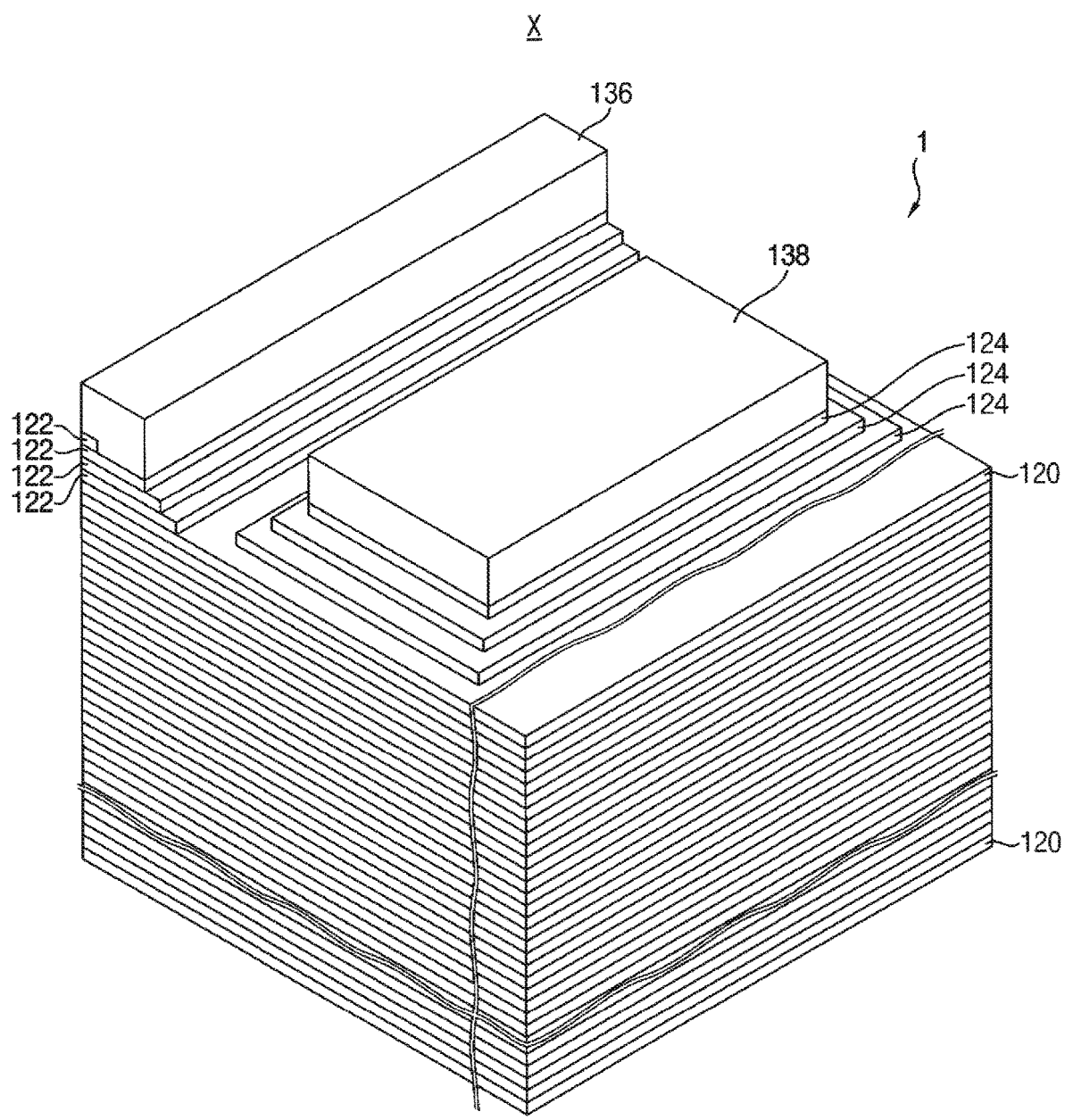

Referring to FIG. 36, processes substantially the same as or similar to those illustrated with reference to FIG. 10 may be performed.

Thus, lengths in the second direction of the first sacrificial patterns 122 at the second and third levels may be reduced, and the first sacrificial pattern 122 may be further formed at a fourth level. Additionally, areas of the second sacrificial patterns 124 at the second and third levels may be reduced, and the second sacrificial pattern 124 may be further formed at the fourth level.

Figure 37:
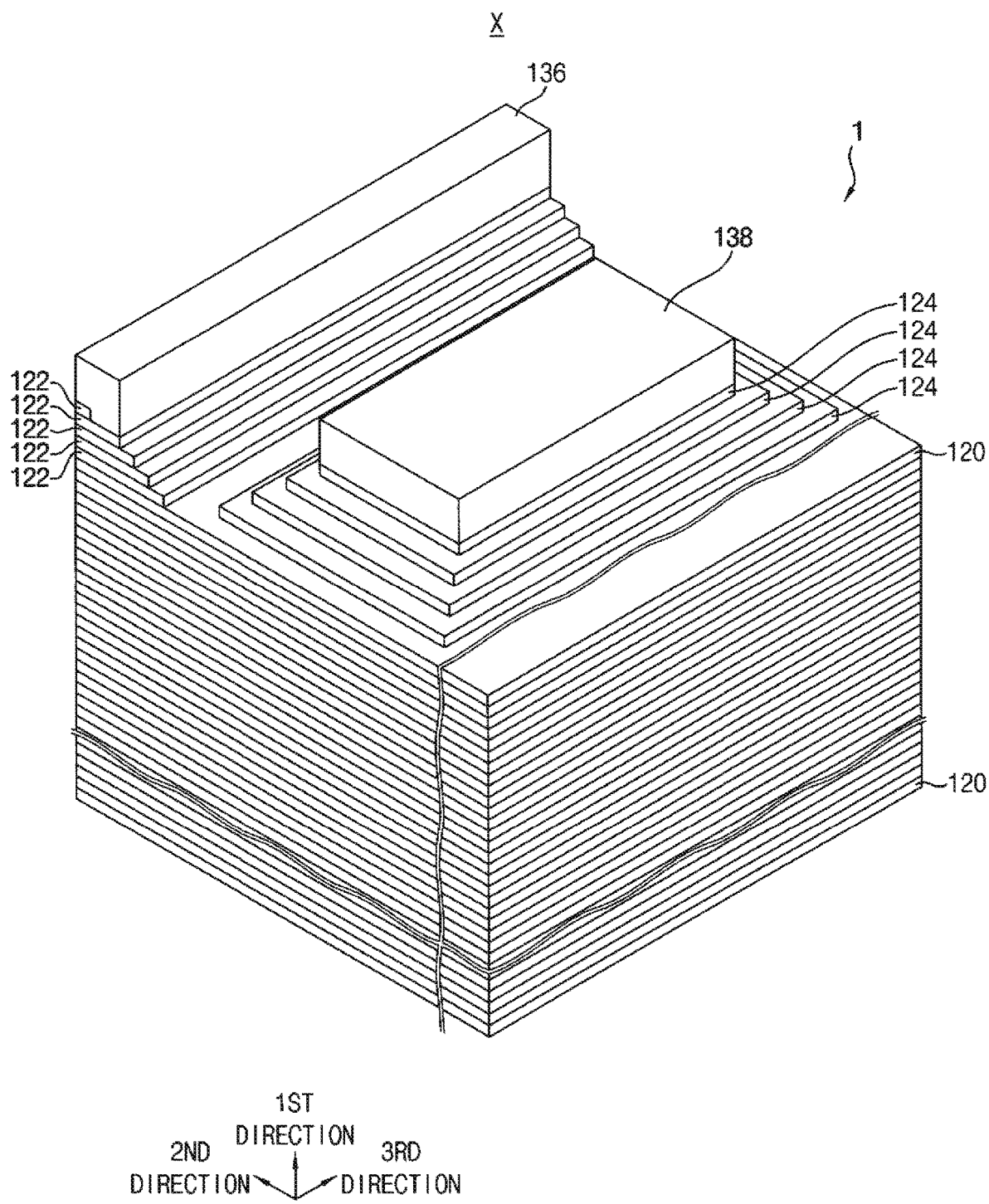

Referring to FIG. 37, processes substantially the same as or similar to those illustrated with reference to FIG. 11 may be performed.

Thus, lengths in the second direction of the first sacrificial patterns 122 at the second to fourth levels may be reduced, and the first sacrificial pattern 122 may be further formed at a fifth level. Additionally, areas of the second sacrificial patterns 124 at the second to fourth levels may be reduced, and the second sacrificial pattern 124 may be further formed at the fifth level.

Figure 38:
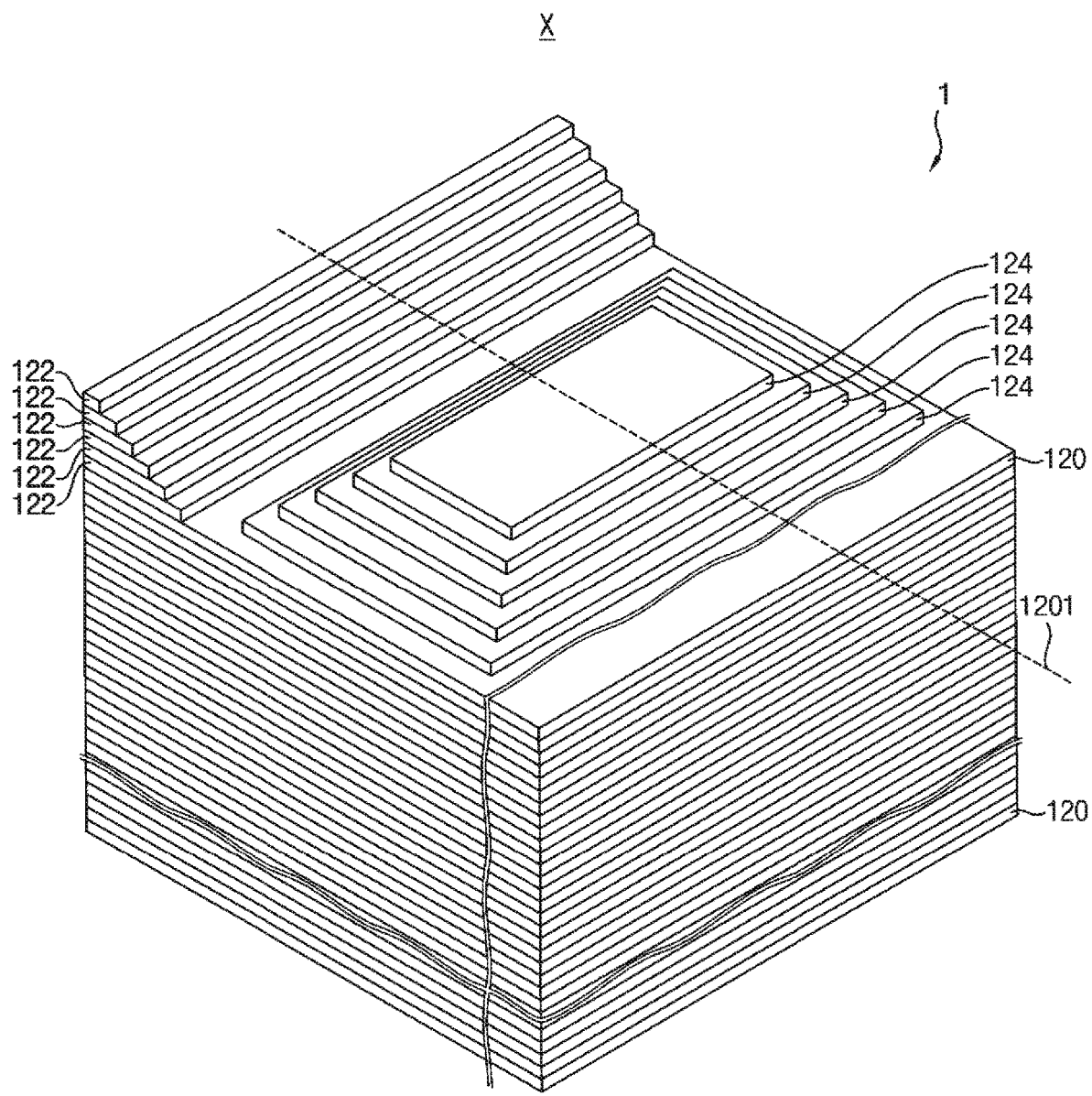
Figure 39:
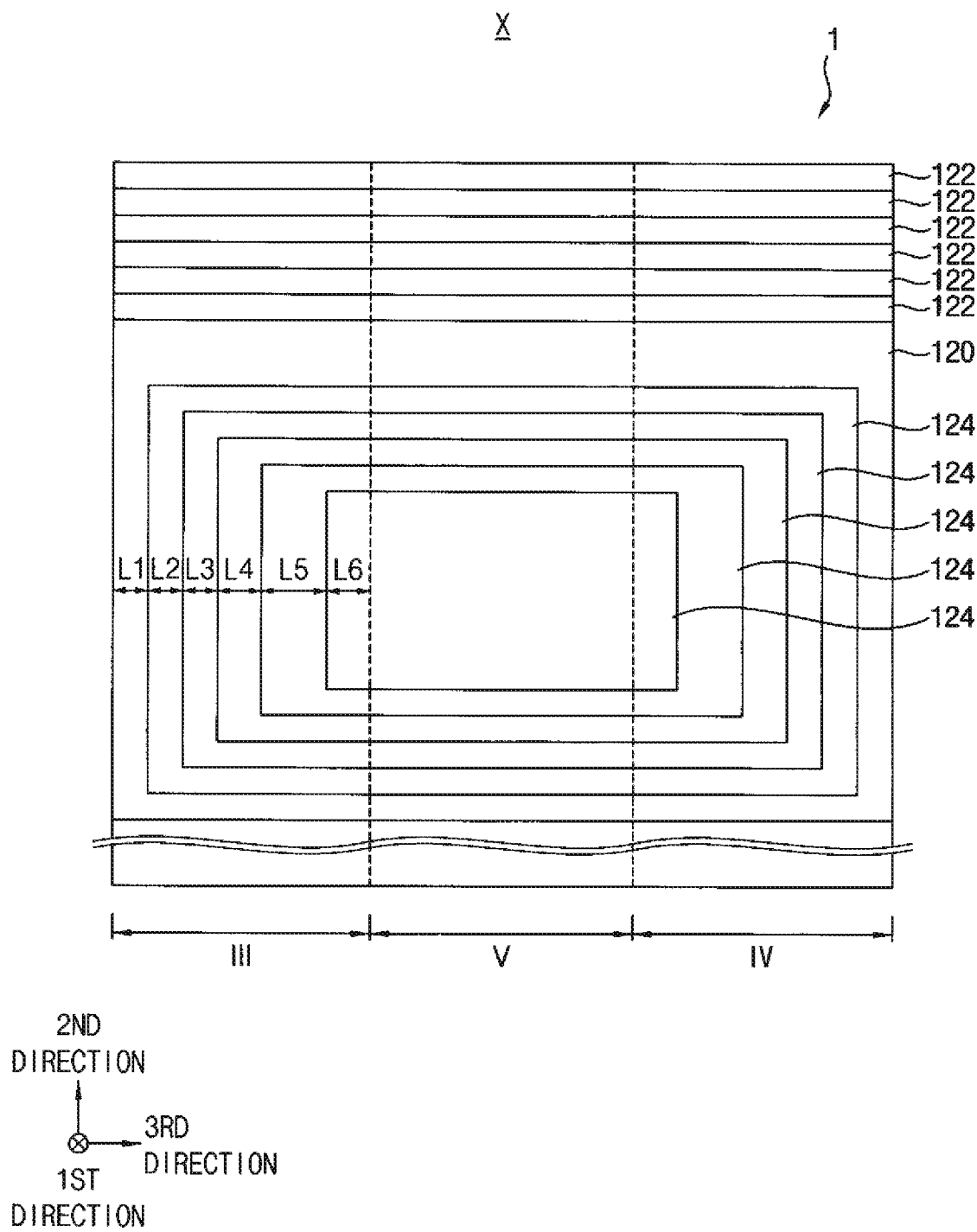

Referring to FIGS. 38 and 39, processes substantially the same as or similar to those illustrated with reference to FIGS. 12 and 13 may be performed.

Thus, lengths in the second direction of the first sacrificial patterns 122 at the second to fifth levels may be reduced, and the first sacrificial pattern 122 may be further formed at a sixth level. Additionally, areas of the second sacrificial patterns 124 at the second to fifth levels may be reduced, and the second sacrificial pattern 124 may be further formed at the sixth level.

The sixth and seventh photoresist patterns 136 and 138 may be removed.

Thus, the first sacrificial patterns 122 may be stacked at six levels, respectively, in a staircase shape on one of the sacrificial layers 120 of the upper mold layer at a seventh level, and the second sacrificial patterns 124 may be stacked at five levels, respectively, in a staircase shape to be spaced apart from the first sacrificial patterns 122, respectively, on the one of the sacrificial layers 120 of the upper mold layer at the seventh level.

In some example embodiments, the first sacrificial patterns 122 may form an eighth stair structure, and the second sacrificial patterns 124 may form ninth and tenth stair structures. However, unlike those of FIGS. 12 and 13, the ninth and tenth stair structures may not connected to but spaced apart from the eighth stair structure. The ninth stair structure may include thirty-second to thirty-seventh steps having the first to sixth lengths L1, L2, L3, L4, L5 and L6, respectively, in the third direction. Additionally, the ninth stair structure symmetric with the eighth stair structure may include thirty-eighth to forty-third steps having the first to sixth lengths L1, L2, L3, L4, L5 and L6, respectively, in the third direction.

Figure 40:
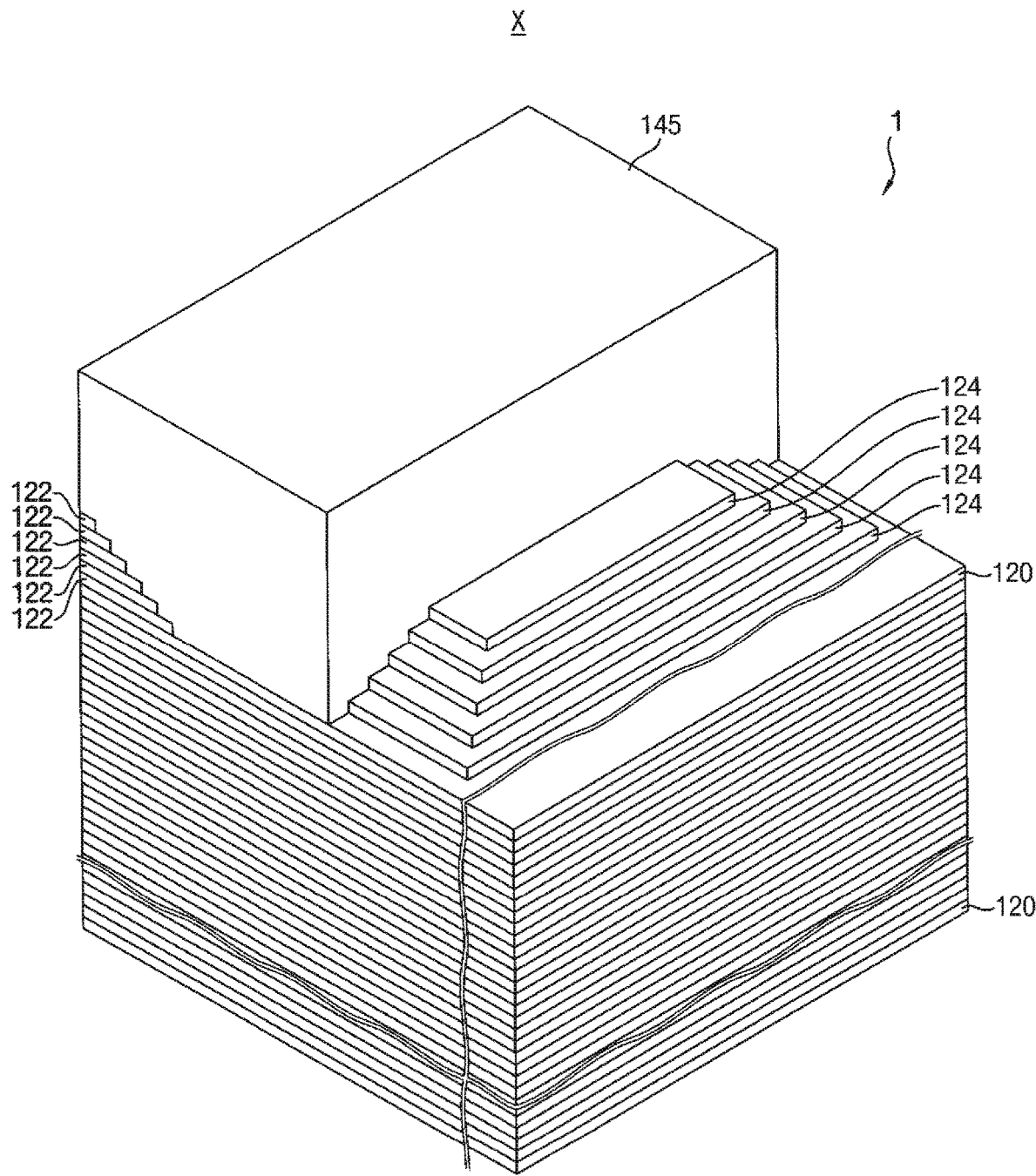

Referring to FIG. 40, processes substantially the same as or similar to those illustrated with reference to FIG. 14 may be performed.

Thus, an eighth photoresist pattern 145 may be formed on the one of the sacrificial layers 120 of the upper mold layer at the seventh level to cover the first sacrificial patterns 122 and portions of the second sacrificial patterns 124 adjacent thereto.

Figure 41:
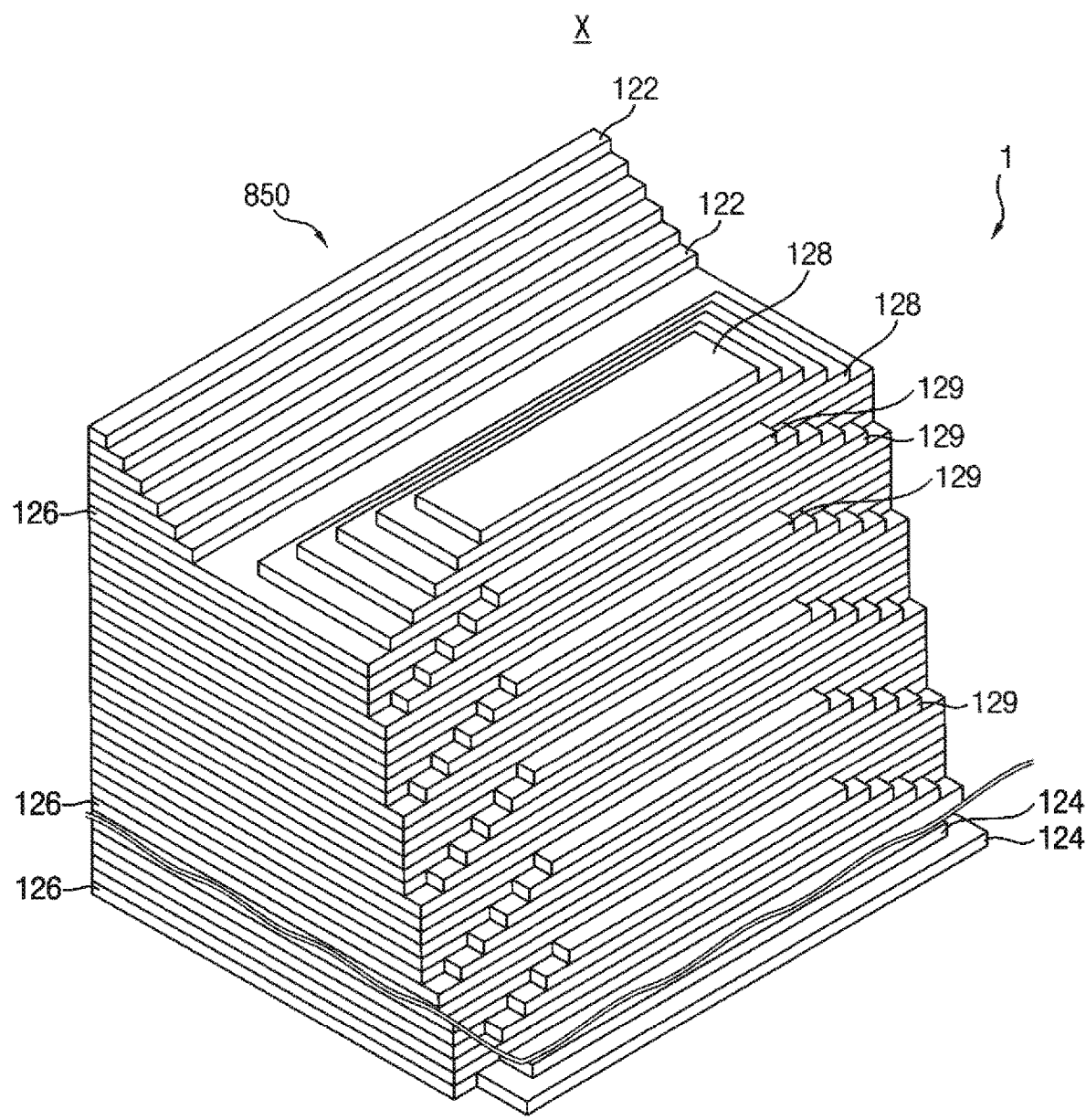
Figure 42:
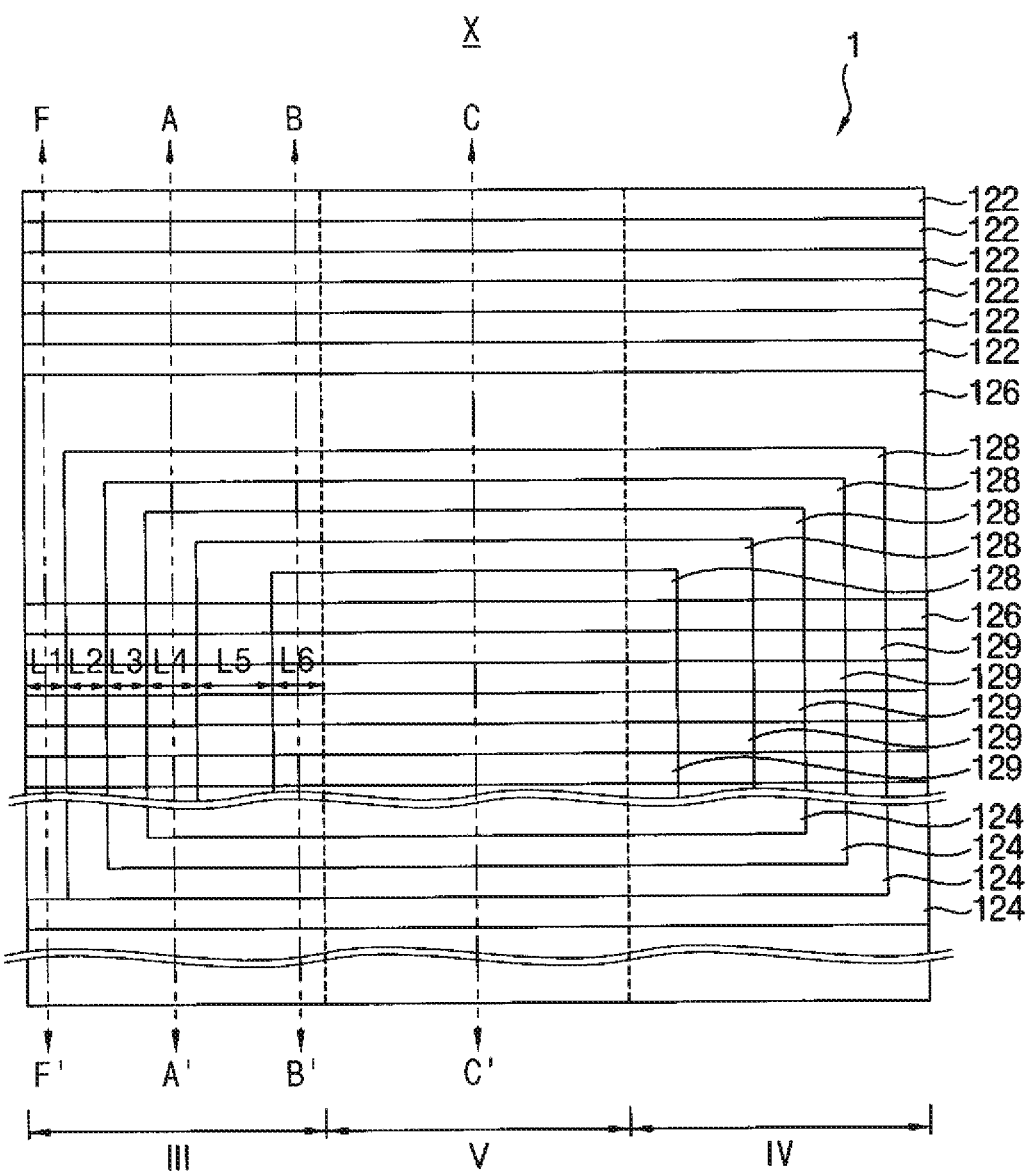

Referring to FIGS. 41 and 42, processes substantially the same as or similar to those illustrated with reference to FIGS. 15 to 23 may be performed.

Thus, stair structures each of which may include the first to fifth sacrificial patterns 122, 124, 126, 128 and 129 may be formed on the second region II of the substrate 600. The stair structures together with the insulation layers 110 and the sacrificial layers 120 remaining on the first region I of the substrate 600 may form an upper mold 850.

In some example embodiments, the first sacrificial patterns 122 may form the eighth stair structure in which step layers have lengths in the second direction gradually decreasing from a lowermost level toward an uppermost level on the third to fifth regions III, IV and V of the substrate 600, and the fourth sacrificial patterns 128 may form the ninth and tenth stair structures in which steps layers have lengths in the second direction decreasing from a lowermost level toward an uppermost level on the third and fourth regions III and IV, respectively, of the substrate 600. The ninth and tenth stair structures may not be connected to but spaced apart from the eighth stair structure.

Additionally, the third sacrificial patterns 126 may form an eleventh stair structure in which step layers have lengths in the second direction gradually decreasing from a lowermost level toward an uppermost level by a unit of several levels, e.g., six levels, the second sacrificial patterns 124 may form a twelfth stair structure in which step layers have lengths in each of the second and third directions gradually decreasing from a lowermost level toward an uppermost level, and the fifth sacrificial patterns 129 may form thirteenth and fourteenth stair structures in which step layers have lengths in the third direction gradually decreasing from a lowermost level toward an uppermost level on the third and fourth regions III and IV, respectively, of the substrate 600.

The thirteenth stair structure may include forty-fourth to forty-ninth steps sequentially stacked in the first direction from a lowermost level toward an uppermost level, which may be sequentially arranged in the third direction. The forty-fourth to forty-ninth steps may have the first to sixth lengths L1, L2, L3, L4, L5 and L6, respectively, in the third direction. The fourteenth stair structure symmetric with the thirteenth stair structure may include fiftieth to fifty-fifth steps sequentially stacked in the first direction from a lowermost level toward an uppermost level, and which may have the first to sixth lengths L1, L2, L3, L4, L5 and L6, respectively, in the third direction.

Referring to FIGS. 43 to 46 showing the lower and upper molds 800 and 850, an end portion in the second direction of a lowermost one of the second sacrificial patterns 124 of the upper mold 850 may overlap a central portion in the second direction of the fourth sacrificial patterns 128 of the lower mold 800. Thus, the end portion in the second direction of a lowermost one of the second sacrificial patterns 124 of the upper mold 850 may be disposed over and partially overlap the second and third stair structures of the lower mold 800 in the first direction, and the first stair structure of the lower mold 800 may be overlapped with the upper mold 850 in the first direction.

Figure 47:
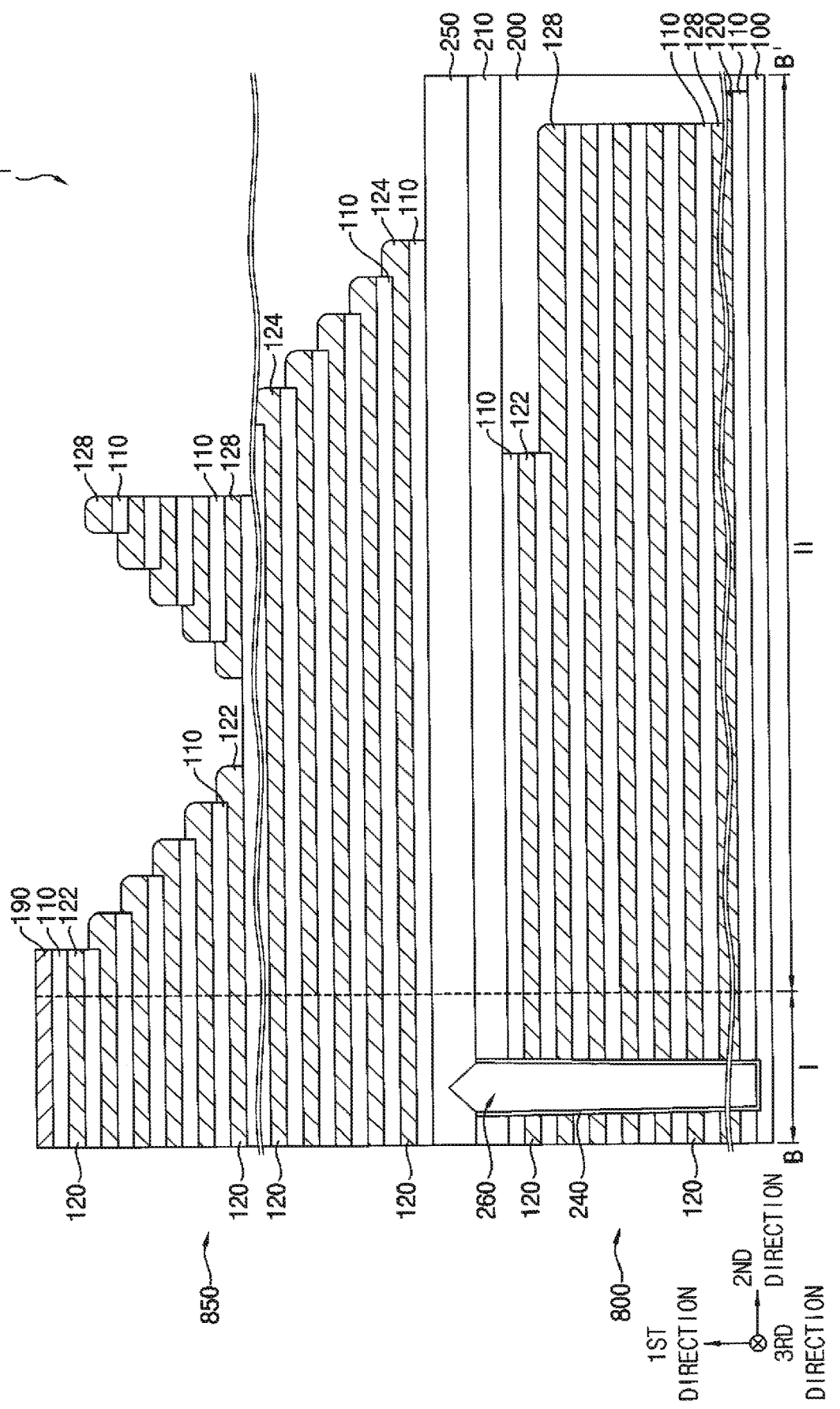

Referring to FIG. 47, processes substantially the same as or similar to illustrated with reference to FIG. 24 may be performed.

Thus, thicknesses of end portions in the second direction or the third direction of ones of the first to fifth sacrificial patterns 122, 124, 126, 128 and 129 of the upper mold 850 on the second region II of the substrate 600 may be increased.

Figure 48:
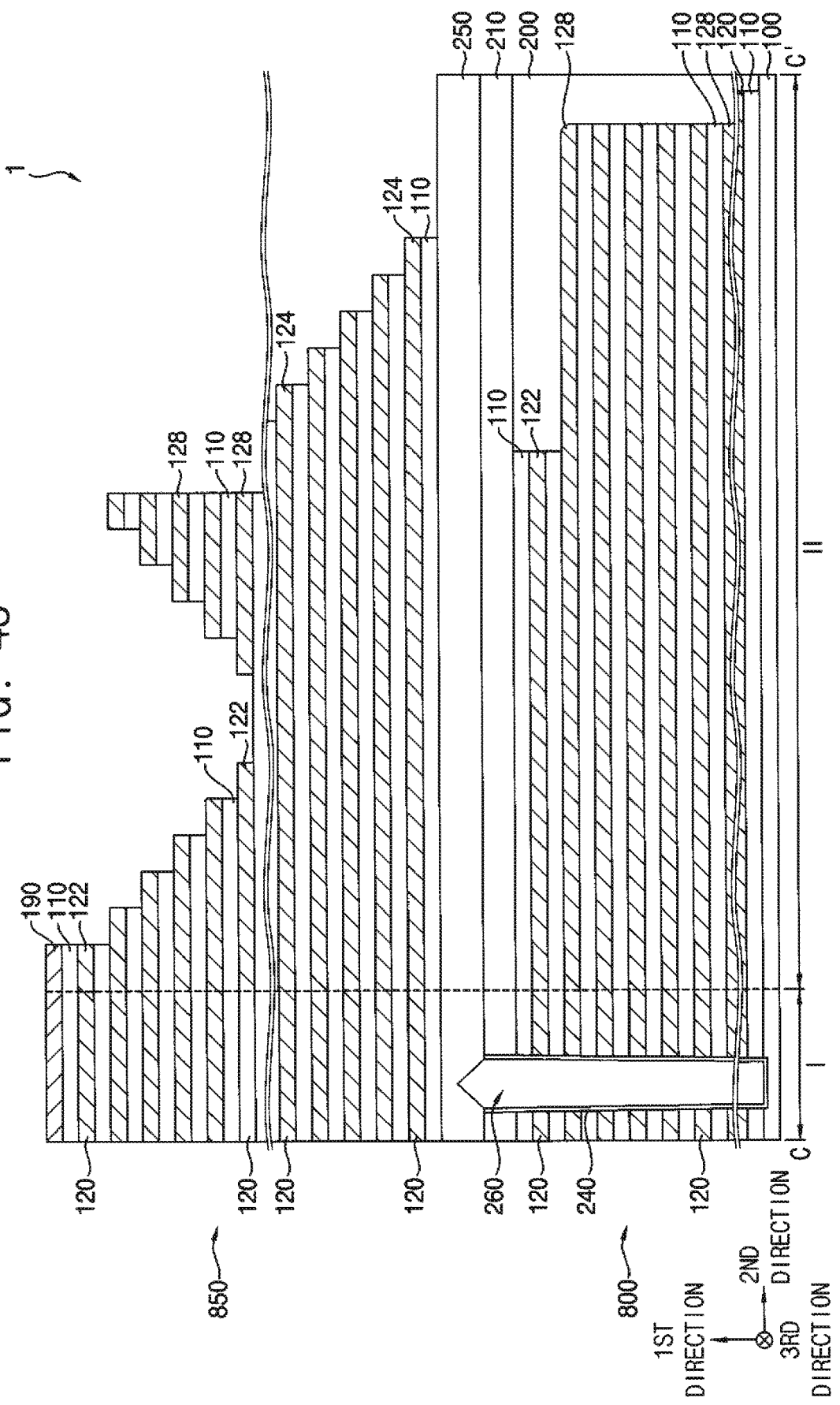

Referring to FIG. 48, processes substantially the same as or similar to illustrated with reference to FIGS. 25 and 26 may be performed.

Thus, the thicknesses of the end portions of ones of the first to fifth sacrificial patterns 122, 124, 126, 128 and 129 of the upper mold 850 on the fifth region V of the substrate 600 and the lowermost one of the sacrificial layers 120 of the upper mold 850 may be decreased.

Figure 49:
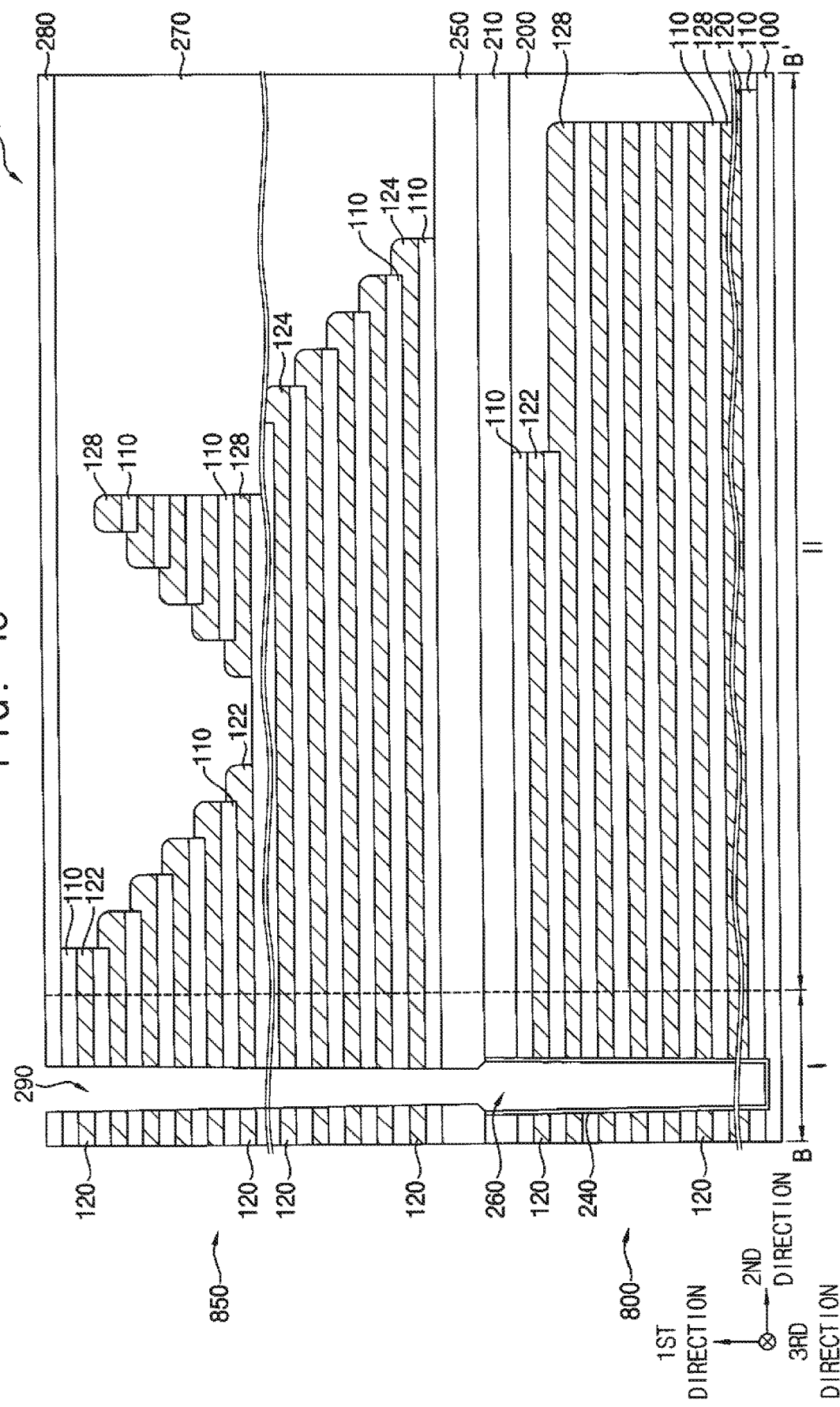

Referring to FIG. 49, processes substantially the same as or similar to illustrated with reference to FIGS. 27 to 29 may be performed.

Thus, a third insulating interlayer 270 may be formed on the connecting layer 250 to cover the upper mold 850, and may be planarized until an upper surface of an uppermost one of the insulation layers 110 of the upper mold 850 may be exposed. By the planarization process, the etch stop layer 190 may be removed.

A fourth insulating interlayer 280 may be formed on the upper mold 850 and the third insulating interlayer 270, and the fourth insulating interlayer 280, the insulation layers 110 and the sacrificial layers 120 of the upper mold 850, and the connecting layer 250 may be etched to form a second channel hole 290 therethrough exposing the first gap 260. In some example embodiments, a plurality of second channel holes 290 may be formed in each of the second and third directions to correspond to the first gap 260, that is, the first channel holes 230, respectively.

Figure 50:
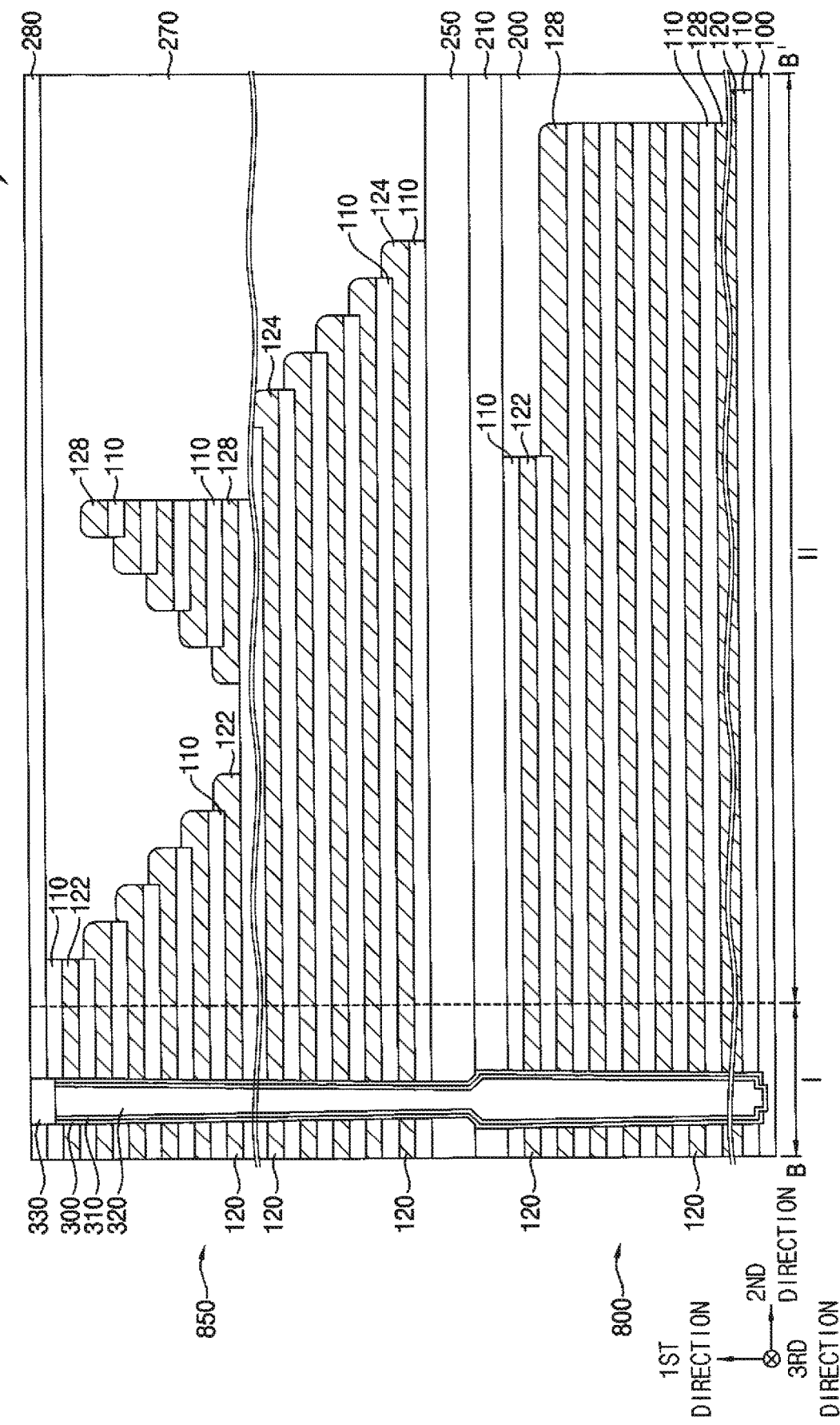

Referring to FIG. 50, the barrier pattern 240 may be removed to expose the sidewall of the first gap 260 and the upper surface of the base pattern 100, a charge storage structure layer and a first spacer layer (not shown) may be sequentially stacked on the exposed upper surface of the base pattern 100, the sidewalls of the first gap 260 and the second channel hole 290, and an upper surface of the fourth insulating interlayer 280, the first spacer layer may be anisotropically etched to form a first spacer (not shown) on the sidewalls of the first gap 260 and the second channel hole 290, and the charge storage structure layer may be etched using the first spacer as an etching mask to form a charge storage structure 300 having a cup-like shape of which a bottom is opened on the upper surface of the base pattern 100 and the sidewalls of the first gap 260 and the second channel hole 290. The charge storage structure 300 may include a first blocking pattern, a charge storage pattern and a tunnel insulation pattern sequentially stacked.

The first spacer and the charge storage pattern may include a nitride, e.g., silicon nitride, and the tunnel insulation pattern and the first blocking pattern may include an oxide, e.g., silicon oxide.

After removing the first spacer, a channel layer may be formed on the exposed base pattern 100, the charge storage structure 300 and the fourth insulating interlayer 280, and a filling layer may be formed on the channel layer to fill a remaining portion of the first gap 260 and the second channel hole 290. The filling layer and the channel layer may be planarized until the upper surface of the fourth insulating interlayer 280 may be exposed to form a filling pattern 320, and the channel layer may be transformed into a channel 310. The filling pattern 320 may include an oxide, e.g., silicon oxide.

An upper portion of a first structure including the filling pattern 320, the channel 310 and the charge storage structure 300 may be removed to form a trench, and a capping pattern 330 may be formed to fill the trench. The channel 310 and the capping pattern 330 may include polysilicon or single crystalline silicon that is not doped or lightly doped with impurities.

Figure 51:
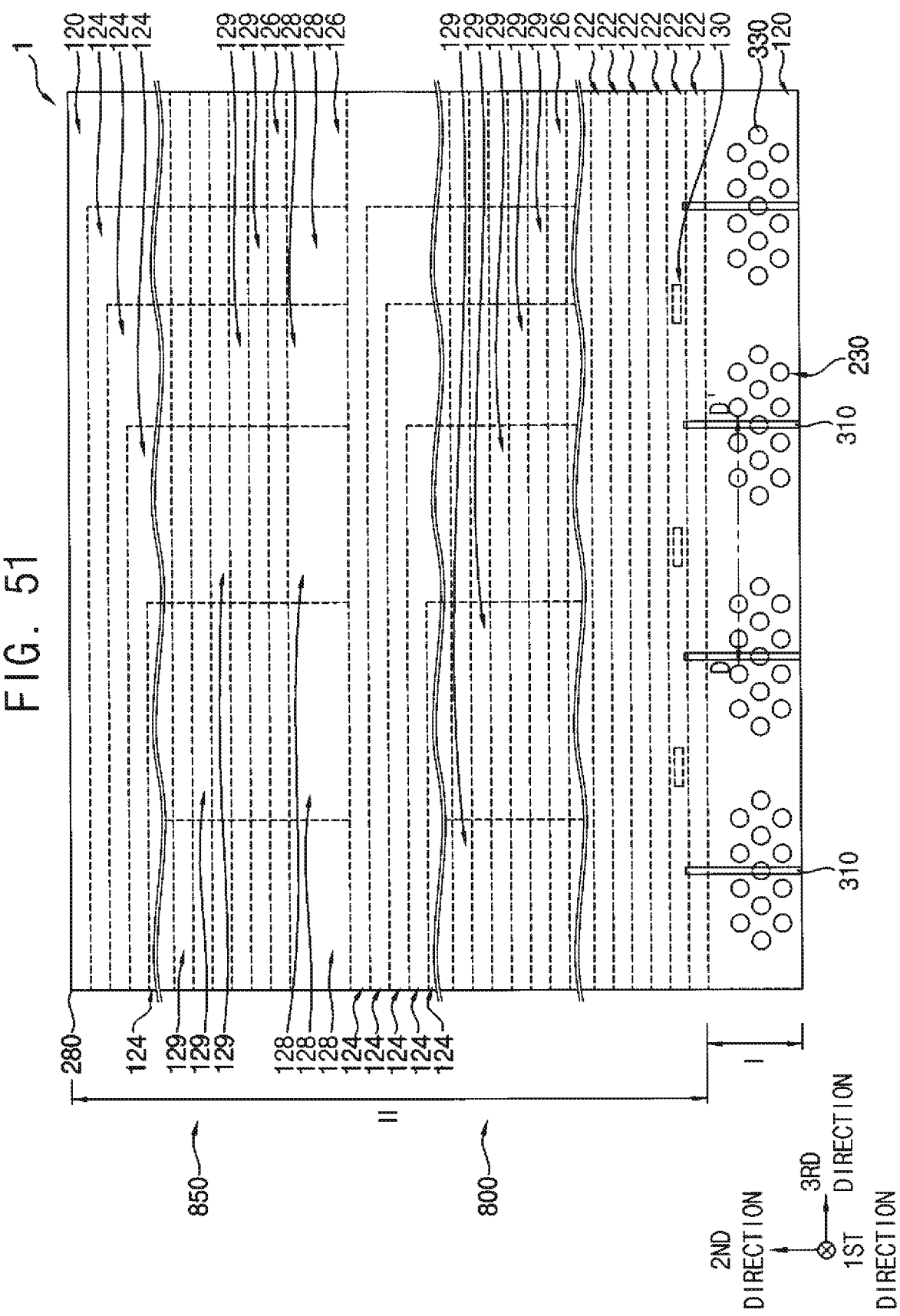

In some example embodiments, a plurality of channels 310 may be formed in each of the second and third directions to form a channel array. The channel array may include a plurality of channel groups spaced apart from each other ("isolated from direct contact with each other") in the third direction, and each of the channel groups may include a plurality of channel columns spaced apart from each other ("isolated from direct contact with each other") in the third direction. Each of the channel columns may include a plurality of channels 310 arranged in the second direction. FIG. 51 shows a channel array including four channel groups on a region Y.

Figure 52:
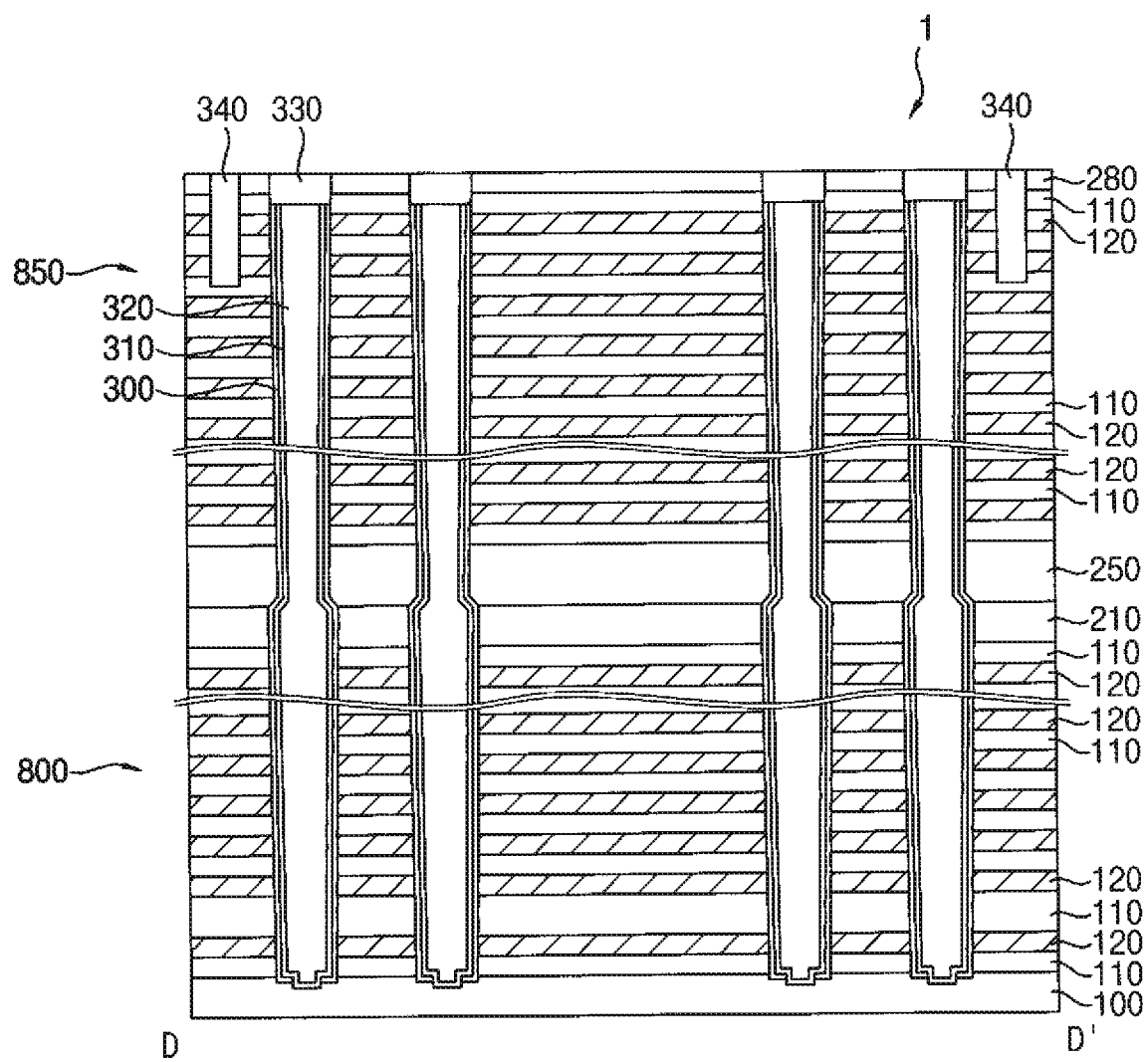

Referring to FIGS. 51 and 52, a second division pattern 340 may be formed through ones of the sacrificial layers 120 and the insulation layers 110 of the upper mold 850 on the first region I of the substrate 600 and a portion of the second region II of the substrate 600 adjacent thereto.

The second division pattern 340 may be formed by forming a third etching mask (not shown) on the fourth insulating interlayer 280, etching the fourth insulating interlayer 280, ones of the insulation layers 110 and the sacrificial layers 120 of the upper mold 850 using the third etching mask to form a third opening therethrough, and filling the third opening with an insulating material. In some example embodiments, the second division pattern 340 may extend through an upper portion of the channel 310 included in a channel column that may be disposed at a central portion in each channel group in the third direction.

In some example embodiments, the second division pattern 340 may extend not only through the upper portion of the channel 310 but also through the fourth insulating interlayer 280, ones of the sacrificial layers 120 at upper two levels, and ones of the insulation layers 110 at upper two levels, and further through a portion of one of the insulation layer 110 at a third level from above in the upper mold 850. The second division pattern 340 may extend in the second direction not only on the first region I of the substrate 600 but also on the second region II of the substrate 600 so as to penetrate through upper two step layers of the eighth stair structure. Accordingly, the sacrificial layers 120 and the first sacrificial patterns 122 at upper two levels in the upper mold 850 may be divided in the third direction by the second division pattern 340.

Figure 53:
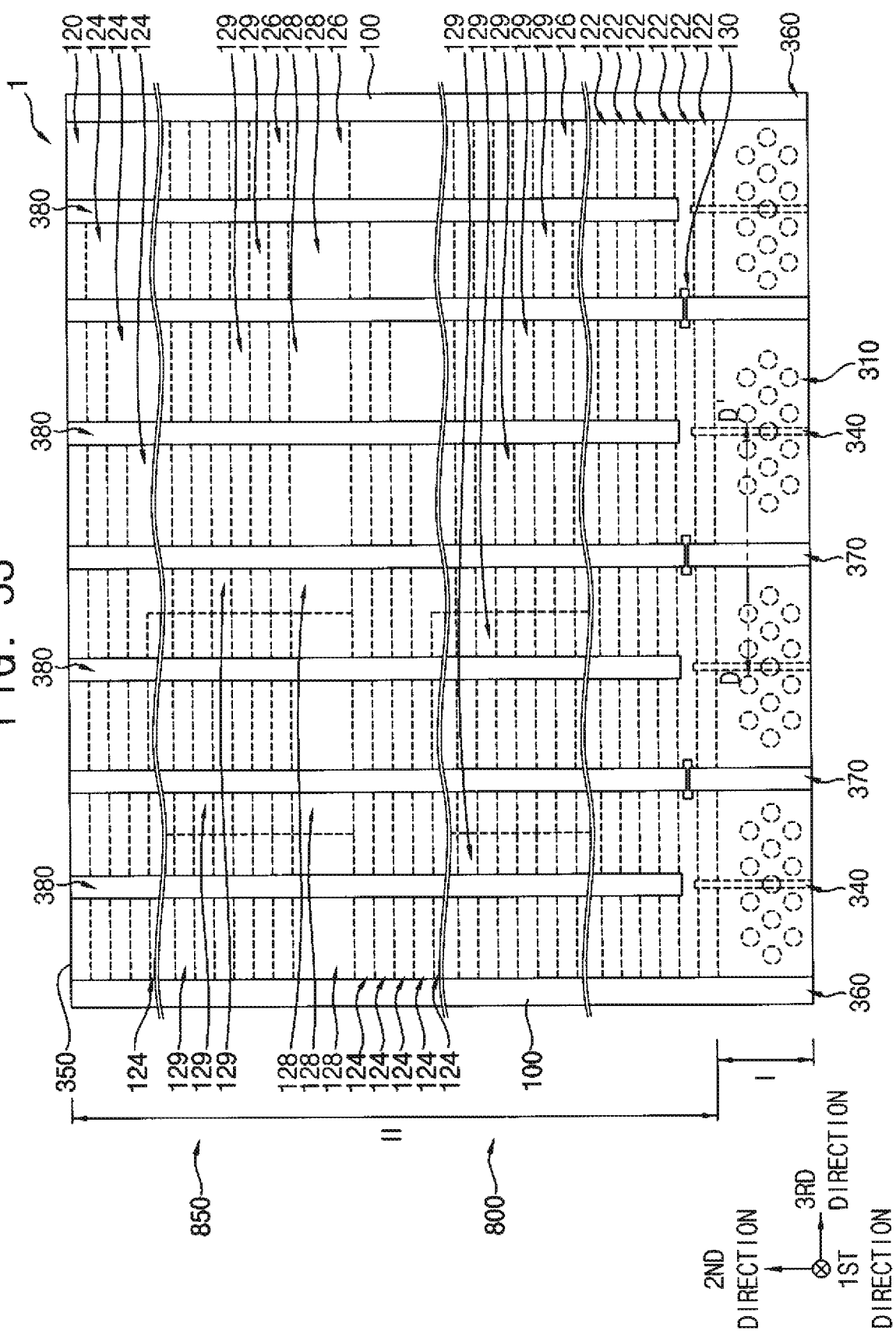
Figure 54:
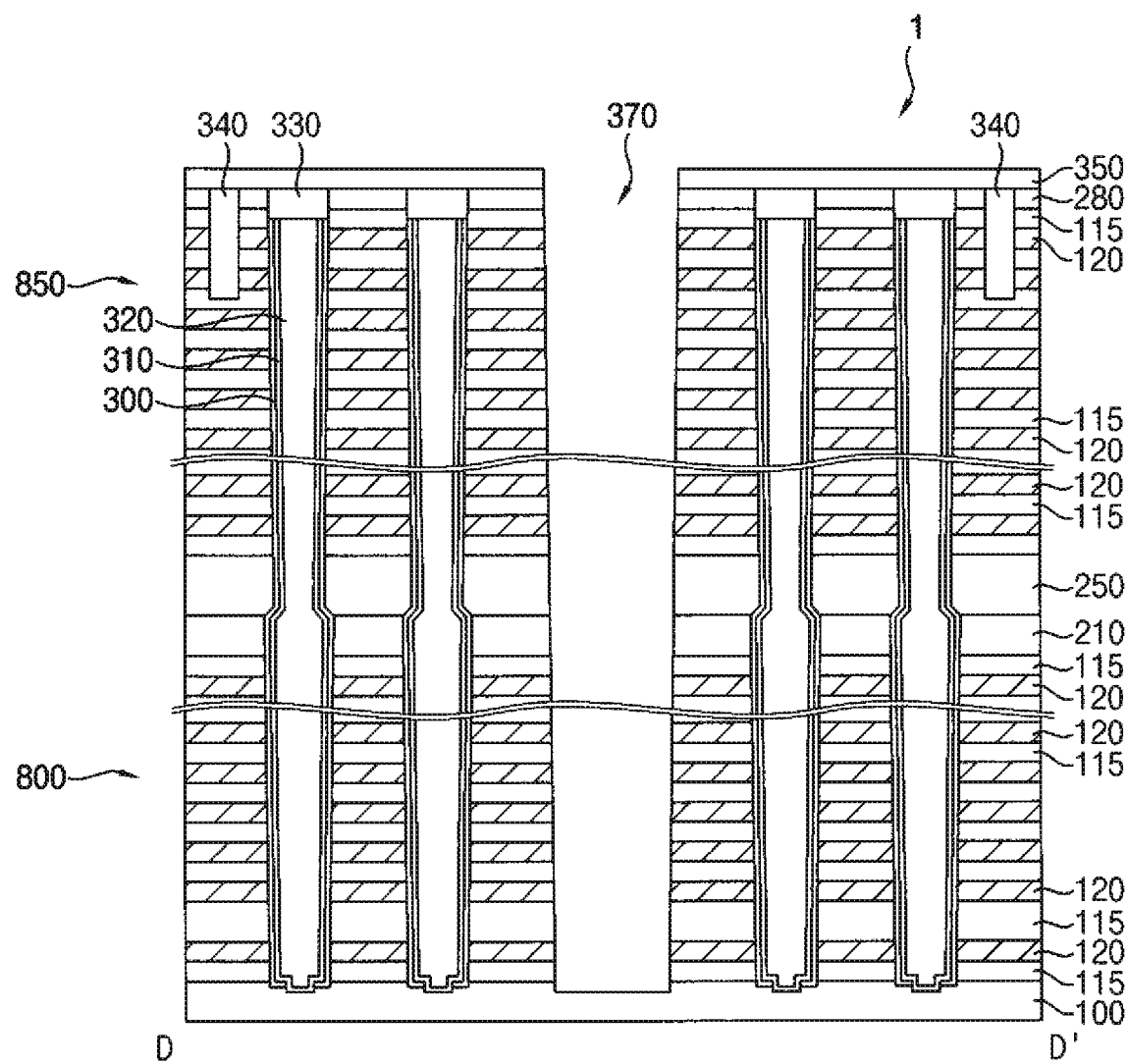

Referring to FIGS. 53 and 54, a fifth insulating interlayer 350 may be formed on the fourth insulating interlayer 280, the capping pattern 330 and the second division pattern 340, a fourth etching mask (not shown) may be formed on the fifth insulating interlayer 350, and the fourth and fifth insulating interlayers 280 and 350, the insulation layers 110 and the sacrificial layers 120 of the lower and upper molds 800 and 850 may be etched using the fourth etching mask to form fourth and fifth openings 360 and 370 therethrough exposing the upper surface of the base pattern 100.

In some example embodiments, each of the fourth and fifth openings 360 and 370 may extend in the second direction between the channel groups on the first and second regions I and II of the substrate 600, and a plurality of fourth openings 360 and a plurality of fifth openings 370 may be formed in the third direction. That is, one channel group may be disposed between neighboring ones of the fourth and fifth openings 360 and 370 in the third direction.

As the fourth and fifth openings 360 and 370 are formed, the sacrificial layer 120 may be divided into a plurality of pieces each of which may extend in the second direction, and the insulation layer 110 may be transformed into insulation patterns 115 each of which may extend in the second direction.

In some example embodiments, the fourth opening 360 may continuously extend on the first and second regions I and II of the substrate 600, however, the fifth opening 370 may be blocked on the second region II of the substrate 600. Thus, the sacrificial layers 120 extending in the second direction at each of opposite sides of the fifth opening 370 in the third direction may be connected with each other on the second region II of the substrate 600. In some example embodiments, a connecting portion that may connect the sacrificial layers 120 with each other may overlap in the first direction one of the first sacrificial patterns 122 at the third level included in the eighth stair structure and the first division pattern 130.

In some example embodiments, the fourth opening 360 may overlap each of opposite edges of the region X, and thus four channel groups may be disposed between neighboring ones of the fourth openings 360 in the third direction. Additionally, the fifth opening 370 may be formed between the channel groups in the region X, and thus one channel group may be formed between neighboring ones of the fifth openings 370 in the third direction. As a result, four sacrificial layers 120 each extending in the second direction in the region X may be connected with each other by the connecting portions. However, ones of the sacrificial layers 120 at a lowermost level may be divided from each other by the first division pattern 130.

In some example embodiments, when the fourth and fifth openings 360 and 370 are formed, a sixth opening 380 may be also formed to extend through the fourth and fifth insulating interlayers 280 and 350, the insulation layers 110 of the lower and upper molds 800 and 850, and the first to fifth sacrificial patterns 122, 124, 126, 128 and 129 to expose the upper surface of the base pattern 100.

The sixth opening 380 may extend in the second direction on the second region II of the substrate 600 to divide each of the first to fifth sacrificial patterns 122, 124, 126, 128 and 129 in the third direction. In a plan view, the sixth opening 380 may extend from one of the first sacrificial patterns 122 included in the eighth stair structure to an end of the second region II of the substrate 500.

Figure 55:
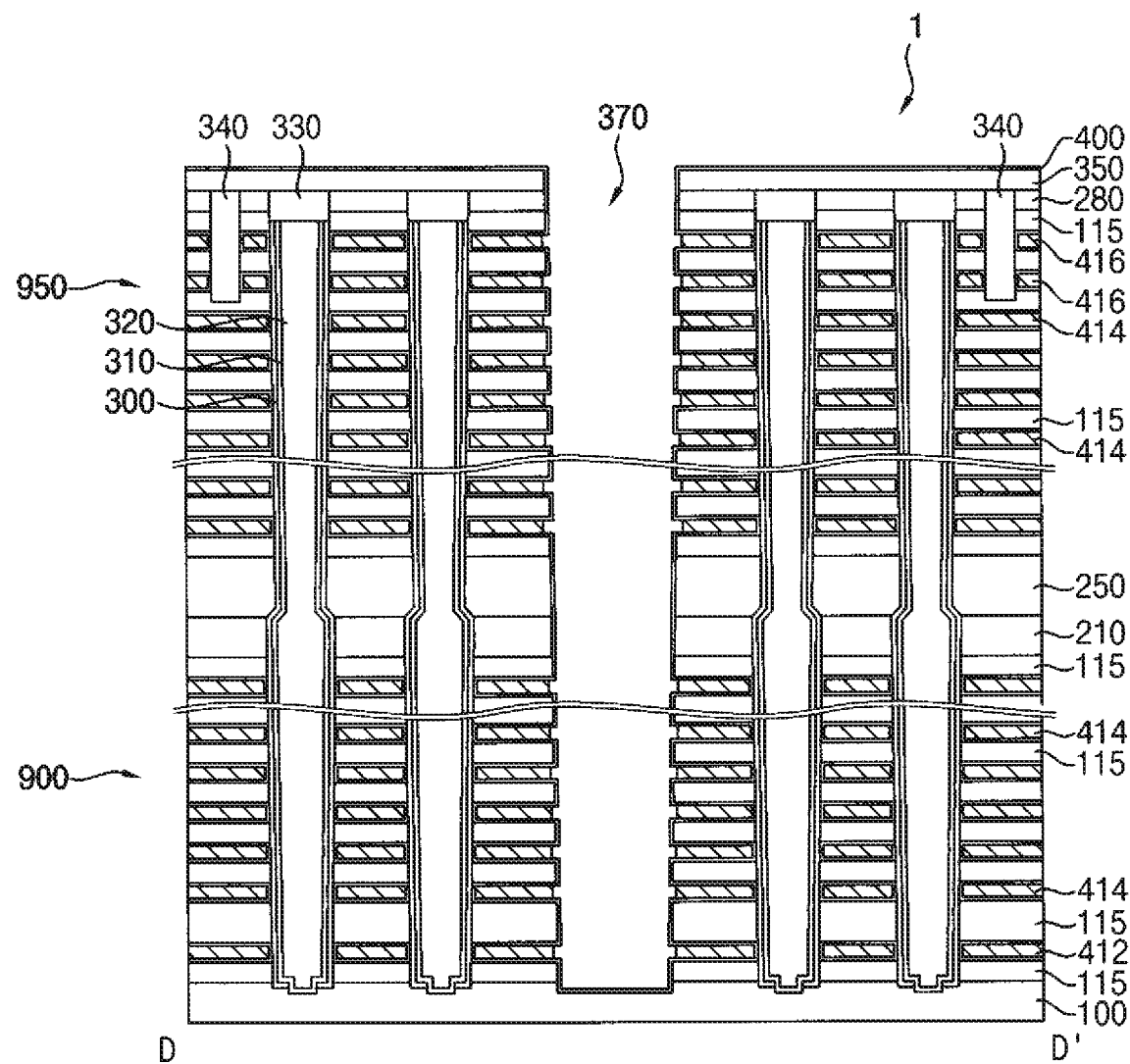
Figure 56:
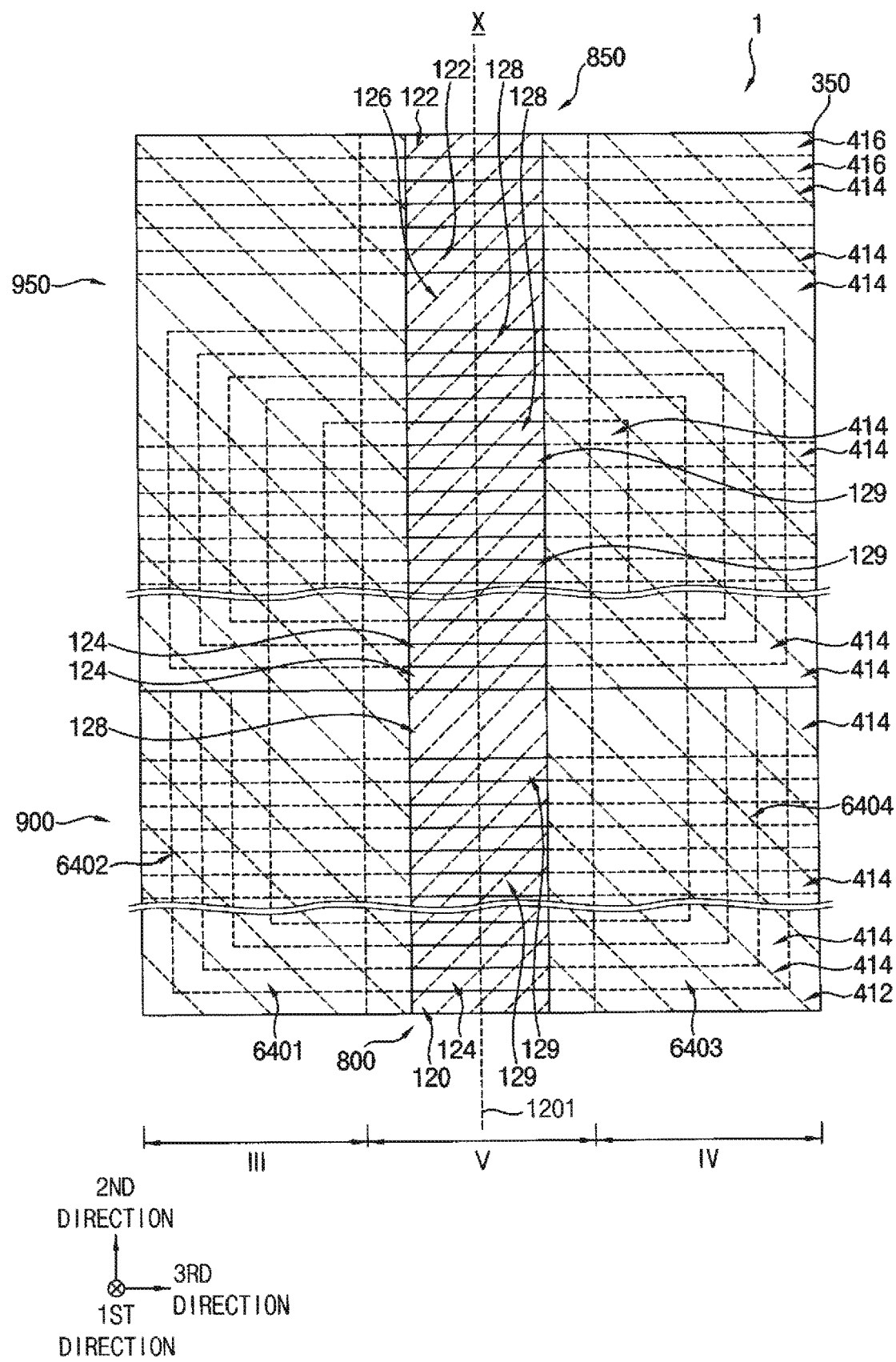

Referring to FIGS. 55 and 56, after removing the fourth etching mask, the sacrificial layers 120 and the first to fifth sacrificial patterns 122, 124, 126, 128 and 129 of the lower and upper molds 800 and 850 exposed by the fourth to sixth openings 360, 370 and 380 may be removed to form a second gap between neighboring ones of the insulation patterns 115 in of the lower and upper molds 800 and 850 the first direction, and a portion of a sidewall of the second division pattern 340 and a portion of an outer sidewall of the charge storage structure 300 may be exposed.

A second blocking layer 400 may be formed on the exposed portion of the sidewall of the second division pattern 340, the exposed portion of the outer sidewall of the charge storage structure 300, an inner wall of the second gap, surfaces of the insulation patterns 115, the upper surface of the base pattern 100, and an upper surface of the fifth insulating interlayer 350, and a gate conductive layer may be formed on the second blocking layer 400 to fill a remaining portion of the second gap. A gate barrier layer (not shown) may be further formed between the second blocking layer 400 and the gate conductive layer.

The second blocking layer 400 may include a metal oxide, e.g., aluminum oxide, the gate conductive layer may include a metal, e.g., tungsten, and the gate barrier layer may include a metal nitride, e.g., titanium nitride, tantalum nitride, etc.

The gate conductive layer may be partially removed to form a gate conductive pattern in the second gap, and when the gate barrier layer is formed, the gate barrier layer may be partially removed to form a gate barrier pattern (not shown). The gate conductive pattern and the gate barrier pattern may form a gate electrode.

In some example embodiments, the gate electrode may extend in the second direction, and a plurality of gate electrodes may be formed in the first direction. Additionally, a plurality of gate electrodes may be also formed in the third direction. That is, the gate electrodes may be spaced apart from each other ("isolated from direct contact with each other") in the third direction by the fourth opening 360. Additionally, each gate electrode may be divided into pieces in the third direction by the fifth opening 370, which may be connected to each other by the connecting portion that may be formed on the second region II of the substrate 600 to overlap the first division pattern 130. Each of the gate electrodes extending in the second direction on the second region II of the substrate 600 except ones at upper two levels may be also divided in the third direction by the sixth opening 380.

The gate electrode (e.g., a plurality of gate electrodes of a vertical memory device 1) may include first to third gate electrodes 412, 414 and 416 sequentially stacked in the first direction. In some example embodiments, the first gate electrode 412 may be formed at a lowermost level, the third gate electrode 416 may be formed at upper two levels, and the second gate electrode 414 may be formed at a plurality levels between the first and third gate electrodes 412 and 416.

The gate electrodes may be formed by replacing the first to fifth sacrificial patterns 122, 124, 126, 128 and 129 of the first to fourteenth stair structures on the second region II of the substrate 600, and thus the first to fourteenth stair structures may include the gate electrodes instead of the sacrificial patterns, hereinafter. That is, the stair structure may be referred to as a structure including step layers each of which may consist of the gate electrode and the insulation pattern 115 thereon forming a pair together. An end portion of the gate electrode (e.g., any one of gate electrodes 412, 414, 416) in the second direction together with a portion of the insulation pattern 115 thereon may be referred to as a step, which may have the same name as that of the sacrificial pattern previously illustrated. The lower and upper molds 800 and 850 including the first to fifth sacrificial patterns 122, 124, 126, 128 and 129 may be converted into lower and upper molds 900 and 950, respectively, including the gate electrodes.

As illustrated above, the end portions of the first to fifth sacrificial patterns 122, 124, 126, 128 and 129 on the fifth region V of the substrate 600 may have thicknesses smaller than those of the end portions of the first to fifth sacrificial patterns 122, 124, 126, 128 and 129 on the third and fourth regions III and IV of the substrate 600. Thus, when the second gap is formed by removing the sacrificial layers 120 and the first to fifth sacrificial patterns 122, 124, 126, 128 and 129 exposed by the fourth to sixth openings 360, 370 and 380, the removal ratio of the first to fifth sacrificial patterns 122, 124, 126, 128 and 129 on the fifth region V of the substrate 600 may be less than that of the first to fifth sacrificial patterns 122, 124, 126, 128 and 129 on the third and fourth regions III and IV of the substrate 600, which may not be entirely removed but remain. As shown in FIG. 56, both edge portions of the first to fifth sacrificial patterns 122, 124, 126, 128 and 129 on the fifth region V of the substrate 600 may be removed to be replaced with the gate electrodes, however, central portions thereof may not be removed to remain as the lower and upper molds 800 and 850.

Figure 57:
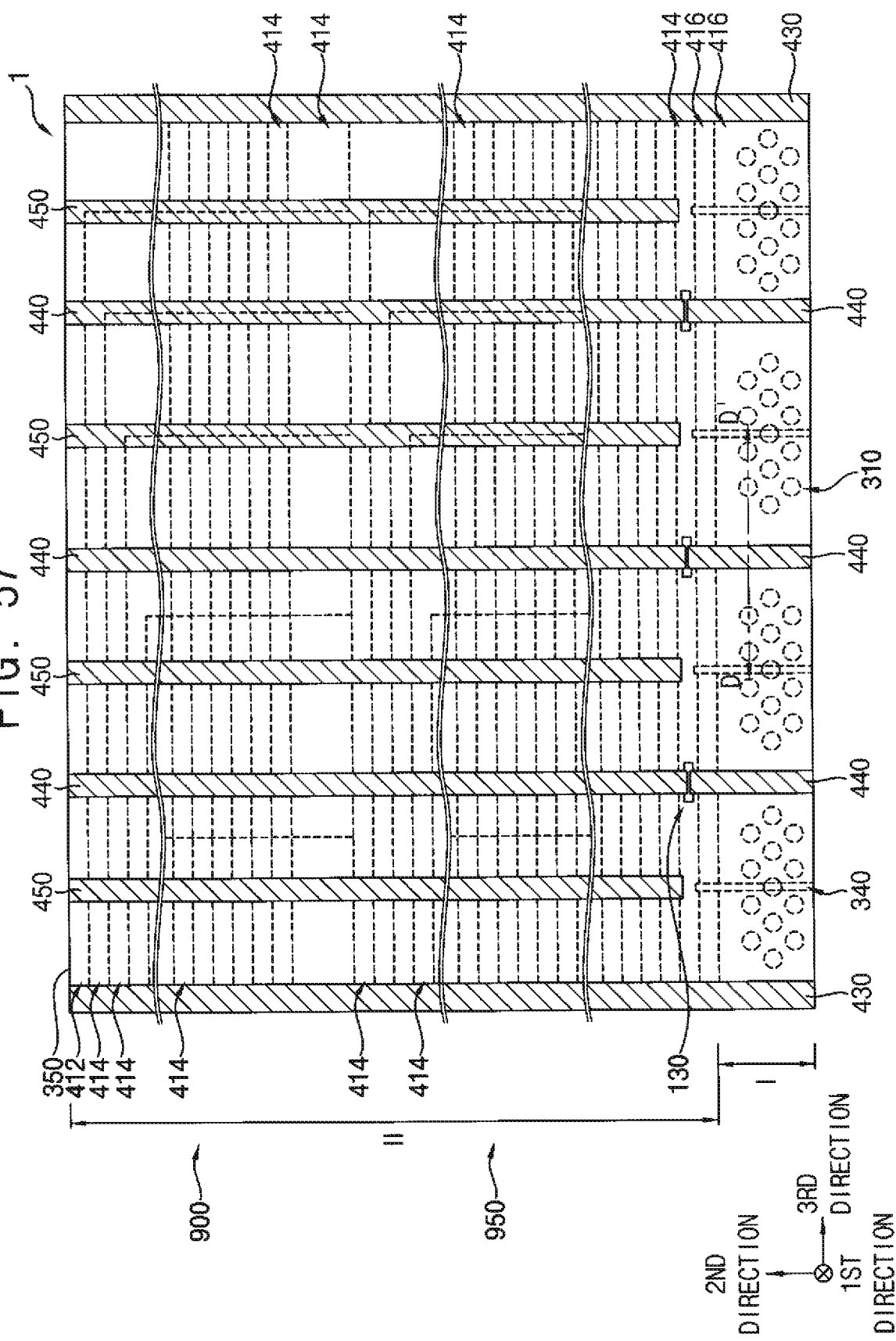
Figure 58:
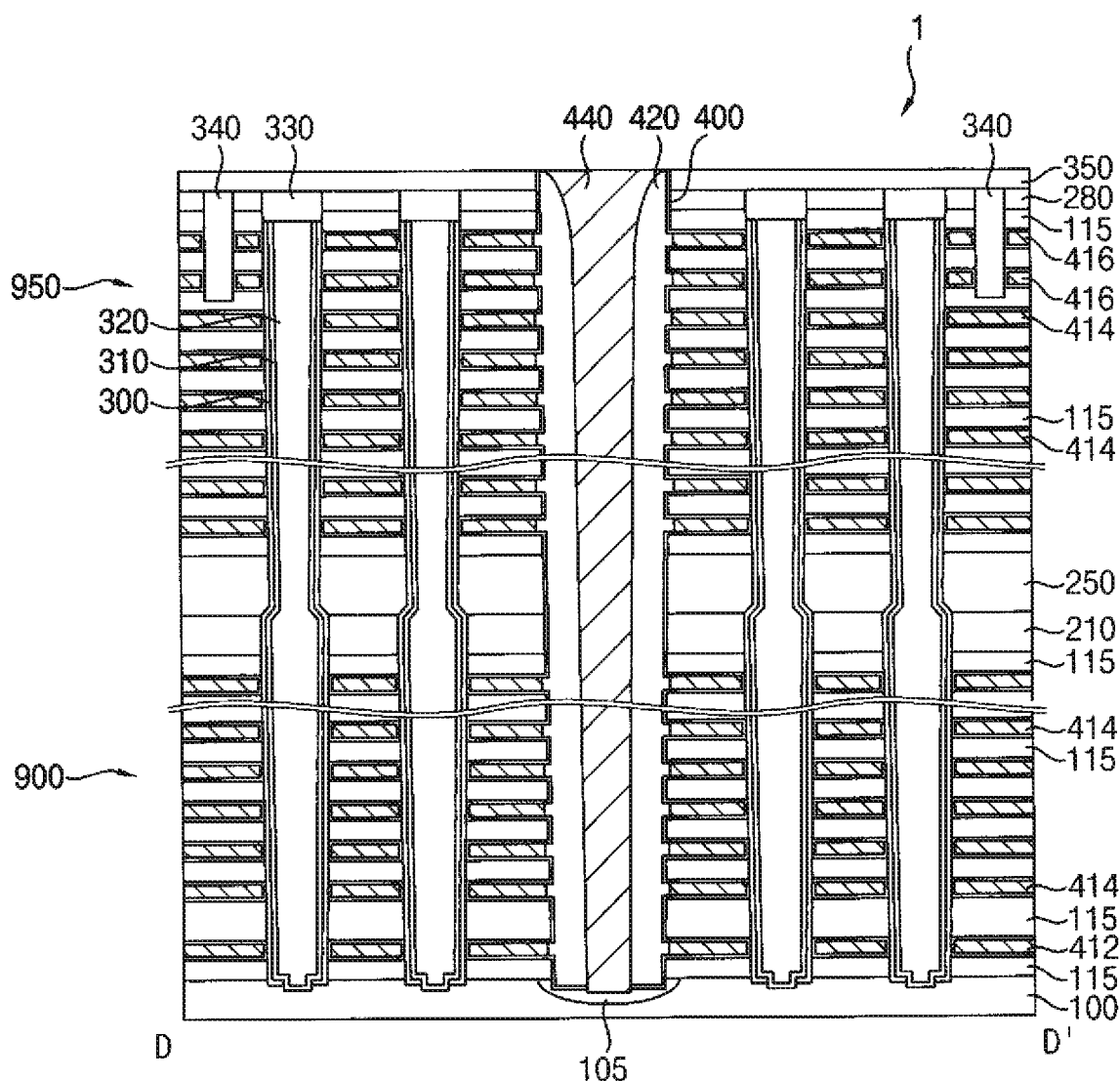

Referring to FIGS. 57 and 58, impurities may be implanted into upper portions of the base pattern 100 exposed by the fourth and fifth openings 360 and 370 to form a second impurity region 105.

A second spacer layer may be formed on the upper surface of the base pattern 100 exposed by the fourth to sixth openings 360, 370 and 380, sidewalls of the fourth to sixth openings 360, 370 and 380, and the upper surface of the fifth insulating interlayer 350, and may be anisotropically etched to form a second spacer 420 on each of the sidewalls of the fourth to sixth openings 360, 370 and 380.

First and second common source lines (CSLs) 430 and 440 may be formed in the fourth and fifth openings 360 and 370, respectively, on the second impurity region 105, and a third division pattern 450 may be formed in the sixth opening 380 on the base pattern 100.

In some example embodiments, a conductive layer may be formed on the exposed upper surface of the base pattern 100, the second spacer 420 and the fifth insulating interlayer 350 to fill the fourth to sixth openings 360, 370 and 380, and may be planarized until the upper surface of the fifth insulating interlayer 350 may be exposed to form the first and second CSLs 430 and 440 and the third division pattern 450. During the planarization process, a portion of the second blocking layer 400 on the fifth insulating interlayer 350 may be also removed. The first and second CSLs 430 and 440 may be formed in the fourth and fifth openings 360 and 370, respectively, to contact an upper surface of the second impurity region 105.

Referring to FIGS. 59 to 64, after forming a sixth insulating interlayer 460 on the fifth insulating interlayer 350, the first and second CSLs 430 and 440, the third division pattern 450, the second spacer 420, and the second blocking layer 400, contact plugs 470 may be formed through one or ones of the first to sixth insulating interlayers 200, 210, 270, 280, 350 and 460 and the connecting layer 250, the insulation patterns 115 and the second blocking layer 400 on the third and fourth regions III and IV of the substrate 600 to contact upper surfaces of the first to third gate electrodes 412, 414 and 416, and through vias 480 may be formed through one or ones of the first to sixth insulating interlayers 200, 210, 270, 280, 350 and 460 and the connecting layer 250, the insulation patterns 115, the sacrificial layers 120, the base pattern 100 and the second lower insulating interlayer 730 to contact upper surfaces of the third wirings 720 on the fifth region V of the substrate 600.

Figure 59:
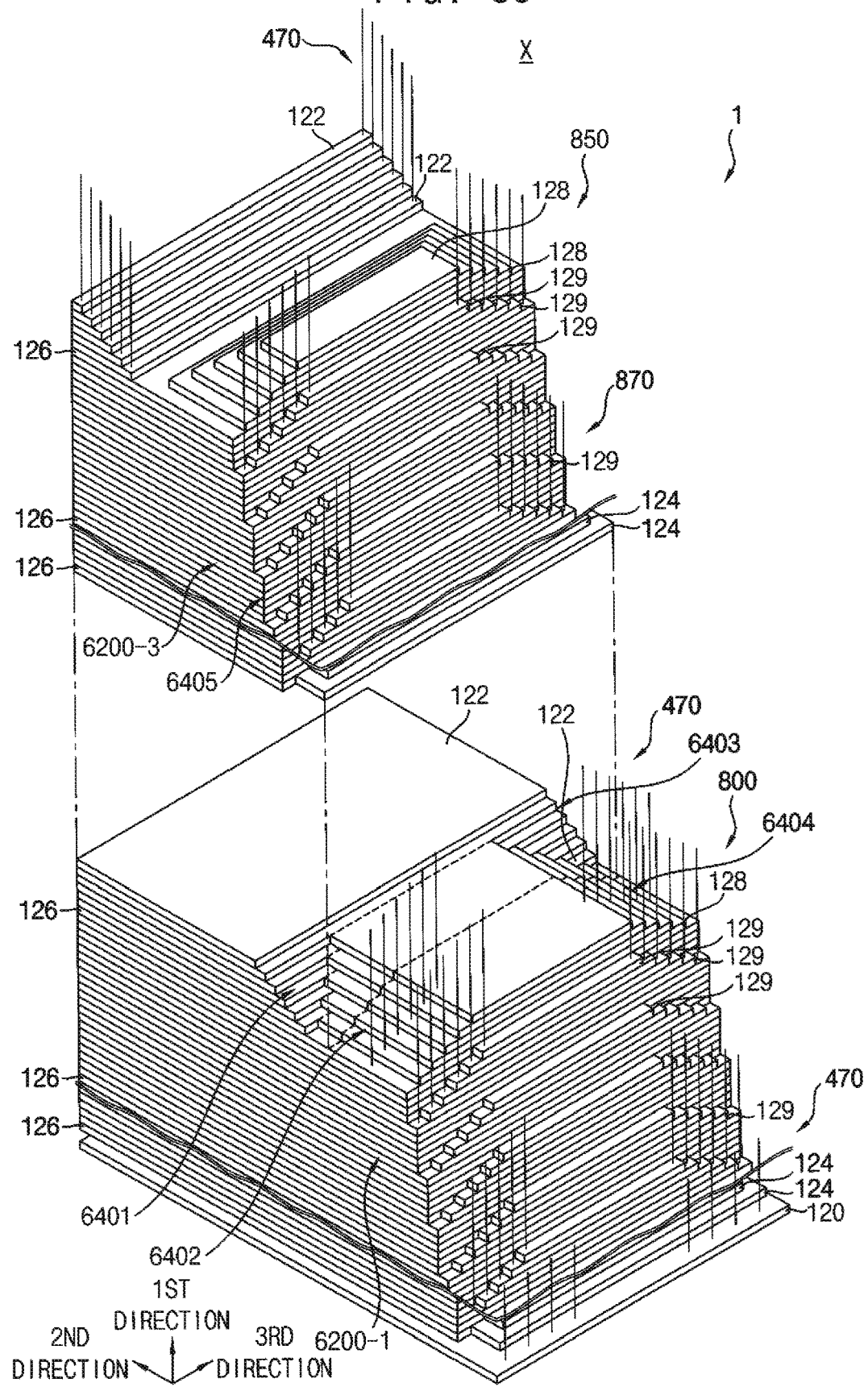
Figure 60:
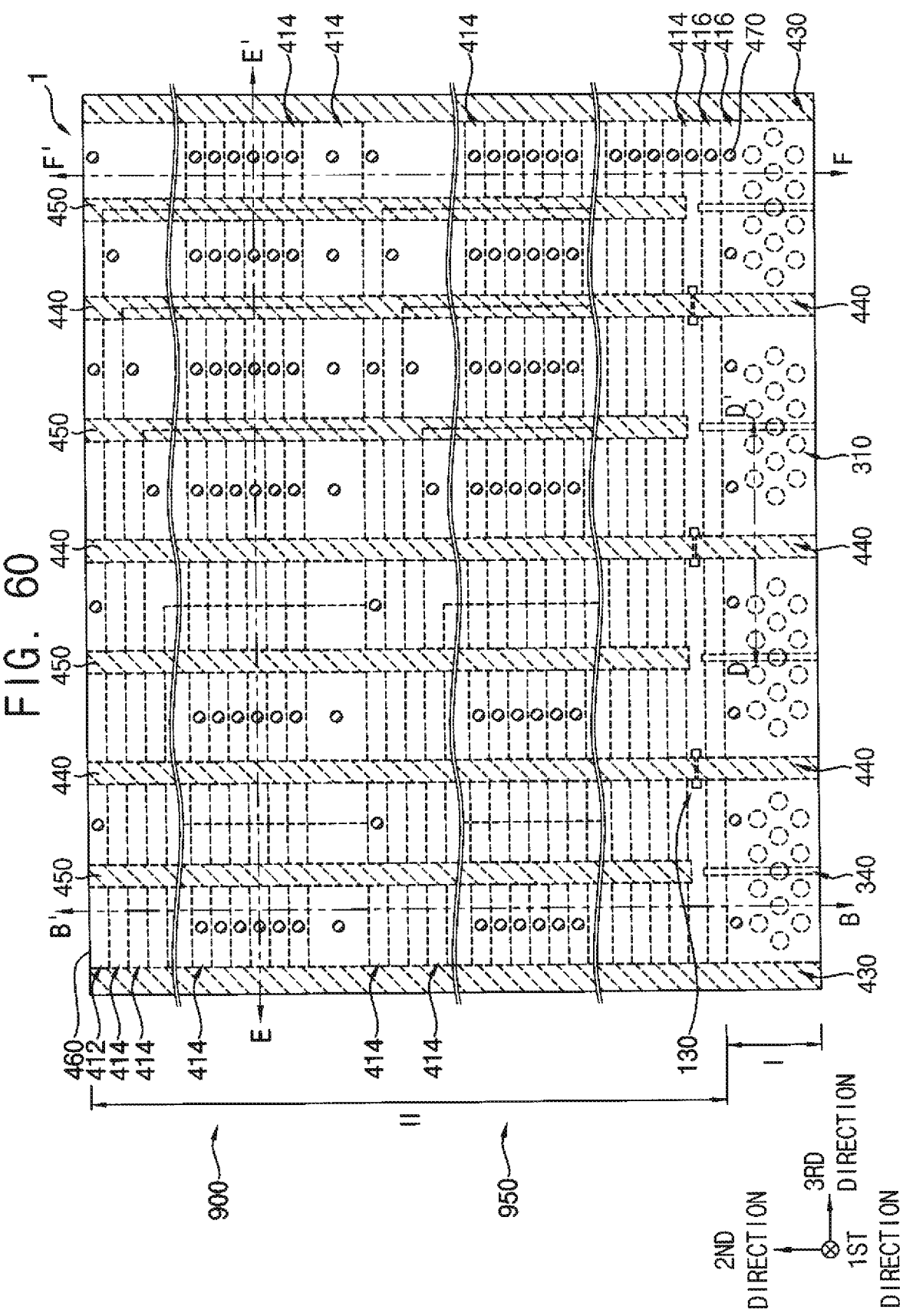
Figure 61:
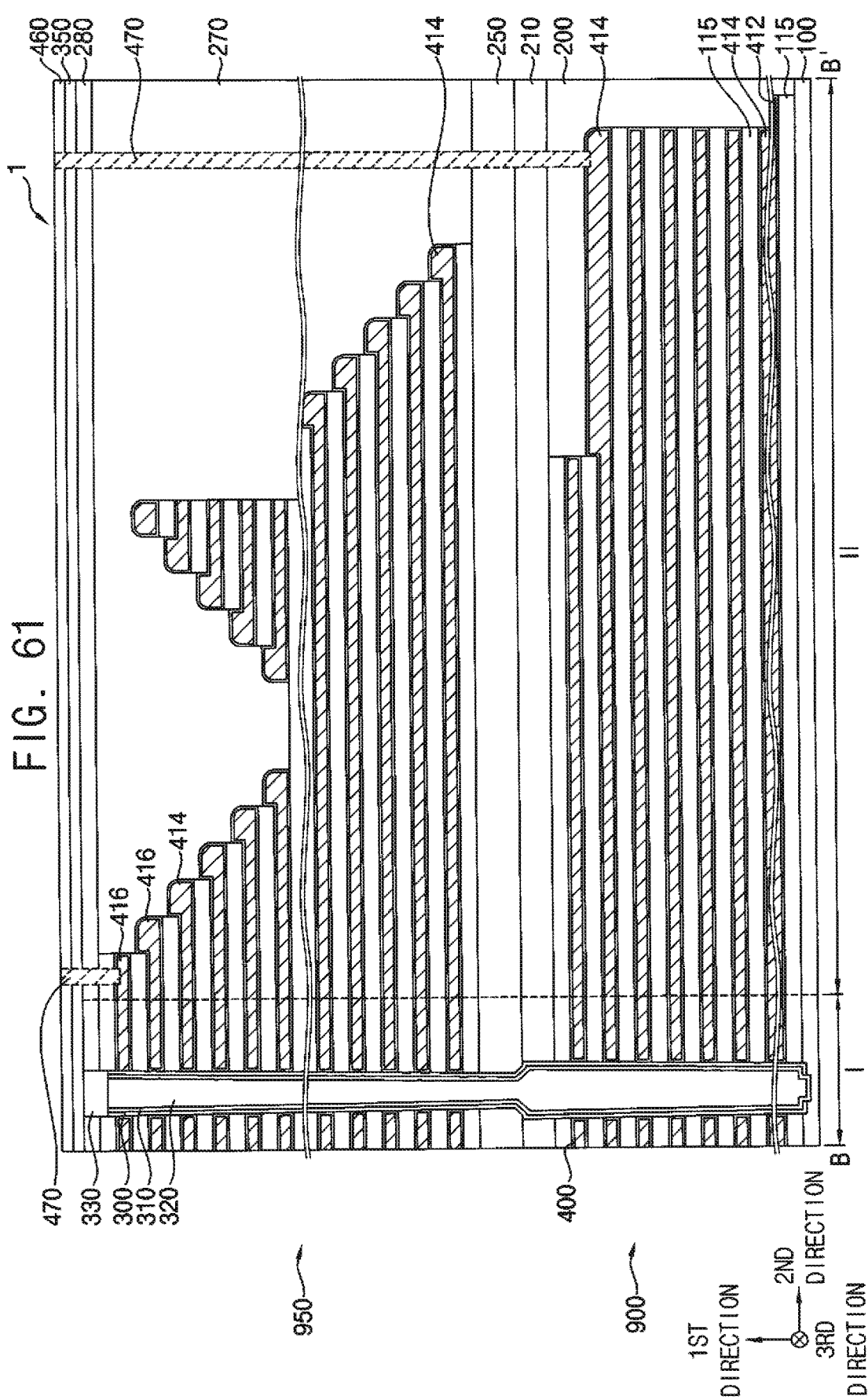
Figure 62:
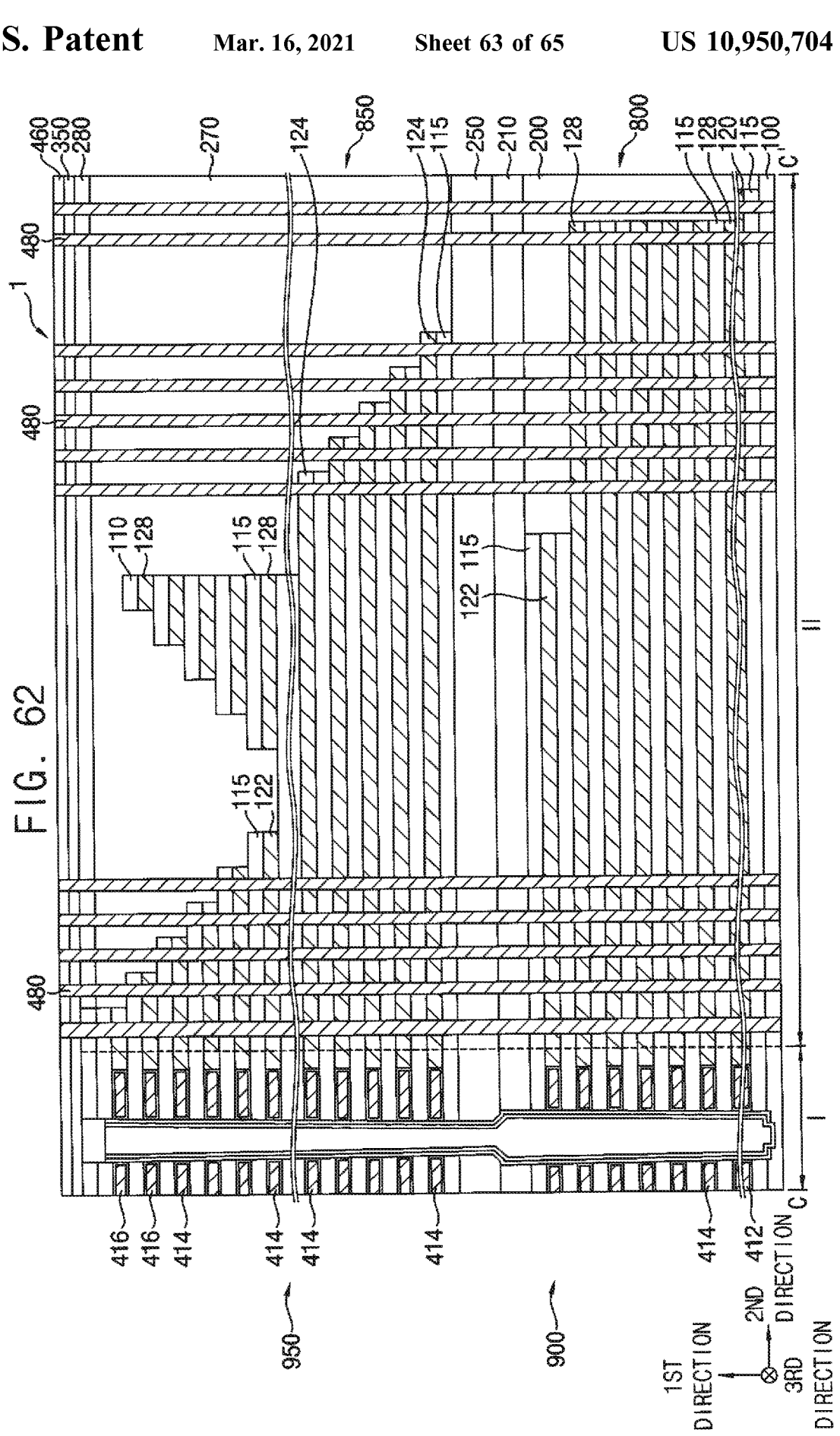

FIG. 59 shows only some of the contact plugs 470 in order to avoid the complexity of the drawing. In some example embodiments, the contact plugs 470 may contact upper surfaces of one or ones of the steps included in the first to fourteenth stair structures except for the first, ninth and tenth stair structures.

The ninth and tenth stair structures included in the upper mold 950 may be formed at the same levels as the eighth stair structure but spaced apart from the eighth stair structure, and thus the contact plugs 470 may not contact the upper surfaces of the steps of the ninth and tenth stair structures but may contact the steps of the eighth stair structure, so as to be electrically connected to the gate electrodes at their relevant levels.

The first stair structure included in the lower mold 900 may be overlapped in the first direction with, e.g., the eleventh to fourteenth stair structures of the upper mold 950, and thus the contact plugs 470 may not contact the steps of the first stair structure. However, in some example embodiments, the second and third stair structures included in the lower mold 900 may be formed at the same levels as the first stair structure to be connected thereto, and thus, even if the contact plugs 470 do not directly contact the steps of the first stair structure included in the lower mold 900, the contact plugs 470 may contact the steps of the second and third stair structures not being overlapped with the eleventh to fourteenth stair structures of the upper mold 950, so as to be electrically connected to the gate electrodes at their relevant levels.

That is, when the upper mold 850 is formed over the lower mold 800, the upper mold 850 may not entirely overlap in the first direction the second and third stair structures, but an edge of the upper mold 850 may overlap in the first direction a central portion of the second and third stair structures in the second direction. Thus, the contact plugs 470 may contact the upper surfaces of the steps of the second and third stair structures, and the gate electrodes of the first stair structure connected to the second and third stair structures may be used.

If the upper mold 8501 is disposed such that the edge of the upper mold 850 may not overlap even the first stair structure of the lower mold 800, the horizontal area of the vertical memory device 1 may increase to deteriorate the integration degree thereof. Thus, in the inventive concepts, in order to prevent the increase of the horizontal area, the upper mold 850 may be disposed to overlap the first stair structure of the lower mold 800, unlike the ninth and tenth stair structure of the upper mold 850 being spaced apart from the eighth stair structure, the second and third stair structures may be connected to the first stair structure, so that the gate electrodes at the relevant levels may be used.

As a result, the vertical memory device 1 may not have the increased horizontal area but may have an enhanced integration degree effectively using the gate electrodes sequentially stacked.

The through vias 480 may be formed between the sixth and seventh stair structures or between the thirteenth and fourteenth stair structures disposed in the third direction. In some example embodiments, six through vias 480 may be formed therebetween.

The contact plugs 470 and the through vias 480 may include a metal and/or a metal nitride. Upper wirings and vias may be further formed to complete the fabrication of the vertical memory device 1.

The vertical memory device 1 may have following structural characteristics.

In some example embodiments, the vertical memory device 1 may include circuit patterns 699 on the substrate 600 and the base pattern 100 over the circuit patterns 699, such that a circuit pattern 699 is between the substrate 600 and the base pattern 100, and the gate electrodes 412, 414 and 416, the channel 310, and the lower and upper molds 800 and 850 may be formed on the base pattern 100. As shown, the channel 310 may extend in the first direction on the first region I (e.g., the cell array region) of the substrate 600 and may extend through one or more gate electrodes of the gate electrodes 412, 414, and 416. The through via 480 may extend through the lower and upper molds 800 and 850 and the base pattern 100 to be electrically connected to the circuit patterns 699, and a plurality of through vias 480 may be formed in the third direction.

In some example embodiments, each of the first and second CSLs 430 and 440 may extend in the second direction on the substrate 600 such that each of the gate electrodes 412, 414 and 416 may be spaced apart from each other ("isolated from direct contact with each other") in the third direction. The first CSL 430 may continuously extend in the second direction on the first and second regions I and II of the substrate 600, while the second CSL 440 may extend in the second direction on the first and second regions I and II of the substrate 600, however, may be partially cut on the second region II of the substrate 600. Accordingly, it will be understood that each of the gate electrodes 412, 414, 416 may be isolated from direct contact with each other in each of the first direction and the third direction on the first region I (e.g., the cell array region) and the second region II (e.g., the staircase region) of the substrate 600, where each gate electrode extends in the second direction.

In some example embodiments, the vertical memory device 1 may further include the third division patterns 450 each of which may extend in the second direction on the second region II of the substrate 600 between neighboring ones of the first and second CSLs 430 and 440 in the third direction to divide each of the gate electrodes 412, 414 and 416 in the third direction.

In some example embodiments, end portions in the second direction of gate electrodes (e.g., gate electrodes 412, 414, 416) (hereinafter fourth gate electrodes) that may be substituted for the sacrificial patterns of the first and second stair structures in the lower mold 800 may form ("define") first to seventh steps sequentially disposed in the second direction and eighth to thirteenth steps sequentially disposed in the third direction, and the eighth to thirteenth steps may be connected to the first to sixth steps at the same levels, respectively. Restated, and as shown, end portions in the second direction of first gate electrodes 6200-1 of the gate electrodes may define first steps 6401 in the second direction and second steps 6402 in the third direction on the second region II (e.g., staircase region) of the substrate 600, where the second steps 6402 are connected to the first steps, respectively, at same levels. Such first gate electrodes 6200-1 may thus define first steps each having an "L" shape in a plan view.

Thus, the first to sixth steps and the eighth to thirteenth steps connected thereto may form ("define") steps (e.g., first steps) each having an "L" shape in a plan view.

In some example embodiments, end portions in the second direction of gate electrodes (hereinafter fifth gate electrodes) at the same levels of the fourth gate electrodes may form ("define") fifty-sixth to sixty-second steps sequentially disposed in the second direction and fourteenth to nineteenth steps sequentially disposed in the third direction, and the fourteenth to nineteenth steps and the eighth to thirteenth steps may be symmetric with respect to a line extending in the second direction. The fourteenth to nineteenth steps may be connected to the fifty-sixth to sixty-second steps, respectively, which may be formed at the same levels, respectively. Thus, the fifty-sixth to sixty-second steps and the fourteenth to nineteenth steps connected thereto may form an "L" shape in a plan view. The "L" shape of formed by the fifty-sixth to sixty-second steps and the fourteenth to nineteenth steps and the "L" shape formed by the first to sixth steps and the eighth to thirteenth steps may be symmetric with respect to a line extending in the second direction. Restated, and as shown, end portions in the second direction of second gate electrodes 6200-2 of the gate electrodes may define third steps 6403 disposed in the second direction and fourth steps 6404 disposed in the third direction, the second gate electrodes 6200-2 being at the same levels of the first gate electrodes 6200-1, respectively, wherein the fourth steps 6404 and the second steps 6402 are symmetric with respect to a line 6400 extending in the second direction, and the fourth steps 6404 are connected to the third steps 6403, respectively, at the same levels. Such second gate electrodes 6200-2, on same levels of separate, respective first gate electrodes 6200-1 may thus define second steps each having an "L" shape in a plan view. It will be understood that the L shape of the end portions of the second gate electrodes 6200-2 and the L shape of the end portions of the first gate electrodes 6200-1 may be symmetric with respect to a line 1201 extending in the second direction.

The lower mold 800 (e.g., an insulating mold) may be between the eighth to thirteenth steps (e.g., the second steps) and the fourteenth to nineteenth steps (e.g., fourth steps) corresponding thereto.

In some example embodiments, a length in the third direction of one or ones of the eighth to thirteenth steps may be different from those of other ones of the eighth to thirteenth steps (refer to FIGS. 13A-13B). For example, as shown, at least two steps of the second steps 6402 may have different lengths in the third direction. In some example embodiments, lengths in the third direction of the eighth to thirteenth steps may be substantially equal to lengths in the second direction of the first to sixth steps, respectively (refer to FIG. 13B). For example, as shown, lengths of second steps 6402 in the third direction may be equal to lengths in the second direction of corresponding first steps 6401 at same levels as the second steps 6402.

In some example embodiments, steps that may be formed by end portions in the second direction of gate electrodes (hereinafter sixth gate electrodes) substituted for the sacrificial patterns of the eighth to fourteenth stair structures in the upper mold 850 may overlap in the first direction the first to seventh steps, and further overlap in the first direction portions of the eighth to thirteenth steps. However, the steps may not overlap in the first direction other portions of the eighth to thirteenth steps, particularly, portions thereof far from an edge of the first region I of the substrate 600. Restated, and as shown, end portions in the second direction of third gate electrodes 6200-3 that are higher than the first gate electrodes 6200-1 (e.g., distal from the substrate 600 in relation to the first gate electrodes 6200-1) may define fifth steps 6405 on the second region II (e.g., staircase region) of the substrate 600, and the fifth steps 6405 may not overlap (e.g., may expose), in the first direction, at least a portion of each step of the second steps 6402. As further shown, the fifth steps 6405 may not overlap, in the first direction, a portion of each step of the second steps 6402, where said portion is distal from an edge of the first region I (e.g., cell array region) of the substrate 600. As shown, the fifth steps 6405 may overlap the first steps 6401 in the first direction.

In some example embodiments, including the example embodiments shown in at least FIG. 63, the channel 310 may have a width gradually decreasing from a bottom toward a top thereof in the first direction between the lower and upper molds 900 and 950, that is, between an uppermost gate electrode of the fourth gate electrodes (e.g., first gate electrodes 6200-1) and a lowermost gate electrode of the sixth gate electrodes (e.g., third gate electrodes 6200-3.

In some example embodiments, the eighth to thirteenth steps may have the first to sixth lengths L1, L2, L3, L4, l5 and L6 in the third direction, and the contact plugs 470 may be formed on the eighth to thirteenth steps, respectively. Restated, and as shown in at least FIG. 64, the plurality of contact plugs 470 may contact upper surfaces of separate, respective steps of the second steps 6402. The contact plugs 470 may not be formed on upper surfaces of the first to seventh steps, however, the eighth to thirteenth steps may be connected to the first to sixth steps, respectively, and thus electric signals may be applied thereto via the contacts plugs 470 on the respective eighth to thirteenth steps. Restated, and as shown in at least FIG. 63, no contact plugs 470 may contact an upper surface of each step of the first steps 6401, such that the contact plugs 470 od not directly contact the first steps 6401, but contact plugs 470 may be electrically connected to separate respective steps of the first steps 6401, e.g., via separate, respective second steps 6402.

Distances between neighboring ones of the contact plugs 470 on the eighth to thirteenth steps may be first, second, third, fourth and fifth distances D1, D2, D3, D4 and D5, respectively, and the fourth and fifth distances D4 and D5 may be greater than the first to third distances D1, D2 and D3. In some example embodiments, the fourth and fifth distances D4 and D5 may be equal, and the first to third distances D1, D2 and D3 may be equal.

While example embodiments have been particularly shown and described, it will be understood by one of ordinary skill in the art that variations in form and detail may be made therein without departing from the spirit and scope of the claims.

What is claimed is:

1. A vertical memory device, comprising:
a substrate including a cell array region and a staircase region surrounding the cell array region;
a plurality of gate electrodes on the cell array region and the staircase region of the substrate, the plurality of gate electrodes isolated from direct contact with each other in a first direction, each gate electrode of the plurality of gate electrodes extending in a second direction, the plurality of gate electrodes further isolated from direct contact with each other in a third direction, the first direction being substantially perpendicular to an upper surface of the substrate, the third direction being substantially parallel to the upper surface of the substrate, and the second direction being substantially parallel to the upper surface of the substrate and substantially perpendicular to the third direction; and a channel on the cell array region of the substrate, the channel extending in the first direction through one or more gate electrodes of the plurality of gate electrodes, wherein end portions in the second direction of first gate electrodes of the plurality of gate electrodes define sequential first steps in the second direction and sequential second steps in the third direction on the staircase region of the substrate, the sequential second steps being connected to respective, same-level sequential first steps, to define a plurality of sequential steps each having an "L" shape in a plan view.

2. The vertical memory device of claim 1, wherein end portions in the second direction of second gate electrodes of the plurality of gate electrodes define sequential third steps in the second direction and sequential fourth steps in the third direction, the second gate electrodes being at same levels of the first gate electrodes, respectively, and the sequential fourth steps and the sequential second steps are symmetric with respect to a line extending in the second direction, and the sequential fourth steps are connected to the sequential third steps, respectively, at same levels.

3. The vertical memory device of claim 2, further comprising:

an insulating mold between the sequential second steps and the sequential fourth steps at same levels.

4. The vertical memory device of claim 3, further comprising:

a base pattern on the substrate, wherein the gate electrodes, the channel and the insulating mold are on the base pattern.

5. The vertical memory device of claim 4, further comprising:

a circuit pattern between the substrate and the base pattern; and a through via extending through the insulating mold and the base pattern, the through via being electrically connected to the circuit pattern.

6. The vertical memory device of claim 1, wherein at least two steps of the sequential second steps have different lengths in the third direction.

7. The vertical memory device of claim 1, wherein lengths of the sequential second steps in the third direction are equal to lengths of respective, same-level sequential first steps in the second direction.

8. A vertical memory device, comprising:

a substrate including a cell array region and a staircase region surrounding the cell array region;

a plurality of gate electrodes on the cell array region and the staircase region of the substrate, the plurality of gate electrodes isolated from direct contact with each other in a first direction, each gate electrode of the plurality of gate electrodes extending in a second direction, the plurality of gate electrodes further isolated from direct contact with each other in a third direction, the first direction being substantially perpendicular to an upper surface of the substrate, the third direction being substantially parallel to the upper surface of the substrate, and the second direction being substantially parallel to the upper surface of the substrate and substantially perpendicular to the third direction; and a channel on the cell array region of the substrate, the channel extending in the first direction through one or more gate electrodes of the plurality of gate electrodes, wherein end portions in the second direction of first gate electrodes of the gate electrodes define a plurality of sequential first steps in the second direction on the staircase region of the substrate, the plurality of sequential first steps each having an "L" shape in a plan view, wherein end portions in the second direction of second gate electrodes higher than the first gate electrodes among the plurality of gate electrodes define second steps in the second direction and/or the third direction on the staircase region of the substrate, and wherein the plurality of sequential first steps are overlapped with the second steps in the first direction.

9. The vertical memory device of claim 8, further comprising:

a plurality of contact plugs electrically connected to separate, respective steps of the plurality of sequential first steps.

10. The vertical memory device of claim 9, wherein the plurality of contact plugs do not directly contact the plurality of sequential first steps.

11. The vertical memory device of claim 9, wherein end portions in the second direction of the first gate electrodes further define third steps in the third direction, and the third steps are connected to the plurality of sequential first steps, respectively, at same levels.

12. The vertical memory device of claim 11, wherein the plurality of contact plugs directly contact upper surfaces of separate, respective steps of the third steps.

13. The vertical memory device of claim 11, wherein the second steps do not overlap, in the first direction, at least a portion of each step of the third steps.

14. The vertical memory device of claim 11, wherein end portions in the second direction of third gate electrodes of the plurality of gate electrodes define fourth steps in the second direction and fifth steps in the third direction, the third gate electrodes being at same levels of the first gate electrodes, respectively, and the fifth steps and the third steps are symmetric with respect to a line extending in the second direction, and the fifth steps are connected to the fourth steps, respectively, at same levels.

15. The vertical memory device of claim 14, further comprising:

an insulating mold between the third and fifth steps at same levels.

16. The vertical memory device of claim 11, wherein at least two steps of the third steps have different lengths in the third direction.

17. A vertical memory device, comprising:

a substrate including a cell array region and a staircase region surrounding the cell array region;

a plurality of gate electrodes on the cell array region and the staircase region of the substrate, the plurality of gate electrodes isolated from direct contact with each other in a first direction, each gate electrode of the plurality of gate electrodes extending in a second direction, the plurality of gate electrodes further isolated from direct contact with each other in a third direction, the first direction being substantially perpendicular to an upper surface of the substrate, the third direction being substantially parallel to the upper surface of the substrate, and the second direction being substantially parallel to the upper surface of the substrate and substantially perpendicular to the third direction; and a channel on the cell array region of the substrate, the channel extending in the first direction through one or more gate electrodes of the plurality of gate electrodes, wherein end portions in the second direction of first gate electrodes of the plurality of gate electrodes define a plurality of sequential first steps each having an "L" shape in a plan view.

18. The vertical memory device of claim 17, wherein end portions in the second direction of second gate electrodes of the gate electrodes form a Plurality of sequential second steps each having an "L" shape in the plan view, the second gate electrodes being at same levels of separate, respective first gate electrodes, and the "L" shape of the end portions of the second gate electrodes and the "L" shape of the end portions of the first gate electrodes are symmetric with respect to a line extending in the second direction.

19. The vertical memory device of claim 17, wherein end portions in the second direction of third gate electrodes higher than the first gate electrodes among the plurality of gate electrodes define third steps, and the third steps do not overlap at least a portion of each step of the plurality of sequential first steps in the first direction.

20. The vertical memory device of claim 19, further comprising:

a plurality of contact plugs contacting upper surfaces of separate, respective steps of the plurality of sequential first steps.

* * * * *